US011045874B2

United States Patent
Weizmann et al.

(10) Patent No.: US 11,045,874 B2
(45) Date of Patent: Jun. 29, 2021

(54) BIPYRAMID-TEMPLATED SYNTHESIS OF MONODISPERSE NOBLE METAL NANOCRYSTALS

(71) Applicant: The University of Chicago, Chicago, IL (US)

(72) Inventors: Yossi Weizmann, Chicago, IL (US);
Kyle Gibson, Chicago, IL (US);
Jung-Hoon Lee, Chicago, IL (US);
Zoya Cheglakov, Chicago, IL (US)

(73) Assignee: The University of Chicago, Chicago, IL (US)

( * ) Notice: Subject to any disclaimer, the term of this patent is extended or adjusted under 35 U.S.C. 154(b) by 206 days.

(21) Appl. No.: 15/580,061

(22) PCT Filed: May 9, 2016

(86) PCT No.: PCT/US2016/031522
§ 371 (c)(1),
(2) Date: Dec. 6, 2017

(87) PCT Pub. No.: WO2016/200525
PCT Pub. Date: Dec. 15, 2016

(65) Prior Publication Data
US 2018/0297120 A1    Oct. 18, 2018

Related U.S. Application Data

(60) Provisional application No. 62/172,481, filed on Jun. 8, 2015.

(51) Int. Cl.
*G01N 21/17*    (2006.01)
*B22F 9/24*    (2006.01)
(Continued)

(52) U.S. Cl.
CPC .............. *B22F 9/24* (2013.01); *B22F 1/0018* (2013.01); *B82Y 40/00* (2013.01); *C30B 7/005* (2013.01);
(Continued)

(58) Field of Classification Search
None
See application file for complete search history.

(56) References Cited

U.S. PATENT DOCUMENTS

2002/0058258 A1    5/2002    Wittwer et al.
2007/0287660 A1   12/2007    Sahai et al.
(Continued)

FOREIGN PATENT DOCUMENTS

| CN | 101618461 A | 1/2010 |
|---|---|---|
| CN | 103394704 | 11/2013 |

(Continued)

OTHER PUBLICATIONS

Chen et al., Gold nanorods and their plasmonic properties, Chemical Society Reviews 42, Nov. 2012, pp. 2679-2724.
(Continued)

*Primary Examiner* — Paul S Hyun
(74) *Attorney, Agent, or Firm* — Bell & Manning, LLC

(57) ABSTRACT

Methods for forming samples of noble metal bipyramid nanocrystals having very low size and shape polydispersities from samples of mixed noble metal nanocrystals are provided. The samples include those comprising high purity, substantially monodisperse, plasmonic gold bipyramid nanocrystals. Also provided are methods of growing secondary twinned metal nanocrystals using the noble metal bipyramid nanocrystals as seed particles. Like the seed bipyramid nanocrystals from which they are grown, the secondary nanocrystals are twinned nanocrystals and may also be characterized by very low size and shape polydis-
(Continued)

persities. Secondary twinned nanocrystals grown by these methods include enlarged metal bipyramid nanocrystals and nanocrystals with anisotropic "dumbbell" shapes having a variety of tip geometries. Methods for using noble metal bipyramid nanocrystals as plasmonic heaters to heat reaction solutions via plasmonic-photothermal radiation-to-heat conversion are also provided.

24 Claims, 30 Drawing Sheets

(51) Int. Cl.
  B82Y 40/00  (2011.01)
  B22F 1/00   (2006.01)
  C30B 7/00   (2006.01)
  C30B 29/60  (2006.01)
  C30B 7/14   (2006.01)
  C30B 29/52  (2006.01)
  C30B 29/34  (2006.01)
  C30B 29/02  (2006.01)
  C30B 29/66  (2006.01)
  B82Y 20/00  (2011.01)
  B82Y 30/00  (2011.01)

(52) U.S. Cl.
  CPC .............. *C30B 7/14* (2013.01); *C30B 29/02* (2013.01); *C30B 29/34* (2013.01); *C30B 29/52* (2013.01); *C30B 29/607* (2013.01); *C30B 29/66* (2013.01); *B22F 1/0014* (2013.01); *B22F 2001/0037* (2013.01); *B82Y 20/00* (2013.01); *B82Y 30/00* (2013.01)

(56) References Cited

U.S. PATENT DOCUMENTS

| 2010/0183504 | A1* | 7/2010 | Chen | A61K 49/0002 |
| | | | | 424/1.29 |
| 2010/0239675 | A1* | 9/2010 | Mirkin | B22F 1/0018 |
| | | | | 424/489 |
| 2014/0050851 | A1 | 2/2014 | Kagan et al. | |
| 2014/0170664 | A1 | 6/2014 | Roche et al. | |
| 2014/0377764 | A1* | 12/2014 | Stehr | B82Y 20/00 |
| | | | | 435/6.12 |
| 2016/0115253 | A1* | 4/2016 | Buskens | C09D 5/00 |
| | | | | 526/63 |

FOREIGN PATENT DOCUMENTS

| CN | 103394704 A  | 11/2013 |
| CN | 103566381 A  | 2/2014 |
| CN | 103862036    | 6/2014 |
| JP | 2009-149593 A | 7/2009 |

OTHER PUBLICATIONS

Roche et al., Demonstration of a plasmonic thermocycler for the amplification of human androgen receptor DNA, Analyst 137, Jul. 17, 2012, pp. 4475-4481.
Liu et al., Optical properties of rodlike and bipyramidal gold nanoparticles from three-dimensional computations, Physical Review. B, vol. 76, (2007), pp. 235428-1-235428-10.
Liu et al., Mechanism of Silver(I)-Assisted Growth of Gold Nanorods and Bipyramids, J. Phys. Chem. B, 109, (2005), pp. 22192-22200.
Huang et al., Gold nanoparticles: Optical properties and implementations in cancer diagnosis and photothermal therapy, Journal of Advanced Research, 1, (2010), pp. 13-28.
Huang et al., Cancer Cell Imaging and Photothermal Therapy in the Near-Infrared Region by Using Gold Nanorods, J. Am. Chem. Soc., 128, Jan. 21, 2006, pp. 2115-2120.
Lee et al., Bipyramid-templated synthesis of monodisperse anisotropic gold nanocrystals, Nature Communications, 6:7571, Jun. 26, 2015, pp. 1-9.
Park et al., Advances in Microfluidic PCR for Point-of-Care Infectious Disease Diagnostics, Biotechnol Adv., 29(6), Nov. 2011, pp. 830-839.
Pitsillides et al., Selective Cell Targeting with Light-Absorbing Microparticles and Nanoparticles, Biophysical Journal, vol. 84, Jun. 2003, pp. 4023-4032.
Walsh et al., Laser-assisted photothermal heating of a plasmonic nanoparticle-suspended droplet in a microchannel, Analyst, 140, Dec. 24, 2014, pp. 1535-1542.
Wang et al., Understanding the Photothermal Effect of Gold Nanostars and Nanorods for Biomedical Applications, RSC Advances, (2013).
Xia et al., Gold Nanocages: From Synthesis to Theranostic Applications, Acc Chem Res., 44(10), Oct. 18, 2011, pp. 914-924.
International Search Report and Written Opinion mailed in PCT/US2016/031522, dated Sep. 22, 2016.
Zhou et al., Growth of nanobipyramid by using large sized Au decahedra as seeds, ACS applied materials & interfaces, vol. 5, No. 24, Nov. 18, 2013, pp. 13340-13344.
Li et al., Synthesis of one dimensional gold nanostructures, Journal of Nanomaterials, vol. 84, (2010).
Bsm I from Bacillus stearothermophilus NUB 36, Sigma Aldrich, Sep. 9, 2016.
Roche, Restriction Endonuclease Eco 47 III, (2005).
Extended European Search Report mailed in European Patent Application No. 16807983.8, dated Oct. 30, 2018.
Kou et al., Growth of Gold Bipyramids with Improved Yield and Their Curvature-Directed Oxidation, small, 3, No. 12 (2007), pp. 2103-2113.
The First Office Action dated Dec. 26, 2019 issued in Chinese Patent Application No. 201680042044.8, pp. 1-14.
Zhou Guangju, "Structure of metal nanoparticles constructed on basis of Au decahedra and application study," China Master's theses Full-test Database, Engineering Science and technology, May 1, 2014.
English translation of the Notice of Reasons for Rejection/JP First Office Action issued in JP Patent Application No. 2017-564023, dated Jun. 16, 2020, pp. 1-4.
The Second Office Action issued for CN Patent Application No. 201680042044.8 dated Sep. 21, 2020; pp. 1-18.
Qian Li et al, "Production of monodisperse gold nanobipyramides with number percentage approaching 100% and evaluation of their plasmonic properties", Advanced Optical Materials, vol. 13, No. 3, pp. 801-812.
The International Preliminary Report on Patentability dated Dec. 12, 2017 from the International Bureau of WIPO re International Patent Application No. PCT/US2016/031522, pp. 1-10.
Yun-Sheng Chen et al., "Enhanced thermal stability of silica-coated gold nanorods for photoacoustic imaging and image-guided therapy," *Optics Express*, Apr. 26, 2010, vol. 18, No. 9; pp. 1-12.
Huanjun Chen et al., "Understanding the Photothermal Conversion Efficiency of Gold Nanocrystals," *small*, 2010, vol. 6, No. 20, pp. 2272-2280.
Bei Cheng et al., "Gold Nanosphere Gated Mesoporous Silica Nanoparticle Responsive to Near-Infrared Light and Redox Potential as a Theranostic Platform for Cancer Therapy," J. Biomed. Nanotechnol. Mar. 2016, vol. 12, No. 3, pp. 435-449.
Warefta Hasan et al., "Tailoring the Structure of Nanopyramids for Optimal Heat Generation," *Nano Lett.* Apr. 2009, vol. 9, No. 4, pp. 1555-1558.
Min Hu et al., "Heat Dissipation in gold-silica core-shell nanoparticles," *Chemical Physics Letters* (2003), vol. 372, pp. 767-772.
Sudipta Mallick et al., "Silica Coated Gold Nanorods for Imaging and Photo-Thermal Therapy of Cancer Cells," *Journal of Nanoscience and Nanotechnology* 2013, vol. 13, pp. 3223-3229.
Jana Olson et al., "Optical Characterization of Single Plasmonic Nanoparticles," *Chem Soc Rev.* Jan. 7, 2015, vol. 44, No. 1; pp. 40-57.
Zhenpeng Qin et al., "Quantitative Comparison of Photothermal Heat Generation between Gold Nanospheres and Nanorods," *Scientific Reports:* 6-29836; DOI: 10:1038/srep29836, pp. 1-13.

(56) References Cited

OTHER PUBLICATIONS

Gregory Schneider et al., "Distance-Dependent Fluorescence Quenching on Gold Nanoparticles Ensheathed with Layer-by-Layer Assembled Polyelectrolytes," *Nano Letters* 2006, vol. 6, No. 3, pp. 530-536.
Jun Ho Son et al., "Ultrafast photonic PCR, Light: Science & Applications" (2015, vol. 4, e280; doi: 10.1038/lsa.2015.53; pp. 1-7.
Girish Nallur et al., "Signal amplification by rolling circle amplification on DNA microarrays," Nucleic Acids Research, 2001, vol. 29, No. 23 e118; pp. 1-9.
Aric Joneja et al., "Linear nicking endonuclease-mediated strand displacement DNA amplification," *Anal. Biochem.* Jul. 1, 2011, vol. 414, No. 1; pp. 58-69.
The First Examination Report dated Nov. 22, 2019 for AU Patent Application No. 2016274238; pp. 1-4.
The First Examination Report dated Jul. 13, 2020 for IN Patent Application No. 201847000501; pp. 1-9.
Communication Pursuant to Article 94(3) EPC dated Jun. 3, 2020 for European Patent Application No. 168079838; pp. 1-10.
Communication Pursuant to Article 94(3) EPC dated Aug. 20, 2019 for European Patent Application No. 168079838; pp. 1-10.
Requisition by the Examiner dated Jun. 26, 2020 From the Innovation, Science and Economic Development Canada, Canadian Intellectual Property Office Re. Application No. 2,988,553. (4 Pages).
Jauffred et al. "Plasmonic Heating of Nanostructures," *Chemical Reviews*, vol. 119, No. 13; pp. 8087-8130, Published Online May 24, 2019.
Lee et al. "Plasmonic Photothermal Gold Bipyramid Nanoreactors for Ultrafast Real-Time Bioassays," *Journal of the American Chemical Association*, vol. 139, No. 24p pp. 8054-8057, Published Online May 1, 2017.
Tan et al. "Building Plasmonic Nanostructures With DNA," *Nature Nanotechnology*, vol. 6, No. 5, pp. 268-280, Published Online Apr. 17, 2011.
The Oral Hearing Notice issued on for Indian Patent Application No. 201847000501; pp. 1-3 and first received by Applicant's representative on Feb. 25, 2021.
Communication Pursuant to Article 94(3) EPC dated Mar. 12, 2021 for European Patent Application No. 168079838; pp. 1-9.
Canadian Further Office Action issued for CA Patent Application No. 2,988,553 dated Mar. 8, 2021; pp. 1-3.
The Indian First Examination Report dated Apr. 25, 2021 for Indian Application No. 202148002844; pp. 1-7.
"Technical Manual: "Assembly of Restriction Enzyme Digestions, © 2011 Promega Corporation. https://www.promega.com/-/media/files/resources/protocols/technical-manuals/101/restrictionenzymes-protocol.pdf.
"DNA double digestion protocol", Current protocols in molecular biology (3.1.1-3.1.2), http://2009.igem.org/wiki/images/1/1d/PKU_DNA_digestion_protocol.pdf.
Lim, Dong-Kwon et al., "Nanogap-engineerable Raman-active nanodumbbells for single molecule detection", Nature Materials vol. 9, pp. 60-67(2010), Published: Dec. 13, 2009, https://doi.org/10.1038/nmat2596.
Lee, Jung-Hoon et al., "Tuning and Maximizing the Single-Molecule Surface-Enhanced Raman Scattering from DNA-Tethered Nanodumbbells", ACS Nano 2012, 6, 11, 9574-9584 Publication Date: Oct. 4, 2012, https://doi.org/10.1021/nn3028216.
Loweth, Colin J. et al., "DNA-Based Assembly of Gold Nanocrystals", Angew Chem Int Ed Engl. Jun. 14, 1999; 38(12):1808-1812. doi: 10.1002/(SICI)1521-3773(Jun. 14, 1999)38:12<1808:AID-ANIE1808>3.0.CO;2-C.

\* cited by examiner

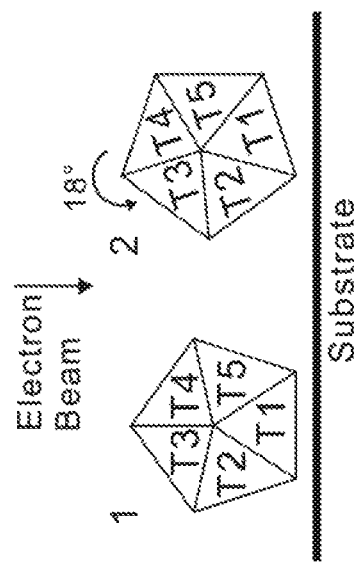
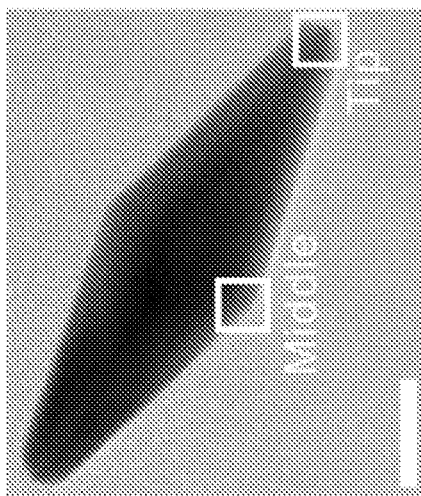
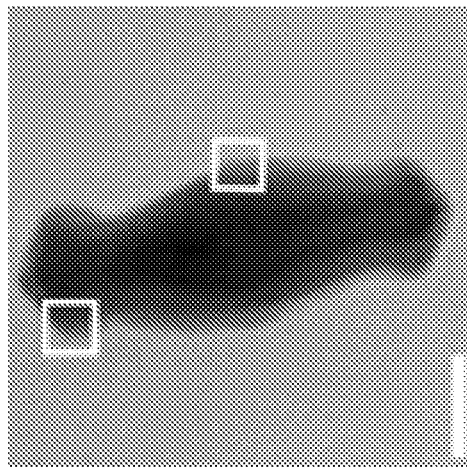
FIG. 4A
FIG. 4B
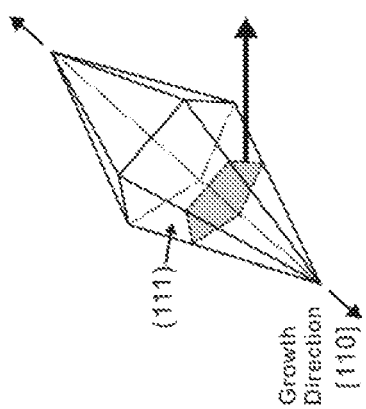
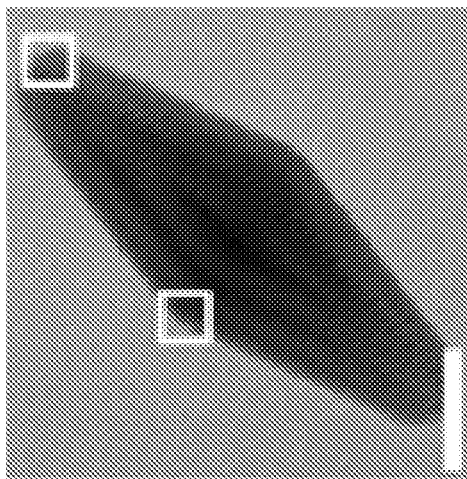
FIG. 4C
FIG. 4D
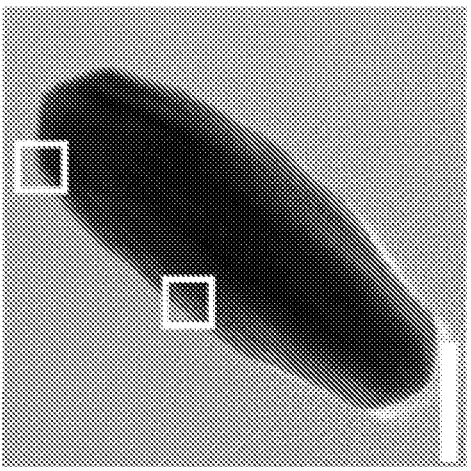
FIG. 4E

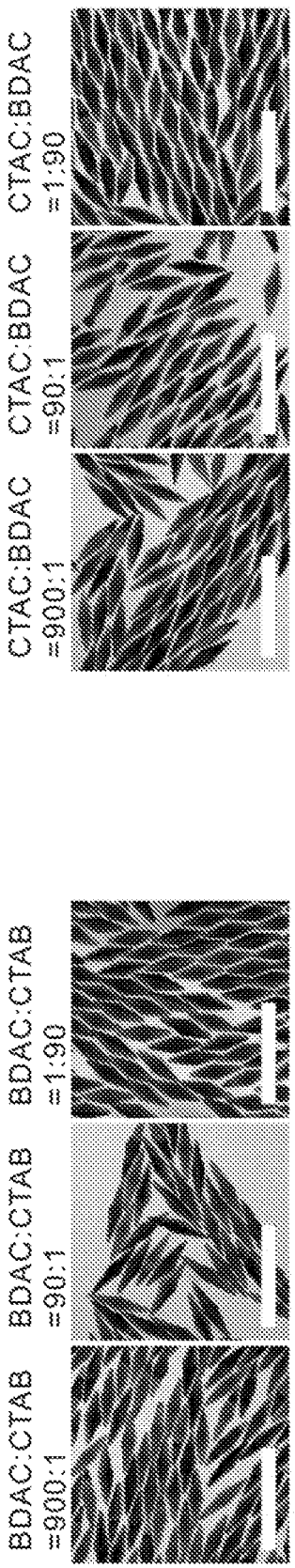
FIG. 10A
FIG. 10B
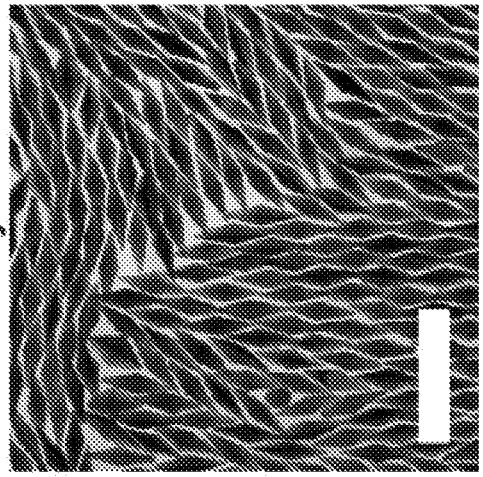
FIG. 10D

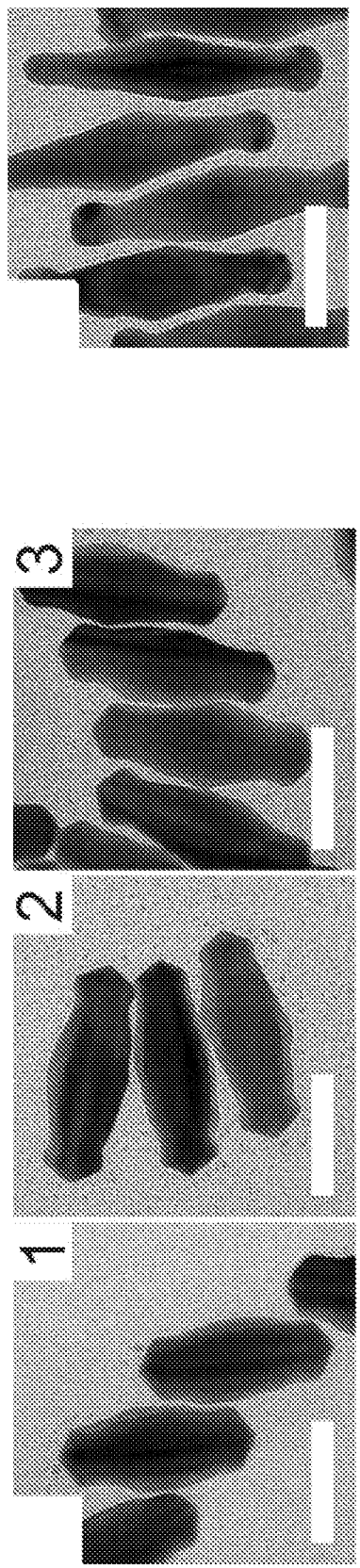
FIG. 12A
FIG. 12B
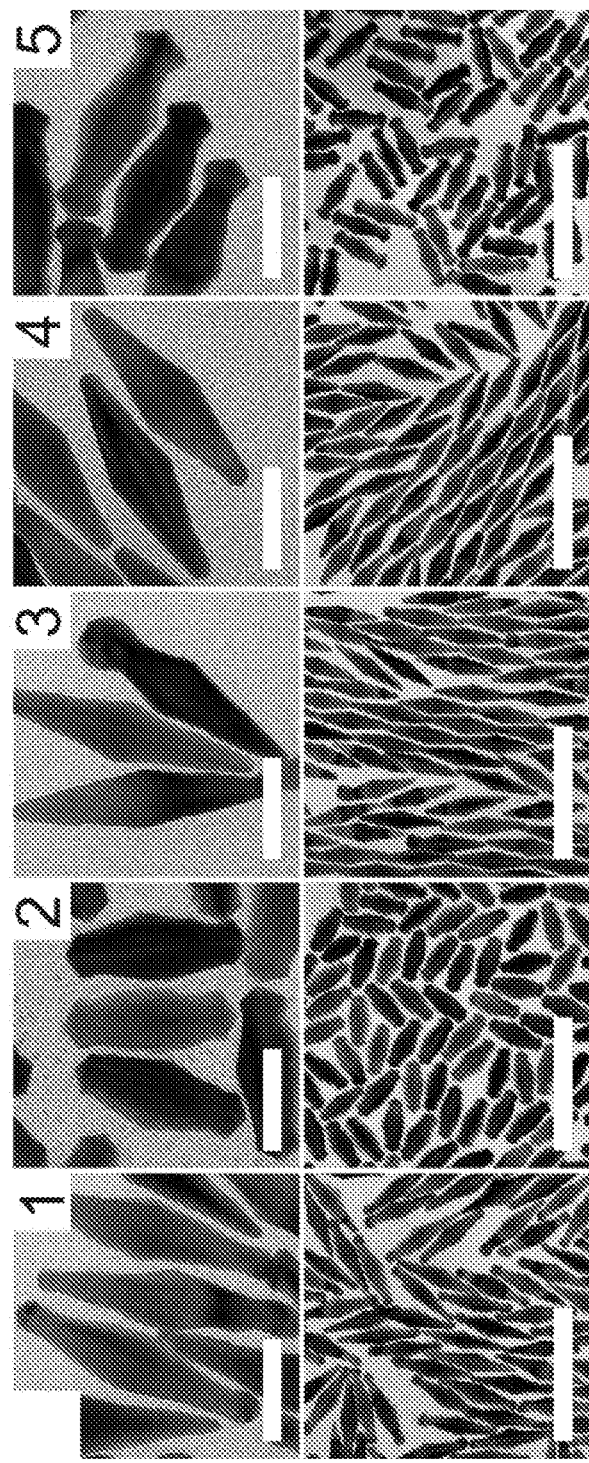
FIG. 12C

Table 1. Part 1.

| Fig. No. | Surfactant 0.1M CTAB Vol (µL) | Surfactant 0.1M CTAC Vol (µL) | HAuCl4 Conc.(M) | HAuCl4 Vol (µL) | AgNO3 Conc.(M) | AgNO3 Vol (µL) | AA* Conc.(M) | AA* Vol (µL) | 1 N HCl Vol (µL) | Vol.(µL) of BP* seeds | pH* | [CTAB]:[CTAC] |
|---|---|---|---|---|---|---|---|---|---|---|---|---|
| FIG. 2E-6 | 900 | - | 0.002 | 50 | 0.002 | 10 | 0.02 | 8 | 20 | 50 (in 1 mM CTAB) | 1.73 | CTAB only |
| FIG. 2E-7 | | | | | | | | | | 10 (in 1 mM CTAB) | | |
| FIG. 2E-8 | | | 0.004 | 50 | 0.004 | 10 | 0.04 | 8 | | 30 (in 1 mM CTAB) | | |
| FIG. 2E-9 | | | | | | | | | | 20 (in 1 mM CTAB) | | |
| FIG. 2E-10 | | | | | | | | | | 10 (in 1 mM CTAB) | | |
| FIG. 8A-1 | 900 | - | 0.001 | 50 | 0.001 | 10 | 0.01 | 8 | | 100 (in 1 mM CTAB) | 1.73 | CTAB only |
| FIG. 8A-2 | | | 0.004 | | 0.004 | | 0.04 | | | | | |
| FIG. 8A-3 | | | 0.01 | | 0.01 | | 0.1 | | | | | |
| FIG. 8A-4 | | | 0.02 | | 0.02 | | 0.2 | | | | | |
| FIG. 8A-5 | | | 0.002 | | 0.004 | | 0.02 | | | | | |
| FIG. 8A-6 | | | 0.004 | | 0.004 | | 0.04 | | | | | |
| FIG. 8B-1 | 900 | - | 0.002 | 50 | 0.002 | 10 | 0.02 | 8 | | 5 (in 1 mM CTAB) | | |
| FIG. 8B-2 | | | | | 0.004 | | | | | | | |
| FIG. 8B-3 | | | | | 0.008 | | | | | | | |
| FIG. 8B-4 | | | | | 0.002 | | | | 20 (0.2N) | 100 (in 1 mM CTAB) | 2.435 | |
| FIG. 8B-5 | | | | | | | | | 20 | | 1.73 | |
| FIG. 8B-6 | | | | | | | | | 24 | | 1.656 | |
| FIG. 10C-1 | - | 900 | 0.002 | 50 | 0.002 | 10 | 0.02 | 8 | 20 | 100 (in 0.1 mM CTAB) | 1.73 | 1:9000 |
| FIG. 10C-2 | | | | | | | | | | 100 (in 1 mM CTAB) | | 1:900 |
| FIG. 10C-3 | 400 | 500 | | | | | | | | 100 (in 2 mM CTAB) | | 1:450 |
| FIG. 10C-4 | 800 | 100 | | | | | | | | 100 (in 10 mM CTAB) | | 1:90 |
| FIG. 10C-5 | 800 | 10 (0.01M) | | | | | | | | 100 (in 100 mM CTAB) | | 1:9 |
| FIG. 10C-6 | | | 0.002 | 50 | 0.002 | 10 | 0.02 | 8 | 20 | | | 1:1 |
| FIG. 10C-7 | | | 0.002 | 50 | 0.002 | 10 | 0.02 | 8 | 20 | | | 9:1 |
| FIG. 10C-8 | | | 0.002 | 50 | 0.002 | 10 | 0.02 | 8 | 20 | | | 90:1 |

FIG. 26A

Table 1. Part 2.

| Fig. No. | Surfactant 0.1M CTAB Vol (µL) | 0.1M CTAC Vol (µL) | HAuCl₄ Conc. (M) | HAuCl₄ Vol (µL) | AgNO₃ Conc. (M) | AgNO₃ Vol (µL) | AA* Conc. (M) | AA* Vol (µL) | 1 N HCl Vol (µL) | Vol.(µL) of BP* seeds | pH* | [CTAB]:[CTAC] |
|---|---|---|---|---|---|---|---|---|---|---|---|---|
| FIG. 3A-2 | 900 | - | 0.002 | 50 | 0.002 | 10 | 0.02 | 8 | 20µL DIW added | | 3.62 | CTAB only |
| FIG. 3A-3 | | | | | | | | | 20 | 100 (in 1 mM CTAB) | 1.73 | |
| FIG. 3A-4 | | | | | | | | | 20µL DIW added | | 3.62 | |
| FIG. 3A-5 | | | | | | | | | 20 | | 1.73 | |
| FIG. 3A-7 | - | 900 | 0.002 | 50 | 0.002 | 10 | 0.02 | 8 | 20µL DIW added | | 3.62 | 90:1 |
| FIG. 3A-8 | | | | | | | | | 20 | 100 (in 10 mM CTAB) | 1.73 | |
| FIG. 3A-9 | | | | | 0.01 | 10µL DIW added | | | 20µL DIW added | | 3.62 | |
| FIG. 3A-10 | | | | | 0.01 | 10 | | | 20 | | 1.73 | |
| FIG. 6A-1 | 900 | - | 0.002 | 50 | 0.002 | 10 | 0.02 | 8 | 20µL DIW added | Rod seeds from etching 100 (in 1 mM CTAB) | 1.73 | CTAB only |
| FIG. 6A-2 | | | | | | | | | 20 | | 3.62 | |
| FIG. 6A-3 | - | 900 | 0.002 | 50 | 0.002 | 10 | 0.02 | 8 | 20µL DIW added | | 1.73 | |
| FIG. 6A-4 | | | | | | | | | 20 | | 3.62 | |
| FIG. 6A-5 | | | | | 0.01 | 10µL DIW added | | | 20 | | 1.73 | |
| FIG. 6B | 900 | - | 0.002 | 50 | 0.01 | 10 | 0.02 | 8 | 20 | Rod seeds from etching 100 (in 10 mM CTAB) | 1.73 | 90:1 |
| FIG. 15A-1 | 900 | - | 0.002 | 50 | 0.002 | 10 | 0.02 | 8 | 20 | Rice seeds from etching 100 (in 1 mM CTAB) | 1.73 | CTAB only |
| FIG. 15A-2 | | | | | | 10µL DIW added | | | | | | |
| FIG. 15B | - | 900 | 0.002 | 50 | 0.002 | 10 | 0.02 | 8 | 20 | Rod seeds from etching 100 (in 10 mM CTAB) | 1.73 | 90:1 |

FIG. 26B

BIPYRAMID-TEMPLATED SYNTHESIS OF MONODISPERSE NOBLE METAL NANOCRYSTALS

CROSS-REFERENCE TO RELATED APPLICATIONS

This application is a National Stage of International Application No. PCT/US2016/031522 that was on filed May 9, 2016, the entire contents of which are hereby incorporated by reference, which claims priority to U.S. provisional patent application No. 62/172,481 that was filed on Jun. 8, 2015, the entire contents of which are hereby incorporated by reference.

BACKGROUND

Noble metal nanoparticles have become an integral part of the emerging field of nanotechnology, with a wide variety of potential applications, including surface enhanced raman spectroscopy, drug delivery and theraputics, catalysis, and non-linear optics. Due to the structure- and size-dependent character of localized surface plasmon resonance (LSPR) and local field enhancement, the precise design and synthesis of nanostructures makes it possible to utilize and manipulate the optical properties of metallic materials. In addition, the ability to attain monodisperse colloidal nanoparticles in high yield is a critical step in the widespread use of these material. Gold bipyramids have shown remarkable size and shape monodispersity. By theoretical calculation, stronger local field enhancement is expected in bipyramids than in nanorods or other shapes owing to the sharp tips. However, the direct synthesis only yields roughly 30% bipyramids, with the other shape impurities being nanorod (~10%) and pseudo-spherical particles (~60%). (See, Liu, M. & Guyot-Sionnest, P. Mechanism of silver(i)-assisted growth of gold nanorods and bipyramids. *J. Phys. Chem. B* 109, 22192-22200 (2005).) The yield has been improved slightly using the surfactant cetyltributylammonium bromide, but highly pure gold bipyramids are yet unrealized using synthetic approaches alone. (See, Kou, X. et al. Growth of gold bipyramids with improved yield and their curvature-directed oxidation. *Small* 3, 2103-2113 (2007).)

Nucleic acid amplification methods represent important and valuable tools for chemists, biologists, and medical scientists and have found extensive use in all fields of research. The Polymerase Chain Reaction (PCR) is the gold standard of these techniques and has been used almost universally for applications across many disciplines. (See, Ishmael F. T., Stellato C., Principles and applications of polymerase chain reaction: basic science for the practicing physician. *Annals of Allergy, Asthma & Immunology*. 2008; 101(4):437-43.) PCR played an invaluable role in the completion of the Human Genome Project and offered previously unavailable genetic and hereditary information (See, Adams M., Kelley J., Gocayne J., Dubnick M., Polymeropoulos M., Xiao H., Merril C., Wu A., Olde B., Moreno R., et al., Complementary DNA sequencing: expressed sequence tags and human genome project. *Science*. 1991; 252(5013):1651-6.) Furthermore, current applications of PCR range from early detection of biologically relevant molecules in real-time to the synthesis of nucleic acid scaffolds for self-assembly (See, Garibyan L., Avashia N., Polymerase Chain Reaction. *J Invest Dermatol.* 2013; 133(3):e6; and Bußkamp H., Keller S., Robotta M., Drescher M., Marx A., A new building block for DNA network formation by self-assembly and polymerase chain reaction. *Beilstein Journal of Organic Chemistry.* 2014; 10:1037-46.). Despite the successful application of this technique in many fields, it does suffer from one main limitation: the need for thermo-cycling. The requirement for thermo-cycling protocols and expensive, bulky instrumentation, such as thermal cyclers, capable of providing precise temperature control greatly limit the mobility of this assay and prevent its use in point-of-care scenarios. Additionally, there is a need in the field to increase the speed, and therefore the efficiency, of PCR processes. Early detection, rapid diagnosis, and high-mobility are essential in the discovery and identification of new outbreak contagions such as the Ebola and Zika crises (See, Kurosaki Y., Takada A., Ebihara H., Grolla A., Kamo N., Feldmann H., Kawaoka Y., Yasuda J., Rapid and simple detection of Ebola virus by reverse transcription-loop-mediated isothermal amplification. *Journal of Virological Methods.* 2007; 141(1):78-83.)

SUMMARY

Methods for forming samples of noble metal bipyramid nanocrystals having very low size and shape polydispersities from samples of mixed noble metal nanocrystals are provided. Also provided are methods of growing secondary twinned metal nanocrystals using the noble metal bipyramid nanocrystals as seed particles. Like the seed bipyramid nanocrystals from which they are grown, the secondary nanocrystals are twinned nanocrystals characterized by very low size and shape polydispersities. Methods for using the noble metal bipyramid nanocrystals as plasmonic heaters to heat reaction solutions via plasmonic-photothermal radiation-to-heat conversion are also provided. These applications include nucleic acid amplification protocols, such as PCR, and step-wise, thermally induced enzymatic reaction schemes.

One embodiment of a method of forming a sample of metal bipyramid nanocrystals from a starting sample comprising metal bipyramid nanocrystals and at least one additional type of metal nanocrystal comprises the steps of: forming an aqueous solution of the starting sample and benzyldimethylhexadecyl ammonium chloride; maintaining the aqueous solution for a time period and at a temperature sufficient to allow metal bipyramid nanocrystals to flocculate out of the aqueous solution; and separating the flocculated metal bipyramid nanocrystals from the solution to provide a metal nanocrystal sample in which at least 85% of the metal nanocrystals are metal bipyramid nanocrystals.

One embodiment of a method for growing secondary twinned metal nanocrystals from twinned metal bipyramid nanocrystals comprises the steps of: forming a solution comprising seed metal bipyramid nanocrystals, at least one cationic quaternary ammonium surfactant, metal precursor molecules, and a reducing agent; and maintaining the solution under conditions at which the reducing agent reduces the metal in the precursor molecules and the metal is deposited on the seed metal bipyramid nanocrystals, thereby growing the secondary twinned metal nanocrystals.

Another embodiment of a method for growing secondary twinned metal nanocrystals from twinned metal bipyramid nanocrystals comprises the steps of: forming a solution comprising seed metal bipyramid nanocrystals, at least one cationic quaternary ammonium surfactant, and an oxidative etching agent; maintaining the solution under conditions at which the oxidative etching agent oxidizes the seed metal bipyramid nanocrystals to form twinned metal nanorod nanocrystals; forming a solution comprising the twinned metal nanorod nanocrystals, at least one cationic quaternary ammonium surfactant, metal precursor molecules, and a reducing agent; and maintaining the solution under conditions at which the reducing agent reduces the metal in the precursor molecules and the metal is deposited on the twinned metal nanorod nanocrystals, thereby growing the secondary twinned metal nanocrystals.

In some embodiments of the methods only a single cationic quaternary ammonium surfactant is used, while in some embodiments a binary cationic quaternary ammonium surfactant is used.

Twinned metal nanocrystals that can be grown from the twinned metal bipyramid nanocrystals include twinned nanorod nanocrystals, twinned elongated bipyramid nanocrystals, twinned spherical polyhedron nanocrystals, twinned bifrustum nanocrystals, twinned nanocrystals having a dumbbell shape comprising a twinned bifrustum shaped body and bipyramid shaped ends, twinned metal nanocrystals having a dumbbell shape comprising a twinned bifrustum shaped body and multiply twinned rod shaped end, and twinned metal nanocrystals having a dumbbell shape comprising a twinned bifrustum shaped body and multiply twinned sphere shaped ends.

One embodiment of a method for photothermally heating a reaction mixture comprising a chemical reactant comprises: contacting the reaction mixture with metal bipyramid nanocrystals; and irradiating the metal bipyramid nanocrystals with radiation, wherein the metal bipyramid nanocrystals absorb the radiation and heat the reaction mixture via photothermal radiation-to-heat conversion. The chemical reactant can comprise, for example, a biomolecule, such as a DNA molecule and/or an enzyme. The metal bipyramid nanocrystals may be added as part of a metal nanocrystal sample in which at least 85% of the metal nanocrystals are metal bipyramid nanocrystals, the metal bipyramid nanocrystals having a polydispersity of less than 8%. Such methods can be used to modulate various chemical reactions in a reaction solution.

One embodiment of a method for photothermally modulating a chemical reaction comprises: (a) preparing a reaction solution comprising: two or more chemical reactants and a metal nanocrystal sample in which at least 85% of the metal nanocrystals are plasmonic metal bipyramid nanocrystals, the plasmonic metal bipyramid nanocrystals having a polydispersity of less than 8%; and (b) irradiating the reaction solution with radiation having wavelengths in the visible region of the electromagnetic spectrum, the infrared region of the electromagnetic spectrum, or both, wherein the plasmonic metal bipyramid nanocrystals absorb the radiation and heat the reaction solution, via plasmonic photothermal radiation-to-heat conversion, to a temperature that modulates a chemical reaction between the two or more chemical reactants.

One embodiment of a method for amplifying target nucleic acid molecules comprises: (a) preparing a reaction solution comprising: the target nucleic acid molecules; primer nucleic acid strands; free nucleotides; a nucleic acid polymerase; and a metal nanocrystral sample in which at least 85% of the metal nanocrystals are plasmonic metal bipyramid nanocrystals, the plasmonic metal bipyramid nanocrystals having a polydispersity of less than 8%; and (b) cycling the reaction solution through a plurality of photothermal cycles. Each photothermal cycle comprises: (i) irradiating the reaction solution with radiation having wavelengths in the visible region of the electromagnetic spectrum, the infrared region of the electromagnetic spectrum, or both, wherein the plasmonic metal bipyramid nanocrystals absorb the radiation and heat the reaction solution, via plasmonic photothermal radiation-to-heat conversion, to a temperature that causes the target nucleic acid molecules to denature; and (ii) cooling the reaction solution to a temperature at which the primer nucleic acid strands anneal to the denatured target nucleic acid molecules and new strands of nucleic acids are synthesized starting from the annealed primer nucleic acid strands to form new target nucleic acid molecules.

One embodiment of a method for thermally controlling an enzymatic reaction comprises: (a) preparing a reaction solution comprising an enzyme, a substrate molecule, and a metal nanocrystral sample in which at least 85% of the metal nanocrystals are plasmonic metal bipyramid nanocrystals, the plasmonic metal bipyramid nanocrystals having a polydispersity of less than 8%; and (b) irradiating the reaction solution with radiation having wavelengths in the visible region of the electromagnetic spectrum, the infrared region of the electromagnetic spectrum, or both, wherein the plasmonic metal bipyramid nanocrystals absorb the radiation and heat the reaction solution, via plasmonic photothermal radiation-to-heat conversion, from a first temperature to a second temperature, wherein, at the first temperature, the enzyme is in an active state that forms a enzyme-substrate complex with the substrate molecule and converts the substrate molecule to a product molecule and, at the second temperature, the enzyme is deactivated and dissociates from the substrate molecule.

In some embodiments, irradiation of the reaction solution can be provided with light sources ranging from visible (400 nm) to infrared (1200 nm) wavelength because the bipyramid nanocrystals described can absorb light from visible to infrared depending on the structures and size of the bipyramid nanocrystal.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings, wherein like numerals denote like elements.

FIG. 4A. Schematic illustrations for cyclic penta-tetrahedral twinning of bipyramids. The gray area shows the cross-section of the bipyramid perpendicular to the growth direction. Each twinning plane is labeled from T1 to T5. The schematic on the right shows most of the possible orientations of the bipyramids on the substrate with respect to the beam direction. FIG. 4B. HR-TEM image of the regrown bipyramid of FIG. 3A, panel 1. FIG. 4C. HR-TEM image of the regrown bipyramid of FIG. 3A, panel 2. FIG. 4D. HR-TEM image of the regrown bipyramid of FIG. 3A, panel 3. FIG. 4E. HR-TEM image of the regrown bipyramid of FIG. 3A, panel 7.

FIG. 10A. TEM images of bipyramids regrown using a growth solution of 2 mM $HAuCl_4$, 2 mM $AgNO_3$, 1 N HCl and 20 mM ascorbic acid, and the binary surfactant BDAC/CTAB. FIG. 10B. TEM images of bipyramids regrown using a growth solution of 2 mM $HAuCl_4$, 2 mM $AgNO_3$, 1 N HCl and 20 mM ascorbic acid, and the binary surfactant CTAC/BDAC. FIG. 10D. TEM image of the bipyramids regrown using an identical amount of CTAB as in FIG. 10C, panel 4, without CTAC or BDAC. Only a minimal amount of tip overgrowth was observed. All scale bars are 200 nm.

FIG. 12A. TEM images of structures regrown with binary surfactants, as in FIG. 3A, panel 7, with different amounts of $AgNO_3$ and with no added HCl. The regrowth solution comprised 2 mM $HAuCl_4$ (50 µL), 20 µL of nanopure water in place of 1 N HCl (20 µL) and 10 mM ascorbic acid (8 µL) with 10 µL $AgNO_3$ having a concentration of 1 mM (left panel), 2 mM (center panel), and 4 mM (right panel), with the binary surfactant [CTAC]:[CTAB]=90:1. FIG. 12B. TEM image of regrown structures, as in FIG. 3A, panel 6, with more HCl used. The regrowth conditions were identical to those used in FIG. 3A, panel 6, except 30 of 1 N HCl was used. FIG. 12C. TEM images of structures regrown with the binary surfactant [CTAC]:[CTAB]=900:1. The regrowth conditions were identical to those used in FIG. 3A: specifically, 1 was standard growth solution, 2 had no HCl, 3 has no AgNO$_3$, 4 had no HCl and no AgNO$_3$, and 5 had 5×AgNO$_3$. All scale bars are 200 nm and 50 nm for low and high magnification images, respectively.

FIG. 26A. Table 1. Part 1. The regrowth conditions employed with either singular or binary surfactants. Total reaction volume remained constant across all trials (1.088 mL). *AA=Ascorbic Acid, BP=Bipyramid, pH=calculated values. FIG. 26B. Table 1. Part 2. The regrowth conditions employed with either singular or binary surfactants. Total reaction volume remained constant across all trials (1.088 mL). *AA=Ascorbic Acid, BP=Bipyramid, pH=calculated values.

DETAILED DESCRIPTION

Figure 1:
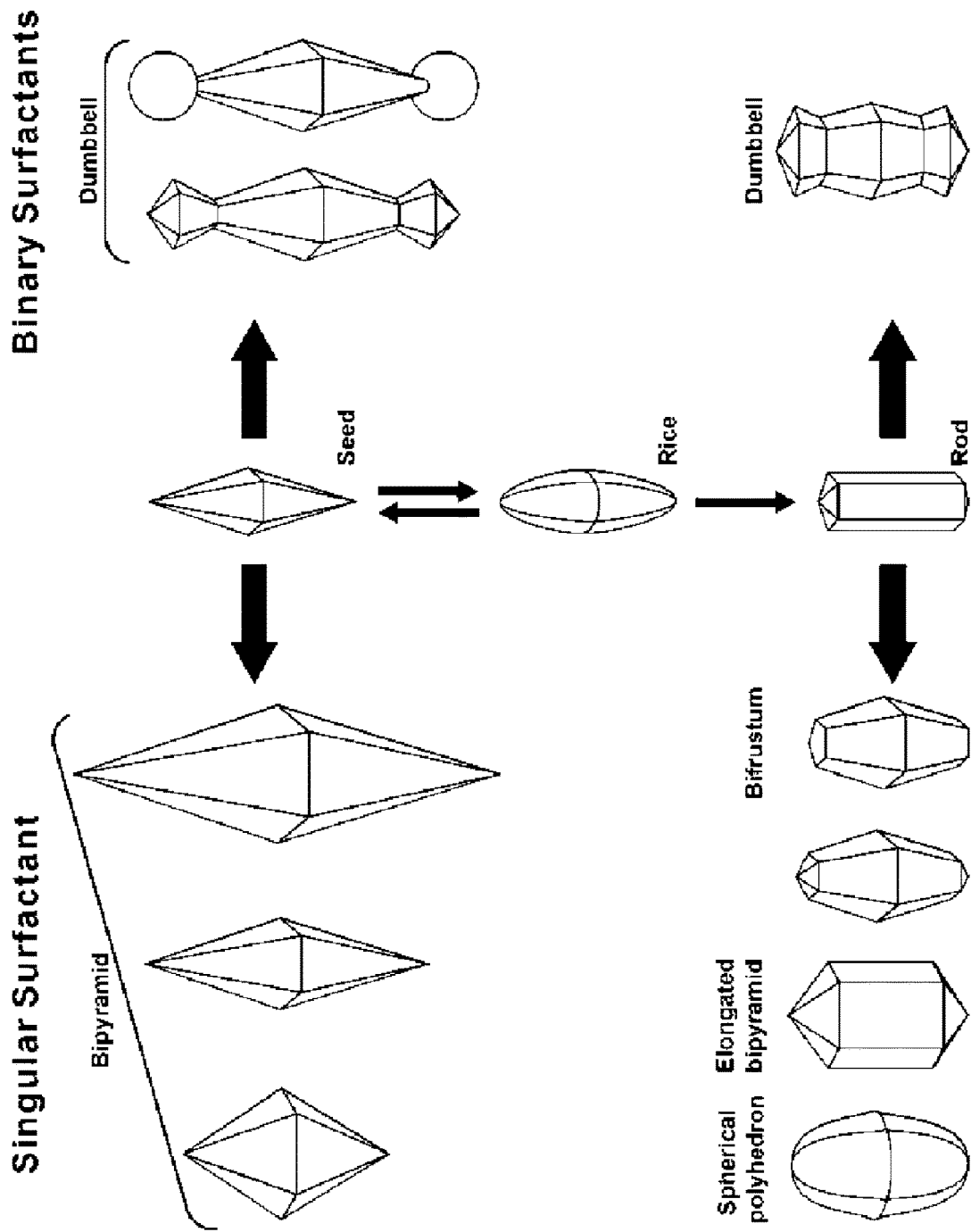
FIG. 1. Schematic representation of the shape control of the metal bipyramid nanocrystals. (The metal bipyramid nanocrystals are also referred to herein as metal bipyramids.) The various pathways to generate unique structures originating from the bipyramid are shown.

Methods for forming samples of noble metal bipyramid nanocrystals having very low size and shape polydispersities from samples of mixed noble metal nanocrystals are provided. The samples include those comprising high purity, substantially monodisperse, plasmonic gold bipyramid nanocrystals. Also provided are methods of growing secondary twinned metal nanocrystals using the noble metal bipyramid nanocrystals as seed particles. Like the seed bipyramid nanocrystals from which they are grown, the secondary nanocrystals are twinned nanocrystals characterized by very low size and shape polydispersities. Secondary twinned nanocrystals grown by these methods include enlarged metal bipyramid nanocrystals, bifrustum-shaped nanocrystals, spherical polyhedral, elongated bipyramids and nanocrystals with anisotropic "dumbbell" shapes having a variety of tip geometries. Methods for using the noble metal bipyramid nanocrystals as plasmonic heaters for thermally induced chemical reactions, such as nucleic acid amplifications and step-wise, thermally induced enzymatic reactions, are also provided.

The noble metal bipyramids are penta-twinned crystals comprising ten high index facets in a face centered cubic structure, as shown schematically in FIG. 4A. The bipyramids are characterized by a long axis along their length (denoted Growth Direction [110] in FIG. 4A) and a short axis running through their width.

Using the present methods, high purity, substantially monodisperse noble metal bipyramid nanocrystals can be separated from a starting sample comprising a mixture of noble metal nanocrystals having a variety of sizes and shapes, including nanorods and nanospheres (e.g., pseudo-spherical nanocrystals). Methods of making such mixed metal nanocrystal samples are known. (See, Liu, M. & Guyot-Sionnest, P. Mechanism of silver(i)-assisted growth of gold nanorods and bipyramids. *J. Phys. Chem. B* 109, 22192-22200 (2005).) One embodiment of a method for forming a high purity sample of metal bipyramid nanocrystals from a starting sample that includes at least one additional type of metal nanocrystal comprises the steps of: forming an aqueous solution of the starting sample and benzyldimethylhexadecyl ammonium chloride (BDAC); maintaining the aqueous solution for a time period and at a temperature sufficient to allow the metal bipyramid nanocrystals to flocculate out of the aqueous solution via depletion flocculation; and separating the flocculated metal bipyramid nanocrystals from the solution. Some embodiments of these methods are able to provide a final metal nanocrystal sample in which at least 75% of the metal nanocrystals are metal bipyramid nanocrystals. This includes embodiments that provide a final metal nanocrystal sample in which at least 80%, at least 85%, or at least 90% of the metal nanocrystals are metal bipyramid nanocrystals. In addition, the methods are able to provide a final metal nanocrystal sample having a nanocrystal size polydispersity of no greater than 10%. This includes embodiments of the methods that provide a final metal nanocrystal sample having a nanocrystal size polydispersity of no greater than 8%, no greater than 5%, no greater than 3%, and no greater than 2%. Methods for determining the metal bipyramid nanocrystal purity and polydispersity of a sample are described in Example 1.

The average length of the flocculated metal bipyramid nanocrystals is desirably lower than about 100 nm because these can generally be separated from the other metal nanocrystals with a higher degree of sample shape uniformity. For example, substantially size monodisperse gold bipyramid nanocrystals having a length in the range from about 65 nm to about 95 nm can be obtained with a purity of 85% or higher. The length of the bipyramid nanocrystals flocculated out of solution can be controlled by adjusting the BDAC surfactant concentration in the growth solution.

Once formed, the initial purified bipyramid nanocrystals can be used as seed crystals for the seed-mediated growth of secondary twinned metal nanocrystals, as described below. The secondary twinned metal nanocrystals may have lengths that are greater than the lengths of the seed bipyramid nanocrystals from which they are grown. For example the secondary nanocrystals may be grown with substantially monodisperse lengths of greater than 100 nm, greater than 150 nm or greater than 200 nm. These secondary metal nanocrystals may be grown with a nanocrystal size polydispersity of no greater than 10%. This includes embodiments of the methods that provide a secondary metal nanocrystal sample having a nanocrystal size polydispersity of no greater than 8%, no greater than 5%, no greater than 3%, and no greater than 2%.

Generally, the methods of growing secondary twinned metal nanocrystals from metal bipyramid nanocrystals comprise the steps of: forming a solution comprising the seed metal bipyramid nanocrystals, at least one cationic quaternary ammonium surfactant, metal precursor molecules, and a reducing agent; and maintaining the solution under conditions at which the reducing agent reduces the metal in the precursor molecules, such that the metal is deposited on the seed metal bipyramid nanocrystals, thereby growing the secondary twinned metal nanocrystals. CTAC, CTAB, BDAC, and mixtures of two or more of these are examples of cationic quaternary ammonium surfactants that may be used in the nanocrystal growth solution. Some embodiments of the secondary nanocrystal growth methods use a unitary surfactant, that is—only a single surfactant—in order to form secondary nanocrystals that are enlarged bipyramid nanocrystals. Other embodiments of the growth methods use a binary surfactant, that is—a mixture of two surfactants—in order to form secondary nanocrystals having a dumbbell shape.

The metal precursor molecules are molecules comprising a metal in a mono- or multivalent state that is reducible by the reducing agent in the growth solution. The metal precursor molecules may be, for example, metal-containing inorganic or organic acids or salts. Chlorauric acid ($HAuCl_4$) is an example of a gold precursor molecule that can be used to grow secondary twinned gold nanocrystals from gold bipyramid seed nanocrystals. Others include gold(I) chloride, gold(III) chloride, and potassium gold(III) chloride.

The reducing agent reduces the metal in the metal precursor molecule. L-ascorbic acid is an example of a suitable reducing agent for precursor molecules. Others include hydroxylamine hydrochloride, hydroquinone, citric acid, amines, aniline, pyridine, and glycine. The concentration of reducing agent in the growth solution may be sufficiently high to completely reduce the metal precursor molecules. Alternatively, the metal precursor molecules may be provided in excess to allow for etching of the seed nanocrystals prior to secondary nanocrystal growth, as described in greater detail below.

In addition to the seed bipyramid nanocrystals, the metal precursor molecules, and the reducing agent, the secondary growth solution may comprise a pH adjusting agent, a silver salt, or both. The pH adjusting agent, which may be a strong acid, such as hydrochloric acid (HCl), lowers the pH of the growth solution and slows the rate of the reduction of the metal precursor molecules by the reducing agent. Lowering the reduction rate can lead to secondary twinned metal nanocrystals having a higher aspect ratio than secondary twinned metal nanocrystals made under analogous reaction conditions at a higher pH.

The silver salt provides monovalent silver ions in the growth solution, which results in the underpotential deposition of a thin film (e.g., monolayer) of silver on the seed bipyramid nanocrystal facets. Silver nitrate ($AgNO_3$) is an example of such a silver salt. Other examples include the water soluble salts silver fluoride, silver acetate and silver sulfate. This film of silver stabilizes the facets onto which it is deposited and, therefore, affects the growth rate of the secondary nanocrystal on those facets. As a result, the silver salts can be used to tailor the final shape of the secondary twinned metal nanocrystals. By way of illustration, in some embodiments of the methods for growing secondary twinned metal nanocrystals, silvers salts are used in combination with a binary surfactant system to promote lateral overgrowth at the tips of the seed bipyramid nanocrystals. This is illustrated in the Example 1.

The optimal conditions for growing and flocculating the initial metal bipyramid nanocrystals and for growing the secondary twinned metal nanocrystals will depend on a variety of factors, including the desired size and monodispersity of the seed nanocrystals and secondary nanocrystals and the desired shapes of the secondary nanocrystals. For example, the seed nanocrystals and secondary nanocrystals can be grown at temperatures at or near room temperature (e.g., at temperatures in the range from about 20° C. to about 40° C., including temperatures in the range from about 25° C. to about 35° C.) using reaction times of one day (24 hours) or less (e.g., reaction times from about 1 hour to about 12 hours). However, reaction temperatures and times outside of these ranges can be employed. As noted above, the pH of the growth solution can affect the rate and shape of the nanocrystals and, therefore, should be selected accordingly. By way of illustration only, the pH value of the nanocrystal growth solution in some embodiments of the present methods is in the range from about 1.5 to about 4. This includes embodiments of the methods in which the pH value of the growth solution is in the range from about 1.7 to about 3.7. In addition, the particular reactants included in a given growth solution and their concentrations in the solution can also be selected to tailor the final shapes and sizes of the grown nanocrystals. Guidance regarding the effects of the various reactants and their concentrations in the growth solutions is provided in Example 1.

Depending upon the desired shape of the secondary metal nanocrystals, the growth solution may include only a single cationic quaternary ammonium surfactant or may include a combination of cationic quaternary ammonium surfactants. For example, by using CTAB or another quaternary ammonium surfactant as a unitary surfactant, enlarged metal bipyramid nanocrystals can be grown from the seed metal bipyramid nanocrystals. The secondary metal bipyramid nanocrystals retain the shape of, but are larger in at least one dimension than, the seed bipyramid nanocrystals. The growth of the secondary bipyramid crystals may be isotropic, with even growth along the long and short axes of the bipyramids. Alternatively, the growth may be anisotropic with a faster growth along the long or short axis of the bipyramid to provide secondary bipyramid nanocrystals with higher or lower aspect ratios, respectively, than their seed bipyramid nanocrystals.

A binary surfactant, in contrast, can be used to grow secondary twinned metal nanocrystals having a dumbbell shape. The dumbbell-shaped nanocrystals comprise a central portion, or "body", capped on both ends with various tip structures, with a narrowing in the nanocrystal between the body portion and each of the tip structures. The body portion of the dumbbell is generally bifrustum-shaped and is penta-twinned with ten facets. The tip structures, which are themselves multiply twinned, may be rod-shaped, spherical (including pseudo-spherical), or bipyramids, depending on the reaction solution and conditions, as illustrated in Example 1. Dumbbell-shaped nanocrystals are illustrated schematically on the right side of FIG. 1.

The binary surfactants comprise a first cationic quaternary ammonium surfactant and a second cationic quaternary ammonium surfactant, the second cationic quaternary ammonium surfactant having a lower binding affinity for the seed metal bipyramid nanocrystals than the first cationic quaternary ammonium surfactant. For example, for the growth of gold nanocrystals, CTAC and CTAB can be used as the first and second quaternary ammonium surfactants, respectively, where CTAB has a lower binding affinity for gold bipyramids than does CTAC. During the growth of the secondary nanocrystals, the surfactant with the lower binding affinity for the seed metal bipyramid nanocrystals become localized at the tips of the bipyramids, which results in enhanced overgrowth at the bipyramid tips relative to the rest of the bipyramid crystal. The molar ratio of the two surfactants can be varied over a broad range, although the first cationic quaternary ammonium surfactant will typically be present at a higher concentration. By way of illustration, the molar ratio of the first and second cationic quaternary ammonium surfactants can be in the range from about 9:1 to 9000:1. This includes embodiments of the growth solutions in which the molar ratio of the first and second cationic quaternary ammonium surfactants is in the range from about 90:1 to 900:1.

As previously discussed, pH adjusting agents and/or silver salts can be added to the growth solutions in order to tailor the tip geometries of the dumbbells. In addition, the ratio of the two surfactants and the concentrations of the various reactants can be adjusted to provide twinned nanocrystal dumbbells having a desired size and tip geometry. By way of illustration, the secondary nanocrystal growth solution may comprise a silver salt, such as silver nitrate, in order to grow dumbbell-shaped secondary nanocrystals having bipyramid-shaped ends. Alternatively, the secondary nanocrystal growth solution may comprise a pH adjusting agent, such as HCl, in order to grow dumbbell-shaped secondary nanocrystals having multiply twinned rod-shaped ends. If a pH adjusting agent and a silver salt are both included in the growth solution, dumbbell-shaped nanocrystals having either bipyramid- or sphere-shaped ends can be grown. Guidance regarding the effect of the various reactants and their concentrations in the growth solutions is provided in Example 1.

Optionally, the metal bipyramid seed nanocrystals can be oxidatively etched prior to growing the secondary nanocrystals. This oxidation etch steps makes it possible to grow secondary twinned metal nanocrystals in an even broader variety of shapes. Thus, some embodiments of the methods for growing secondary twinned metal nanocrystals from metal bipyramid nanocrystals comprise the steps of: forming a first solution comprising seed metal bipyramid nanocrystals, at least one cationic quaternary ammonium surfactant, and an oxidative etching agent; maintaining the first solution under conditions at which the oxidative etching agent oxidizes the seed metal bipyramid nanocrystals to form twinned metal nanorod nanocrystals; forming a second solution comprising the twinned metal nanorod nanocrystals, at least one cationic quaternary ammonium surfactant, metal precursor molecules, and a reducing agent; and maintaining the second solution under conditions at which the reducing agent reduces the metal in the precursor molecules and the metal is deposited on the twinned metal nanorod nanocrystals, thereby growing the secondary twinned metal nanocrystals. The etching step takes advantage of the high-energy nature of the bipyramid nanocrystal facets and sharp tips, which makes them susceptible to etching even by weak oxidizing agents. Examples of suitable oxidative etching agents include dissolved molecular oxygen and multivalent metal ions. The latter may be present in the solution by virtue of the incomplete reduction of the metal precursor molecules in the growth solution. For example, $Au^{3+}$ cations may be used as an oxidative etchant for gold bipyramid nanocrystals.

Once the twinned metal nanorod nanocrystals are formed, surfactant selection, the composition of the growth solution, and the concentration of reactants in the growth solution can be tailored to adjust the size and shape of the secondary twinned metal nanocrystals that are grown from the nanorods. For example, secondary gold nanocrystals having an elongated bipyramid shape can be grown from the nanorod nanocrystals using a unitary cationic quaternary ammonium surfactant, such as CTAB, and a silver salt, such as silver nitrate, in the secondary nanocrystal growth solution. Secondary gold nanocrystals having a spherical polyhedron shape can grown from the nanorod nanocrystals using a unitary cationic quaternary ammonium surfactant, such as CTAB, and a pH adjusting agent, such as HCl, in the secondary nanocrystal growth solution. Secondary gold nanocrystals having a bifrustum shape can grown from the nanorod nanocrystals using a unitary cationic quaternary ammonium surfactant, such as CTAB, a pH adjusting agent, such as HCl, and a silver salt, such as silver nitrate, in the secondary nanocrystal growth solution. Schematic illustrations of bifrustum-shaped, elongated bipyramid-shaped and spherical polyhedron-shaped are shown at the lower left in FIG. 1.

As with the seed metal bipyramid nanocrystals, the seed metal nanorod nanocrystals can be combined with a binary surfactant to grown dumbbell-shaped secondary nanocrystals. The dumbbell-shaped secondary nanocrystals grown from the seed nanorod nanocrystals may have a shorter length and/or a lower aspect ratio than the nanorod nanocrystals from which they are grown.

Methods using the samples of highly size-monodisperse noble metal bipyramid nanocrystals, and/or the secondary twinned metal nanocrystals grown therefrom, in plasmonic heating applications are also provided. The plasmonic photothermal activity of the metal bipyramid nanocrystals is a result of the excitation of their electrons by a radiation source and, due to the presence of multiple trap states in the nanocrystals, the emission of the absorbed energy in a non-radiative fashion as heat. Because the methods described herein are able to provide metal nanocrystal samples comprising plasmonic metal bipyramid nanocrystal at high levels of purity and with very low polydispersities, they are able to achieve precise thermal control in plasmonic heating applications.

In plasmonic heating applications, the noble metal bipyramid nanocrystals (and/or the secondary twinned metal nanocrystals grown therefrom) are included in a reaction solution that comprises at least two chemical reactants that undergo a thermally modulated reaction to produce one or more reaction products. When the reaction solution is irradiated with radiation that is absorbed by and excites the noble metal bipyramid nanocrystals, the nanocrystals convert the absorbed light energy into heat energy, thereby increasing the temperature of the reaction solution. The change in temperature can be tailored to modulate the reaction between the two reactants. Depending upon the particular reactive species in the solution, the temperature change can induce the onset of a chemical reaction, stop a chemical reaction, or change the rate of a chemical reaction by either increasing or decreasing the reaction rate. The reaction solution may be, for example, an aqueous solution or a non-aqueous solution comprising one or more organic solvents.

The optical and plasmonic properties of the metal bipyramid nanocrystals will correspond directly to the size and length of the nanocrystals. This is particularly true since the nanocrystals are anisotropic, having more than one defining dimension. In particular, for the bipyramids both the transverse (short) and longitudinal (long) axes can have optical absorbance at very different regions of the electromagnetic spectrum. Thus, the absorbance profile for a given plasmonic heating application can be selectively tuned by tailoring the size and dimensions of the bipyramid nanocrystals being used. For example, for the gold bipyramids of Example 2, the longitudinal peak shows a 3-fold absorbance relative to the transverse peak and occurs in the near infrared (NIR) or IR range, indicating that the incident light for photothermal applications using the gold nanocrystals will also be in the NIR or IR.

The plasmonic metal bipyramid nanocrystals can be coated with a material that enhances their thermal stability, enhances their water dispersity, and/or imparts a surface charge in order to decrease their tendency to agglomerate in solution. A surface coating may also be used to provide reactive surface functional groups on the nanocrystals, which can react with functional groups on a substrate to form covalent attachments between the nanocrystals and the substrate. The coating is desirably a thin film covering at least a portion of the nanocrystal surfaces that preserves the overall shape of the bipyramid nanocrystals. For nanocrystals intended for use in biomedical applications the coating is also desirably biocompatible.

Silica (silicon dioxide) is an example of a material that can be used as a coating. A silica coating is biocompatible, provides the nanocrystals with increased solution stability, and provides reactive surface functionalization. Silica-coated nanocrystals retain the high levels of monodispersity achieved in the original synthesis, but are more robust and resistant to solution-based degradation. The use of the silica-coated gold bipyramid nanocrystals for the precise control of the temperature of a reaction solution is illustrated in Examples 2 and 3. As demonstrated in those examples, by controlling the excitation pulse length and frequency, precise fixed reaction temperature conditions can be achieved.

The optimal concentration of the plasmonic metal bipyramid nanocrystals in a reaction solution will depend, at least in part, on the thermal requirements of the intended application. By way of illustration, in some applications the plasmonic metal bipyramid nanocrystals are present in concentrations that provide an optical density of the solution in the range from 1 to 5. This includes solutions in which the plasmonic metal bipyramid nanocrystals are present in concentrations that provide an optical density in the range from 2 to 4. Methods for determining the optical density of a solution are described in Example 2, below.

Plasmonic heating applications in which the metal bipyramid nanocrystals (and/or the secondary twinned metal nanocrystals grown therefrom) can be used to heat a reaction solution via plasmonic-photothermal radiation-to-heat conversion include methods for amplifying nucleic acid molecules. The metal bipyramid nanocrystals can be used to generate heat in both isothermal amplification protocols, including strand displacement amplification and rolling circle amplification, and also in thermocyclic amplification protocols, such as PCR. In the nucleic acid amplification methods the metal bipyramid nanocrystals are included in an amplification reaction solution. The reaction solution is then irradiated with visible and/or infrared radiation that is absorbed by the metal bipyramid nanocrystals, which convert the radiation into heat energy, thereby raising the temperature of the reaction solution and inducing the onset of the nucleic acid amplification process.

The ability to precisely control solution temperature using the plasmonic photothermal properties of the bipyramid nanocrystals is highly desirable for thermocyclic PCR, where conventional thermo-cycling protocols require bulky and expensive temperature-control instrumentation that has greatly limited the mobility of PCR assays and prevented their use in point-of-care scenarios. Moreover, because the plasmonic metal bipyramid nanocrystals absorb in the IR region of the electromagnetic spectrum (i.e., from 700 nm to 1000 μm), including the NIR region of the electromagnetic spectrum (i.e., from 700 nm to 2 μm), the photothermal activation of the nanocrystals can be done without degrading enzymes, nucleic acids, or other biomolecules in the reaction solutions.

The composition of the amplification reaction solution will depend on the type of amplification being conducted. However, generally, the reactions solutions will include the plasmonic metal bipyramid nanocrystals, the target nucleic acid molecules to be amplified, primer nucleic acid strands, free nucleotides, and a nucleic acid polymerase, such as a DNA or RNA polymerase. Additional components that may be present in the reaction solutions include buffers, additives that stabilize the reactants and/or reduce amplification inhibition, and fluorescent probes that enable real-time monitoring of the nucleic acid replication. The plasmonic metal bipyramid nanocrystals can be added as part of a metal nanocrystal sample that comprises the metal bipyramid nanocrystals at high purities and with very low polydispersities. By way of illustration, a metal nanocrystal sample added to a reaction solution can comprise at least 85% plasmonic metal bipyramid nanocrystals, the plasmonic metal bipyramid nanocrystals having a polydispersity of less than 8%. The highly pure samples of metal bipyramid nanocrystals having very low size and shape polydispersities can be obtained from samples of mixed noble metal nanocrystals using the methods described herein and illustrated in Example 1.

Because light-activated thermocyclic PCR depends on the precise and repeated cycling between two or more different reaction temperatures, the precise thermal control provided by the highly pure and highly monodisperse metal bipyramid nanocrystals is well-suited for use in that application. One embodiment of a method of amplifying target nucleic acid molecules via light-activated thermocyclic PCR is shown schematically in FIG. 16. The method comprises the steps of preparing a reaction solution comprising: the target nucleic acid molecules 1602; primer nucleic acid strands 1604; free nucleotides (not shown); a DNA polymerase (not shown); and a metal nanocrystal sample comprising plasmonic metal bipyramid nanocrystals 1606 (panel (a)), and then cycling the reaction solution through a plurality of photothermal cycles 1607. Each of the photothermal cycles includes the steps of irradiating the reaction solution with incident radiation from an incident light source 1608, wherein the plasmonic metal bipyramid nanocrystals absorb the incident radiation and heat the reaction solution, via plasmonic photothermal radiation-to-heat conversion, to a first temperature that causes the target nucleic acid molecules to denature (panel (b)); and then cooling the reaction solution to a lower temperature at which the primer nucleic acid strands anneal to the denatured target nucleic acid molecules (panel (c)) and new strands of nucleic acids are synthesized starting from the annealed primer nucleic acid strands (panel (d)) to form new target nucleic acid molecules 1610 (panel (e)).

Figure 17:
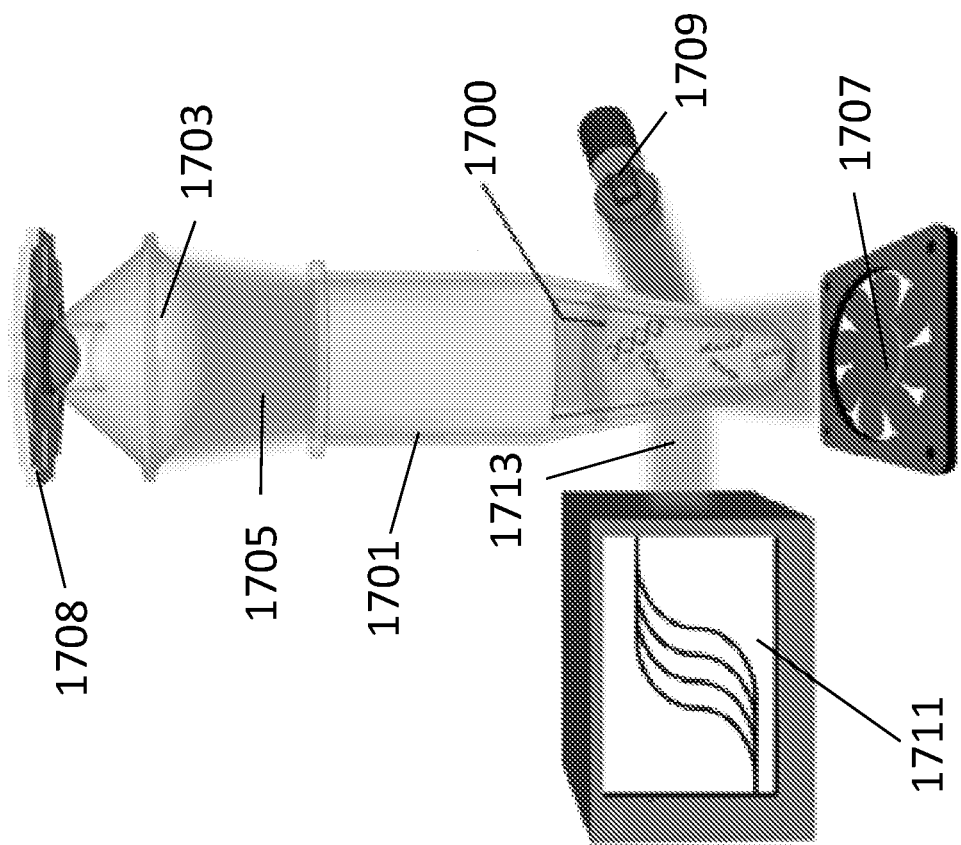
FIG. 17. Schematic showing the setup of the two LEDs, fan cooling system, and photodiode detector for the reaction flow of FIG. 16. The bipyramid nanocrystals are excited by a first LED and provide uniform and localized heating.

A schematic diagram of one embodiment of a nucleic acid amplification apparatus is shown in FIG. 17. The apparatus includes a reaction solution 1700 in a container 1701, such as a vial. An IR light source 1708 is positioned above reaction solution 1700, such that it is configured to irradiate the reaction solution and induce plasmonic heating. The apparatus may optionally include focusing optics, such as a lens 1703, configured to focus the incident radiation 1705 onto reaction solution 1700 and a fan 1707 configured to direct air at container 1701 to increase the rate of cooling. In the embodiment shown in FIG. 17, nucleic acid molecules are labeled with fluorescent probes and the apparatus includes a second light source 1709 configured to irradiate reaction solution 1700 and excite the probes. The apparatus further include a detector 1711, such as a CCD camera, configured to detect and monitor the fluorescence 1713 emitted by the excited probes.

Figure 18:
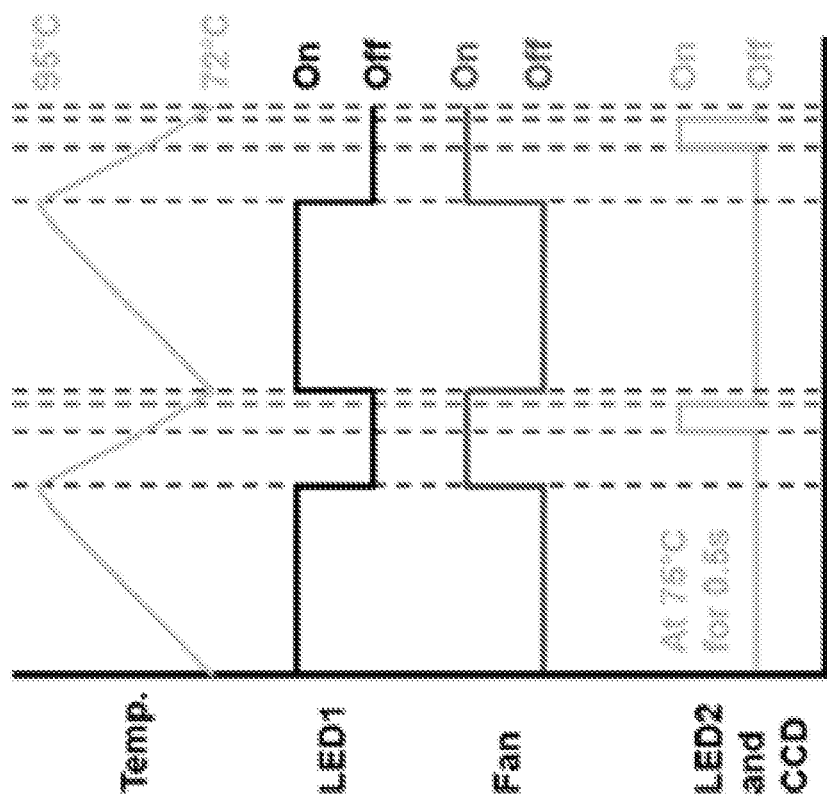
FIG. 18. Graph showing the temporal usage of the two LEDs and the fan during the reaction flow of FIG. 16. The temperature fluctuation in the reaction solution is also shown. Excitation by the first LED causes the temperature to increase. After the solution reaches the desired temperature, that LED shuts off and the fan begins cooling the solution. Once the solution is sufficiently cooled, a second LED is turned on to excite the fluorescent dye to provide real-time data for the amplification. When the solution is cooled to the desired temperature the fan shuts off and the first LED turns on again to reheat the solution, prompting the thermocycling.

The graph in FIG. 18 shows the temporal usage of the light sources, detector, and fan, along with the reaction solution temperature changes, during the PCR thermocycles. For purposes of illustration, the light sources in this example are LEDs and the detector is a CCD camera. However, other light sources, such as IR lasers, and detectors, such as photomultipliers tubes could be used. As shown in the graph, excitation of the plasmonic metal bipyramid nanocrystals in the reaction solution by the first LED (LED 1) causes the solution temperature to increase. After the solution reaches the desired temperature for double strand denaturization, LED 1 shuts off and the fan begins cooling the solution. Once the solution has reached the second desired temperature, the second LED (LED 2) is turned on to excite the fluorescent dye molecules bound to the nucleic acid molecules to provide for real-time monitoring of the amplification process. When the solution is sufficiently cool, the fan shuts off and LED 1 is turned on again to continue the thermocycling. The number of cycles for a nucleic acid amplification protocol will depend on the desired degree of replication.

Figure 16:
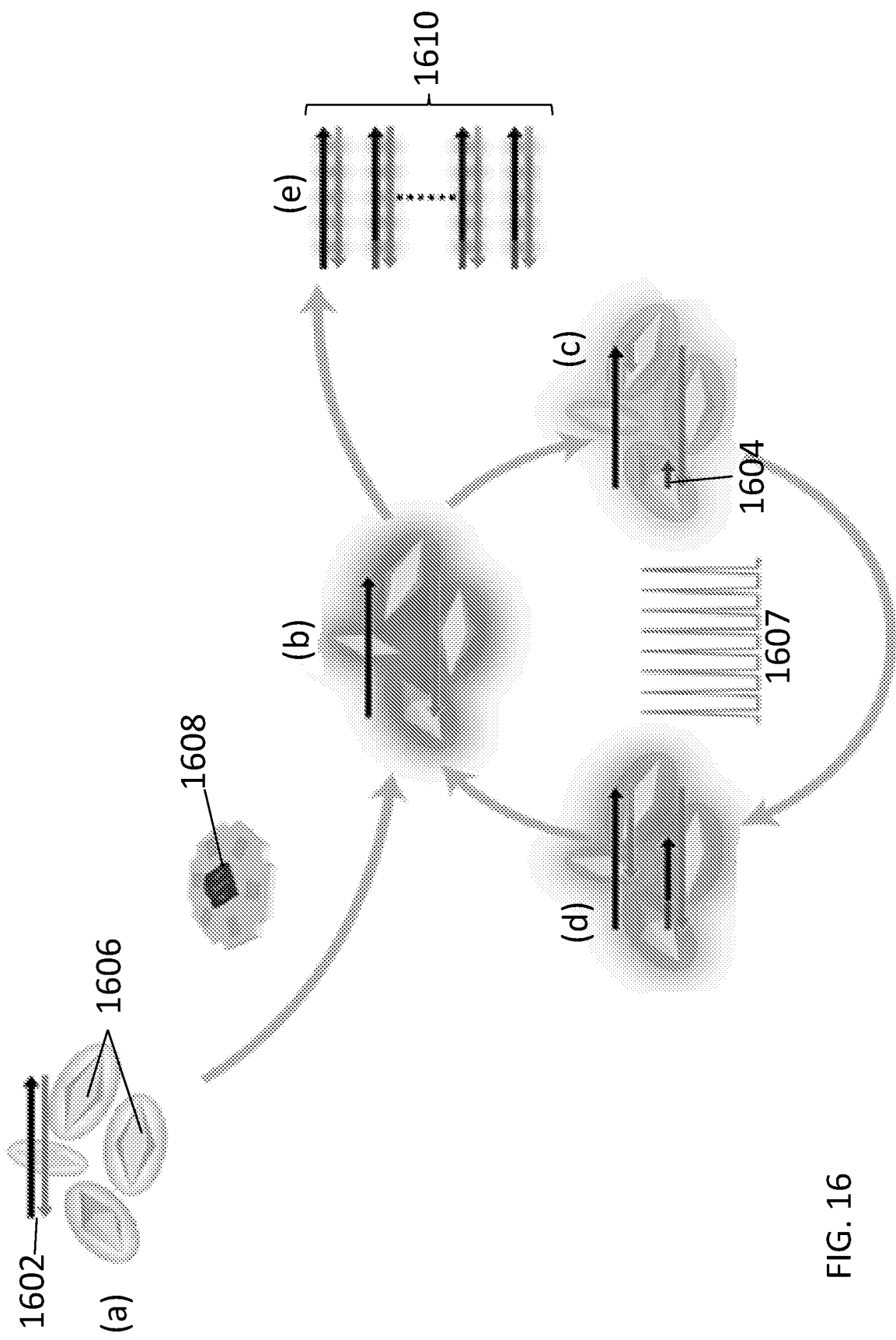
FIG. 16. Schematic diagram showing a solution containing target nucleic acid molecules and bipyramid nanocrystals exposed to an IR light-emitting diode (LED) emitter. The IR LED cycles on and off. When on, the solution heats and DNA denaturation occurs. When off, the solution cools and primer annealing occurs. Once annealed, polymerase extension occurs. The IR LED then turns back on and reheats the solution to promote denaturation. This process is ultra-fast cycling. During the annealing phase, the accumulated products can be detected through fluorescent dyes, which are excited by a different LED and detected through a photo-diode.

During the first phase of the cycle (panel (b) in FIG. 16), the reaction is rapidly heated to a temperature that induces the denaturation of the double stranded target nucleic acid molecules in preparation for primer hybridization. Typically, this temperature is in the range from about 90 to about 95° C. In the next phase of the cycle, the reaction is cooled to a temperature that facilitates the annealing of the primer nucleic acid strands to the separated strands of the denatured target nucleic acid molecules and promotes the extension of the nucleic acid molecules via growth starting from the annealed primer nucleic acid strands. In some embodiments of the PCR amplification methods, the annealing of the primer nucleic acid strands to the denatured target nucleic acid molecules and the nucleic acid chain extension are carried out in a single step at a single temperature, typically at a temperature in the range from about 70 to about 75° C. Alternatively, the annealing and the extension steps can be carried out at two different temperatures, with the former typically being carried out at a temperature in the range from about 40 to about 70° C. and the latter typically being carried out at a temperature in the range from about 70 to about 75° C.

Because the metal bipyramid nanocrystals are very efficient plasmonic heaters, photothermal cycles can be very short. For example, in some embodiments of the methods of amplifying target nucleic acid molecules, the photothermal cycling is carried out at a rate of at least 3 photothermal cycles per minute. This includes embodiments of the methods in which the photothermal cycling is carried out at a rate of at least 2 photothermal cycles per minute. Once the photothermal cycling has been completed, the reaction solution can be cooled to room temperature (i.e., ~23° C.) or lower for storage or downstream processing, such as gel electrophoresis analysis.

Other plasmonic heating applications in which the metal bipyramid nanocrystals (and/or the secondary twinned metal nanocrystals grown therefrom) can be used to heat a reaction solution via plasmonic-photothermal radiation-to-heat conversion include methods for carrying out thermally controlled enzymatic reactions. In a thermally controlled enzymatic reaction, the metal bipyramid nanocrystals are included in a reaction solution comprising one or more enzymes and a substrate molecule, which is then irradiated with visible and/or infrared radiation. The radiation is absorbed by the metal bipyramid nanocrystals and converted into heat energy, thereby raising the temperature of the reaction solution from an initial temperature at which the enzyme is in an active state to a higher temperature at which the enzyme is in an inactive state. When the enzyme is active, it forms an enzyme-substrate complex with the substrate molecule and the substrate molecule is converted into a new product as a result of the interaction with the enzyme. When the enzyme is deactivated, the substrate molecule dissociates from the enzyme and the enzymatic reaction ceases. If a plurality of different enzymes having different activation and deactivation temperatures is present in the reaction solution, photothermal heating by the plasmonic metal bipyramids in the solution can be used to increase the temperature of the reaction solution in a stepwise manner, such that different enzymes are selectively activated and deactivated at each temperature. Various enzymes and substrate molecules can be used. Examples of suitable substrate molecules include biomolecules, such as nucleic acid molecules, including DNA and RNA molecules. The step-wise digestion of a plasmid DNA substrate molecule using the selective and step-wise activation of two different enzymes is illustrated in Example 3.

EXAMPLES

Example 1: Synthesis of Metal Bipyramid Nanocrystals and Secondary Twinned Metal Nanocrystals This example demonstrates purification of a range of gold bipyramid sizes through depletion flocculation using benzyldimethylhexadecylammonium chloride (BDAC) as the surfactant, and shows that the purified product can further be used as a seed to grow other secondary twinned metal nanocrystals with a high degree of size and shape monodispersity.

Results

Purifying and Enlarging the Bipyramids.

Figure 2A:
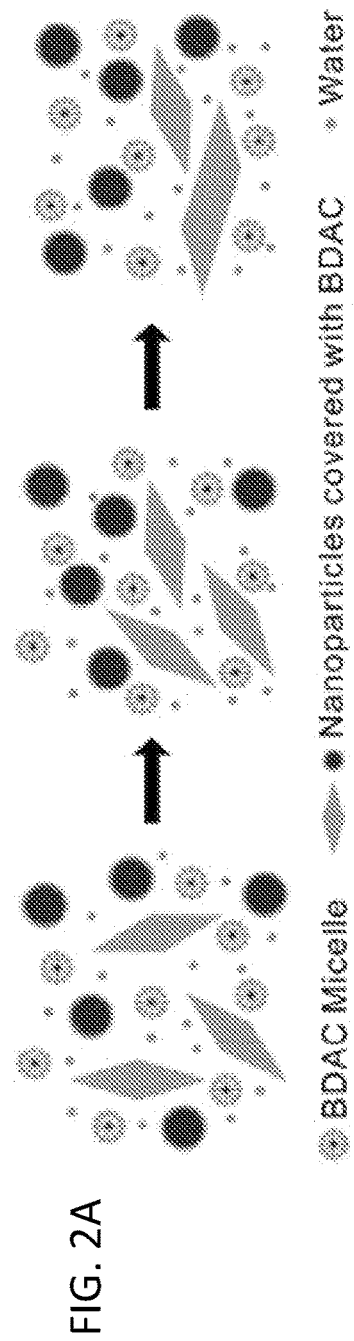
FIG. 2A. Schematic illustration of bipyramids resultant from the purification by depletion flocculation with benzyldimethylhexadecyl ammonium chloride (BDAC).
Figure 2B:
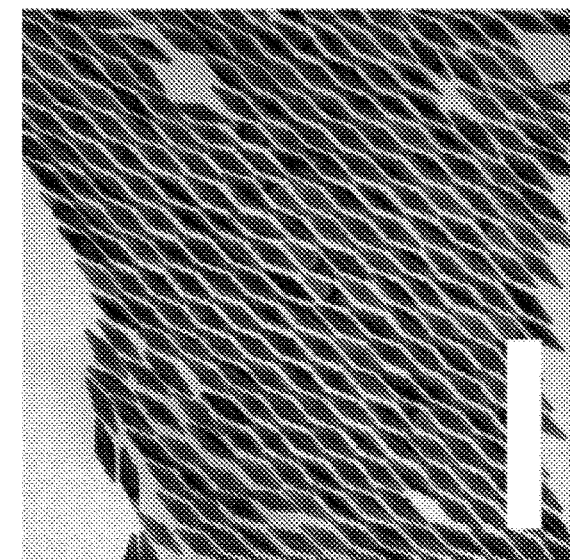
FIG. 2B. UV-Vis-NIR spectrum of bipyramids resultant from the purification by depletion flocculation with BDAC.
Figure 2C:
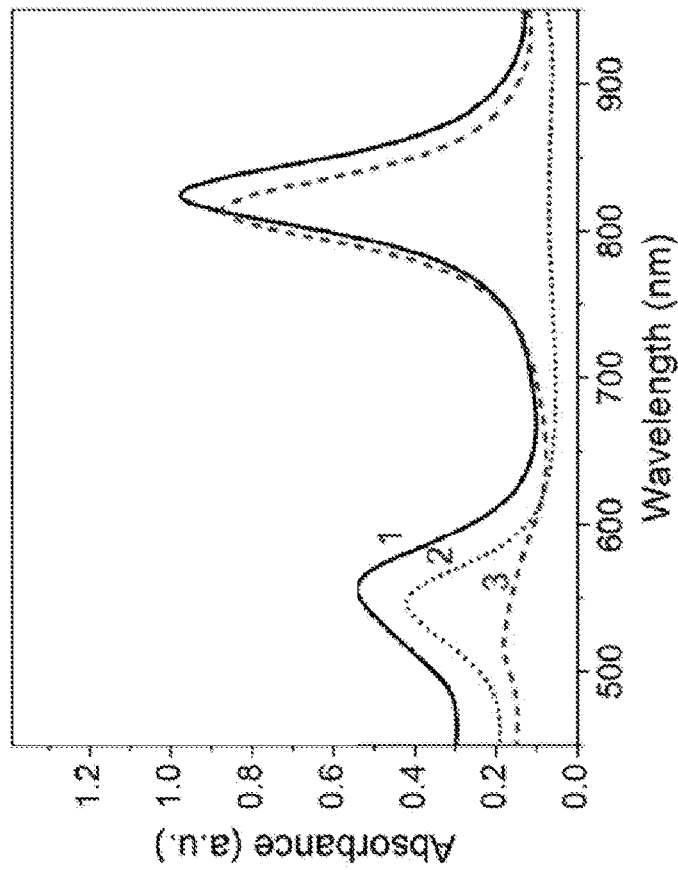
FIG. 2C. Transmission electron microscope (TEM) image of bipyramids resultant from the purification by depletion flocculation with BDAC.
Figure 2D:
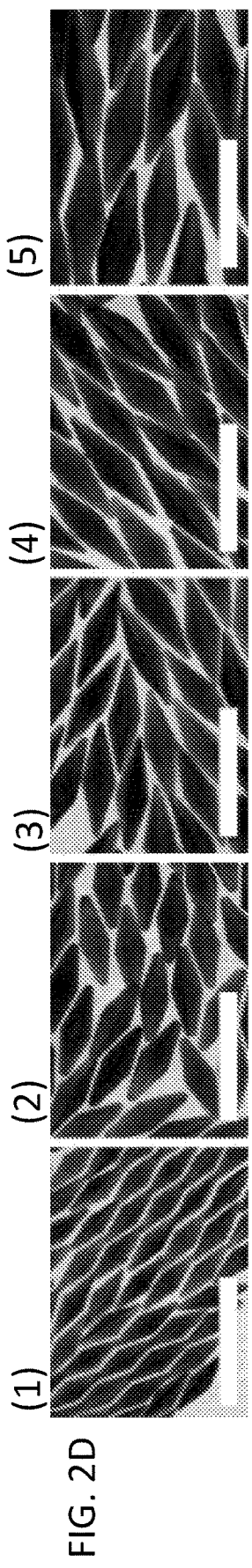
FIG. 2D. TEM images of bipyramids of various sizes regrown from the original seed metal bipyramid nanocrystals in FIG. 2C. Bipyramids shown in panels 1-5 correspond to traces 6-10 in FIG. 2E.
Figure 7A:
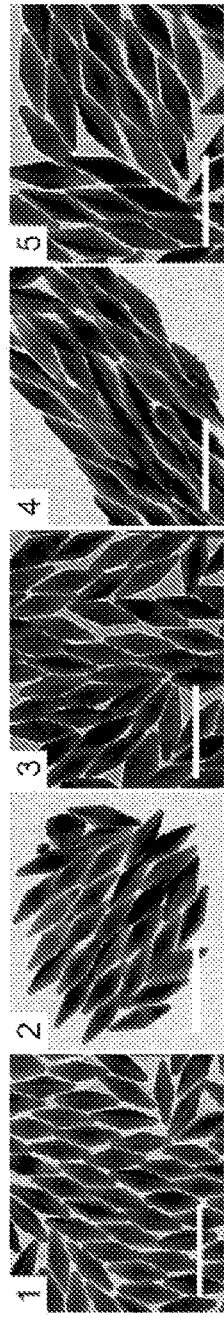
FIG. 7A. TEM images of purified bipyramids (1-5 corresponding to 110, 100, 95, 70 and 60 µL seed solutions). Scale bars are 100 nm.
Figure 7D:
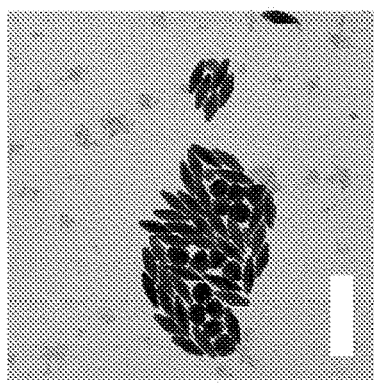
FIG. 7D. TEM image showing co-flocculation of both bipyramids and pseudo-spherical impurities when the purification was attempted with bipyramids synthesized >100 nm. Scale bar is 200 nm. See also Supplementary Note 1 for detailed explanations.

Gold bipyramids were synthesized according to the method by Liu and Guyot-Sionnest using seed-mediated growth, and subsequently purified by depletion flocculation. BDAC was chosen for the purification due to the significantly higher micelle concentration than CTAB at the same concentrations (roughly 2.6 times more, see Supplementary Note 1). (See, Liu, M. & Guyot-Sionnest, P. Mechanism of silver(i)-assisted growth of gold nanorods and bipyramids. *J. Phys. Chem. B* 109, 22192-22200 (2005).) The high micelle concentration induces flocculation at much lower surfactant concentrations, helping to avoid certain issues that can generally arise at high surfactant concentrations such as high solution viscosity, solubility issues, and the unpredictable transitions from spherical micelles to rodlike or wormlike micelles. FIG. 2B shows representative UV-Vis spectra and FIG. 2C shows a TEM image for highly purified gold bipyramids over 90% (See also FIG. 2D, panels 1-5 and FIG. 7A for other sizes). The purification utilizes depletion attraction forces to selectively flocculate nanopaticles with high facial surface area, in this case the bipyramids. The strength of the attractive force is proportional to the volume of pure water generated during the approach of the two nanoparticles, which is likewise proportional to the possible contact area of the nanoparticles. Therefore, particles with large possible contact areas, such as the bipyramids, will selectively flocculate while those with low possible contact areas, such as the spherical impurities, will remain in the supernatant (1: as-synthesized bipyramids, 2: supernatant, 3: purified bipyramids, See also FIG. 7A and Methods for detailed procedure and TEM images). Bipyramids over 100 nm become increasingly difficult to separate from pseudo-spherical impurities as the facial surface area of both bipyramids and pseudo-spherical impurities are increased, resulting in undesirable co-flocculation (FIG. 7D).

TEM was used to determine the shape purity and the polydispersity of the nanocrystals. Purity was determined by obtaining TEM images and counting the relative purity out of at least 200 nanocrystals. The polydispersity was obtained by taking at least 50 representative measurements of the length and width of the nanocrystals from the TEM images. Measurements can obtained through the image-capture software on the instrument or using ImageJ program.

Figure 8A:
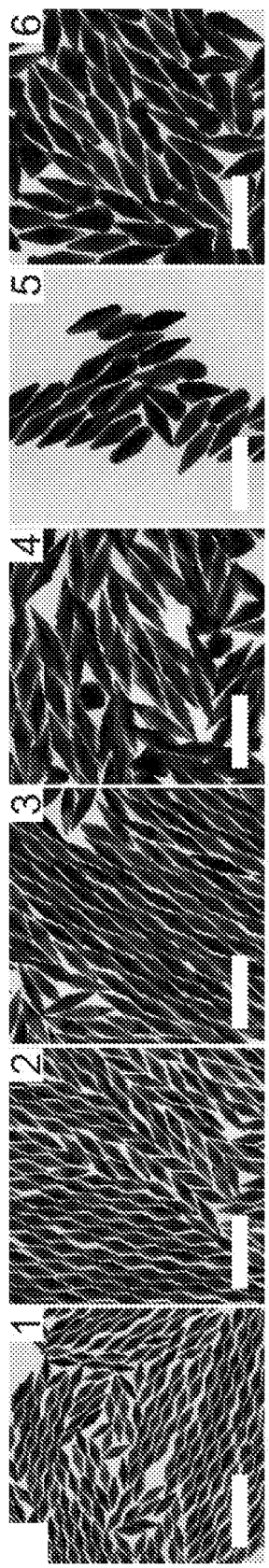
FIG. 8A. TEM images of enlarged bipyramids resulting from regrowth with different concentrations of reactants ($H^+$, $Ag^+$, and seed particles) using 100 µL seeds (panels 1-4) and 5 µL seeds (panels 5-6).
Figure 8B:
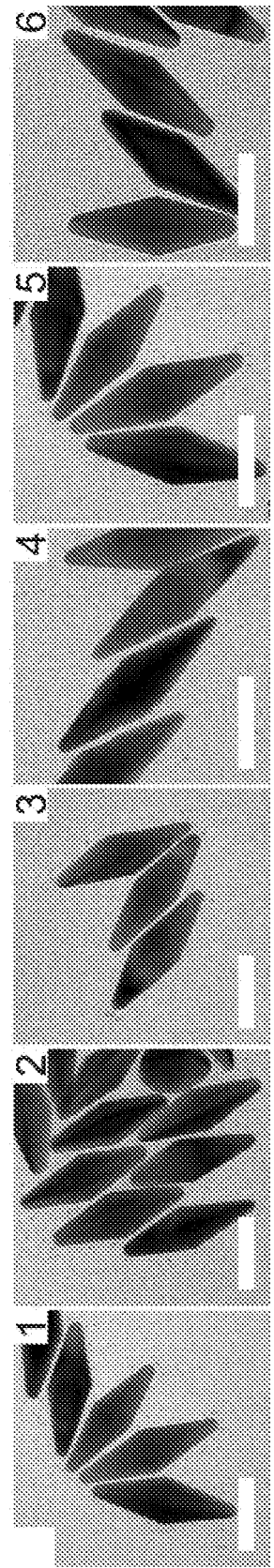
FIG. 8B. TEM images of bipyramids regrown with different amounts of $AgNO_3$ (panels 1-3) and HCl (panels 4-6). See also Table 1 for detailed synthetic conditions. A high concentration of gold precursor (>10 mM) in the growth solution containing 0.1M cetyltrimethyl ammonium bromide (CTAB) can cause the formation of an CTAB-Au complex that can affect the crystalline structure of the bipyramids, resulting in a rough surface (panels 1-4 in FIG. 8A). Additionally, a volume of seed solution too small can cause erratic growth and yield undesired shape impurities (panels 5-6 in FIG. 8A). All scale bars in FIG. 8A and FIG. 8B are 200 nm and 50 nm, respectively.
Figures 9A, 9B, 9C:
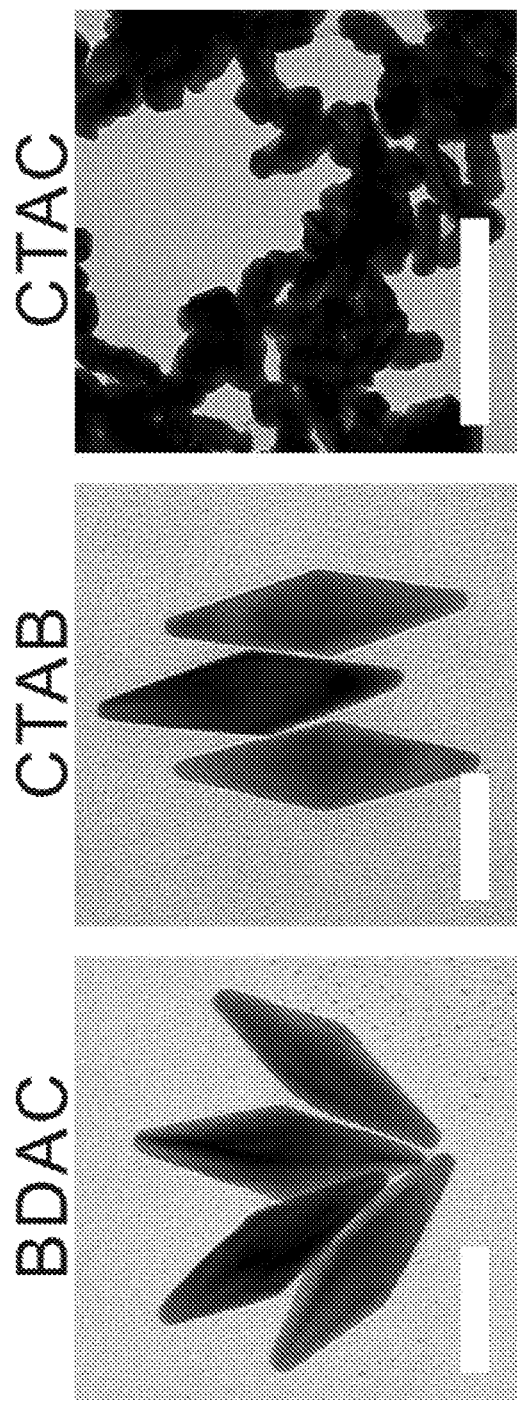
FIG. 9A. TEM image of structures regrown using a growth solution of 4 mM $HAuCl_4$, 4 mM $AgNO_3$, 1 N HCl, and 40 mM ascorbic acid in the presence of 0.9 mL of 0.1 M unitary surfactant BDAC.
FIG. 9B. TEM image of structures regrown using a growth solution of 4 mM $HAuCl_4$, 4 mM $AgNO_3$, 1 N HCl, and 40 mM ascorbic acid in the presence of 0.9 mL of 0.1 M unitary surfactant CTAB.
FIG. 9C. TEM image of structures regrown using a growth solution of 4 mM $HAuCl_4$, 4 mM $AgNO_3$, 1 N HCl, and 40 mM ascorbic acid in the presence of 0.9 mL of 0.1 M unitary surfactant cetyltrimethyl ammonium chloride (CTAC). For the preparation of seeds for regrowth in BDAC or CTAC, 100 µL of the bipyramid seed was centrifuged at 8,000 g for 8 min and washed with 1 mM of BDAC or CTAC, repeated twice, then redispersed in 100 µL of 1 mM of BDAC or CTAC for further regrowth. The scale bar in the BDAC and CTAB images is 50 nm, and 200 nm for the CTAC image.

Upon obtaining pure, monodisperse gold bipyramids, a variety of other gold nanostructures with novel shapes or changes in size were synthesized from the bipyramids in a process similar to seed-mediated growth. Because the "seed" used in this case is monodisperse, the product obtained through these transformations is also monodisperse in both shape and size, with the polydispersities ranging from only 2-5%. By using the purified bipyramid as a seed, the limitations to size of both the synthesis and separation can be overcome, allowing an increase in particle size by over 100 nm with high purity. TEM images in FIG. 2D, UV-Vis spectra in FIG. 2E, traces 6-10 show the range of sizes of the re-grown bipyramids obtained by adding either a different amount of bipyramid seeds or adjusting the concentration of reactants in growth solution. (See Table 1, Parts 1 and 2 in FIG. 26A and FIG. 26B and Table 2 for synthetic conditions and detailed size measurements.) The full width at half maximum (FWHM) of the LSPR peak is between 58 and 153 nm and these values, which compare favorably to that of nanorods (~100-200 nm or 6.2-12.4 eV), also confirm the monodispersity of the bipyramids. It has also been observed that the aspect ratio can be altered slightly during the regrowth by either changing the pH or the amount of $AgNO_3$ in the growth solution (FIG. 8B). (See, Ye, X., Zheng, C., Chen, J., Gao, Y. & Murray, C. B. Using binary surfactant mixtures to simultaneously improve the dimensional tunability and monodispersity in the seeded growth of gold nanorods. *Nano Lett.* 13, 765-771 (2013) and Chen, H., Shao, L., Li, Q. & Wang, J. Gold nanorods and their plasmonic properties. *Chem. Soc. Rev.* 42, 2679-2724 (2013).)

Bipyramid Dumbbells.

In addition to enlarging the bipyramids, regrowth of bipyramids by changing the synthetic conditions introduces several new structures to be added to the toolbox of gold nanoparticles, but also offers powerful insights into the growth mechanism yet unrealized with nanostructures of simpler shape. Regrowth of gold nanospheres and gold nanorods is well studied, and the transformation of nanorods to dumbbells has revealed much about the intricacies of nanoparticle growth conditions. However, both the nanosphere and nanorod fail to offer the complex crystal facets and twinned shape that the bipyramid provides. The regrowth of bipyramids was first compared using different surfactants (CTAB, cetyltrimethylammonium chloride (CTAC) and BDAC), as well as their mixtures. For standard growth solution with individual surfactants, size augmentation was dominant over any structural changes. Size augmentation of bipyramids with CTAB provided the best shape uniformity and surface smoothness, compared to both BDAC and CTAC (FIG. 3A, panel 1 and FIGS. 9A, 9B, and 9C). These results can be explained by considering the different binding affinities of CTAB and BDAC that is $Br^->Cl^-$, and also the degree of underpotential deposition in the presence of $Ag^+$ ions onto the gold surface. (See, Liu, M. & Guyot-Sionnest, P. Mechanism of silver(i)-assisted growth of gold nanorods and bipyramids. *J. Phys. Chem. B* 109, 22192-22200 (2005); Nikoobakht, B. & El-Sayed, M. A. Preparation and growth mechanism of gold nanorods (nrs) using seed-mediated growth method. *Chem. Mater.* 15, 1957-1962 (2003); Langille, M. R., Personick, M. L., Zhang, J. & Mirkin, C. A. Defining rules for the shape evolution of gold nanoparticles. *J. Am. Chem. Soc.* 134, 14542-14554 (2012) and Lohse, S. E., Burrows, N. D., Scarabelli, L., Liz-Marzán, L. M. & Murphy, C. J. Anisotropic noble metal nanocrystal growth: The role of halides. *Chem. Mater.* 26, 34-43 (2013).) The regrowth with CTAC resulted in random shape growth and aggregation because centrifugation with CTAC to remove remaining CTAB reduces particle stability. According to reports of nanorod growth using cationic headgroup with bromide anion as a counter part, larger headgroups lead to nanorods of higher aspect ratio and slowed growth rate, implying a higher binding affinity and resulting in a more stable bilayer on the particle surface. (See, Kou, X. et al. Growth of gold bipyramids with improved yield and their curvature-directed oxidation. *Small* 3, 2103-2113 (2007); Nikoobakht, B. & El-Sayed, M. A. Preparation and growth mechanism of gold nanorods (nrs) using seed-mediated growth method. *Chem. Mater.* 15, 1957-1962 (2003); Kou, X. et al. Growth of gold nanorods and bipyramids using cteab surfactant. *J. Phys. Chem. B* 110, 16377-16383 (2006) and Kou, X. et al. One-step synthesis of large-aspect-ratio single-crystalline gold nanorods by using ctpab and ctbab surfactants. *Chem. Eur. J.* 13, 2929-2936 (2007).) The results from the present observations and literature suggest that the affinity of surfactants in the presence of $Ag^+$ ions could be extended to CTAB>BDAC>CTAC.

Figure 10C:
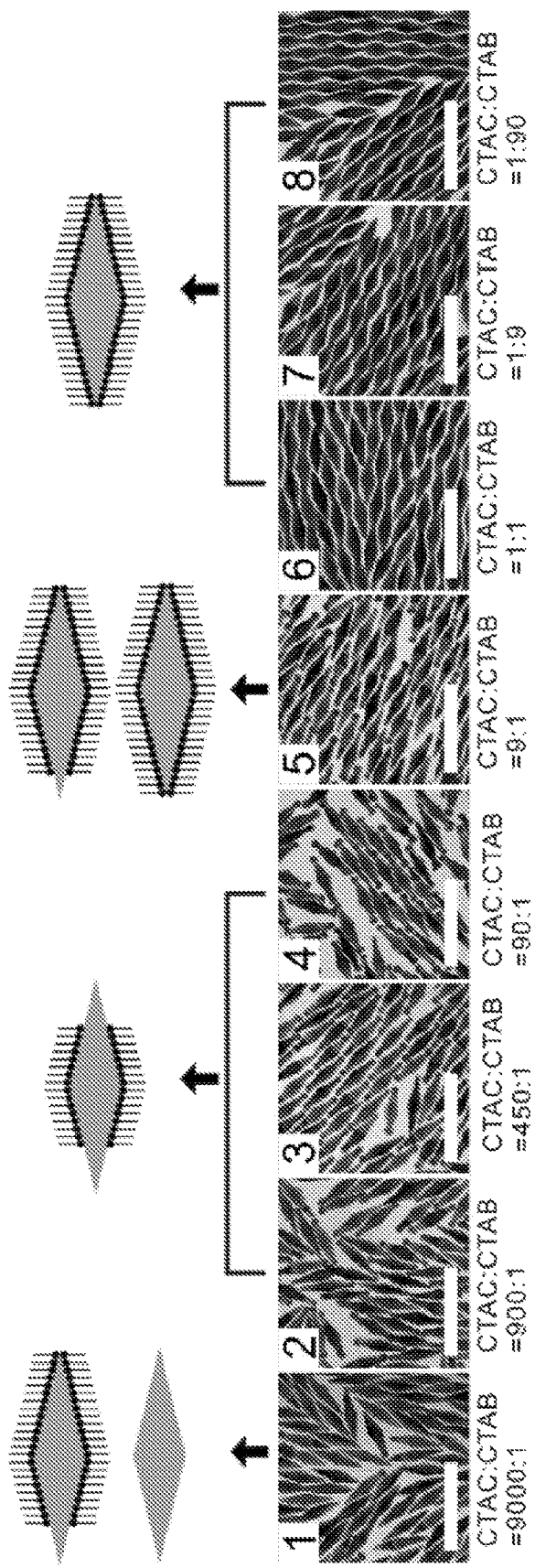
FIG. 10C. TEM images of the bipyramids regrown with a CTAC/CTAB binary condition and illustrative schematic proposing the binding of the surfactant to the bipyramid surface. The black surfactant represents the CTAB while the exposed area is representative of the surface area bound by CTAC, which is likely responsible for the specific growth at the tips due to its weaker binding.

Systematic studies were conducted with the three possible binary surfactant combinations, that is CTAB/CTAC, CTAB/BDAC and BDAC/CTAC (FIGS. 10C, 10B, and 10A, respectively). Despite changing the molar ratios, overgrowth at the tips was not observed and only somewhat observed for BDAC/CTAB or CTAC/BDAC, respectively. Intriguingly, the molar ratio of surfactants in binary systems showed a huge influence on the regrowth of bipyramids, especially at the tip region. Previously, mixed surfactants as capping agents have been used for adjusting the aspect ratio of gold nanorods, Ag-tipped overgrowth of gold nanorods and tetrahedral-like gold nanotripods. (See, Nikoobakht, B. & El-Sayed, M. A. Preparation and growth mechanism of gold nanorods (nrs) using seed-mediated growth method. *Chem. Mater.* 15, 1957-1962 (2003); Kou, X. et al. One-step synthesis of large-aspect-ratio single-crystalline gold nanorods by using ctpab and ctbab surfactants. *Chem. Eur. J.* 13, 2929-2936 (2007); Park, K. & Vaia, R. A. Synthesis of complex au/ag nanorods by controlled overgrowth. *Adv. Mater.* 20, 3882-3886 (2008) and Ali Umar, A. & Oyama, M. High-yield synthesis of tetrahedral-like gold nanotripods using an aqueous binary mixture of cetyltrimethylammonium bromide and hexamethylenetetramine. *Cryst. Growth Des.* 9, 1146-1152 (2008).) However, the role of each component for the growth is still ambiguous due to the complexity of interactions. As mentioned previously, the binding affinity of CTAB is greater than that of CTAC. However, as the ratio of CTAC:CTAB was increased to between 90:1 and 900:1, an equilibrium existed where CTAC occupied some of the surface area. Evidently, the CTAC was localized to the tip region where the binding preference of CTAB over CTAC was minimal. In this case, growth at the less protected ends capped by CTAC results in the observed tip overgrowth utilizing the shape-directing properties of the halide. When the ratio was either too high or too low or when pure CTAB was used, the tip growth was not observed as size augmentation became the dominant growth mode as the surface is covered uniformly in a single surfactant (FIG. 3A, panel 1 and FIGS. 10C and 10D).

Figure 11:
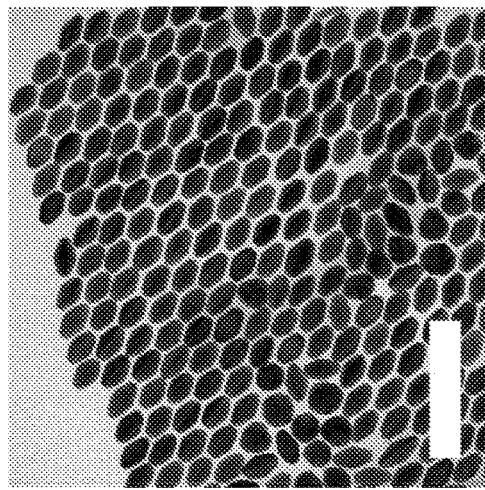
FIG. 11. TEM image of bipyramids oxidatively etched using $Au^{3+}$ remaining from the growth solution. The regrowth solution contained of 2 mM $HAuCl_4$ (50 µL), 2 mM $AgNO_3$ (10 µL), 1 N HCl (20 µL) and 10 mM ascorbic acid (8 µL) with 0.9 mL of 0.1 M CTAB. Note that the molar ratio of [ascorbic acid]/[$HAuCl_4$] in this case was 0.8 compared with 1.6 in the standard growth solution.

By carefully modifying the reaction conditions, the tip shape of dumbbell-like bipyramids could be controlled to further confirm the role of components in the growth solution. FIGS. 3B and 3C show TEM images and UV-Vis-NIR spectra of a variety of monodisperse regrown-structures from bipyramids with singular (FIG. 3B) or binary (FIG. 3C) surfactants. Dramatic changes at the bipyramid tips including spherical, rod- and bipyramid-like tips were observed with the binary surfactants. The standard growth solution of bipyramids in these experiments consisted of 91.9 μM of $HAuCl_4$, 18.4 μM of $AgNO_3$, 0.0184 N of HCl and 147 μM of L-ascorbic acid. The molar raio of [ascorbic acid]/[$HAuCl_4$] was 1.6 in FIGS. 3A-3C to ensure complete reduction of $Au^{3+}$ to $Au^0$. If less ascorbic acid is used, the remaining $Au^{3+}$ acts as an oxidant, and an etching process becomes dominant, resulting in shortened bipyramids (FIG. 11). The major factors for the shape changes in these reactions were HCl and $AgNO_3$. It is reported that the reduction rate of $Au^{3+}$ can be increased by increasing the pH of the solution which can cause fast deposition along the existing crystal face, leading to growth of the nanorod in all directions having shorter aspect ratio. (See, Kim, F., Sohn, K., Wu, J. & Huang, J. Chemical synthesis of gold nanowires in acidic solutions. *J. Am. Chem. Soc.* 130, 14442-14443 (2008) and Sohn, K. et al. Construction of evolutionary tree for morphological engineering of nanoparticles. *ACS Nano* 3, 2191-2198 (2009).) The pH of the growth solution was 1.74 for the case of standard growth solution and 3.62 for the growth solution without HCl. Under both of these conditions, reduction of $Ag^+$ can be neglected due to the increased redox potential of ascorbic acid. A monolayer of silver can be deposited onto a particular surface of gold during the growth through underpotential deposition, thus stabilizing the surface and slowing the growth rate. The growth rate of all facets in the structure can be altered depending on the degree of surface coverage by underpotential deposition of silver ions, and therefore differing growth rates of particular facets will determine the final structure of the nanoparticle.

Figure 3A:
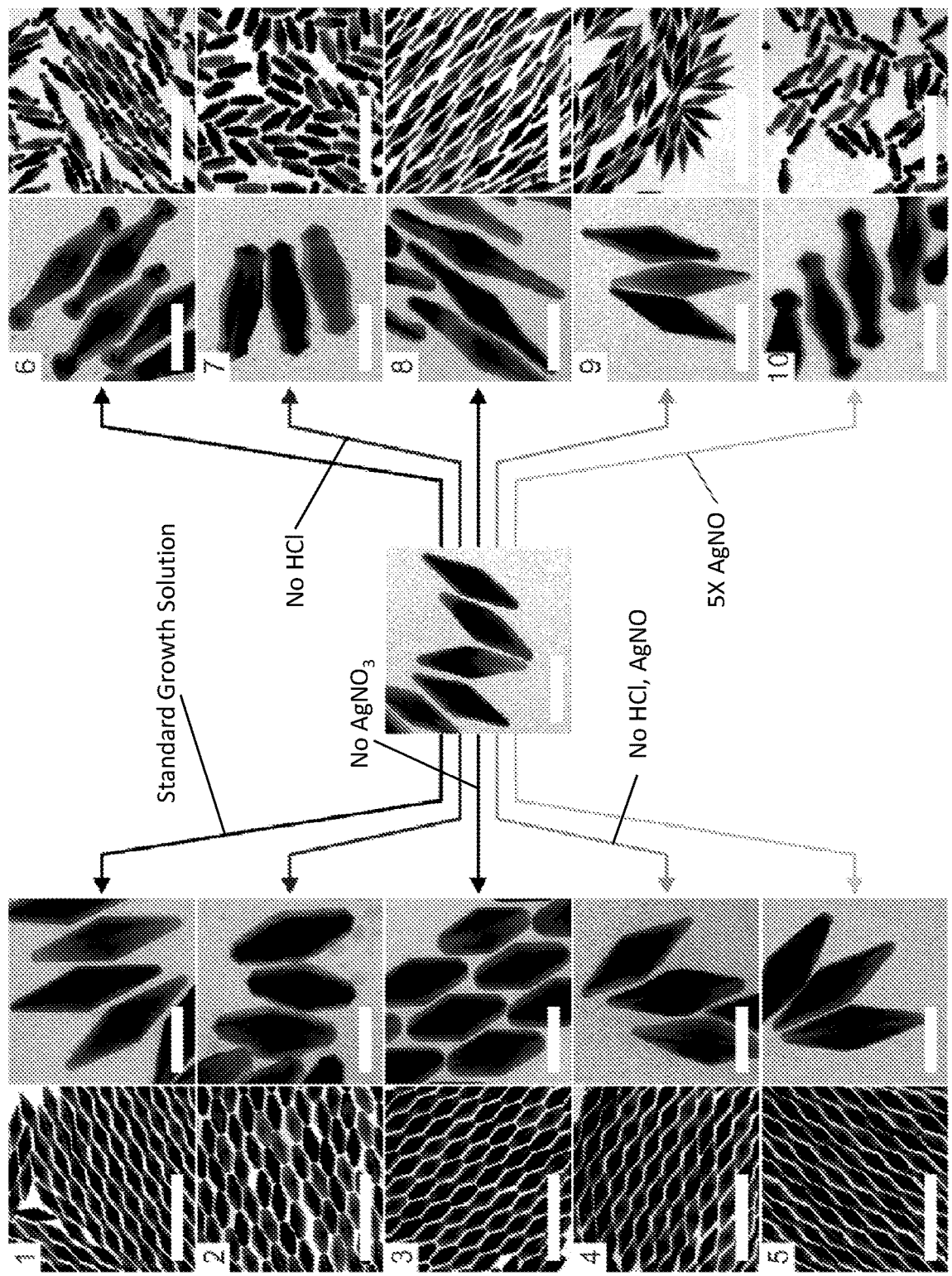
FIG. 3A. TEM images of the monodisperse, structures regrown from purified bipyramid seeds with singular (also referred to as unitary) surfactant (1-5; left panel) and binary surfactants (6-10; right panel). The shaded arrows indicate the specific conditions for regrowth. (See also Table 1 for detailed conditions). All scale bars are 200 nm and 50 nm for low and high magnification, respectively.
Figure 3C:
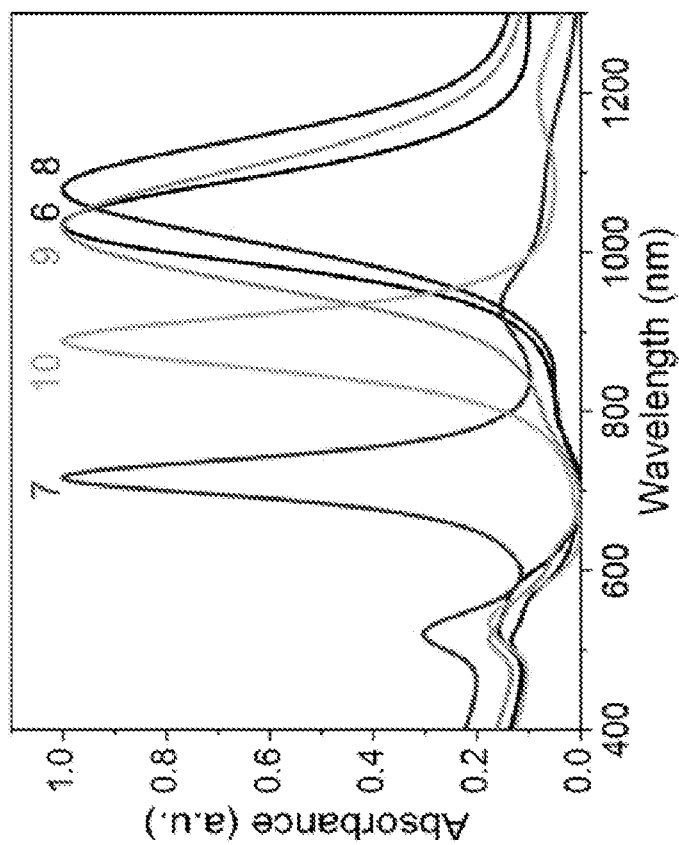
FIG. 3C. Normalized UV-Vis-NIR spectra of structures regrown with a binary surfactant (6-10 correspond to 6-10 in FIG. 3A), respectively. See Table 3 for detailed size measurements.
Figure 3B:
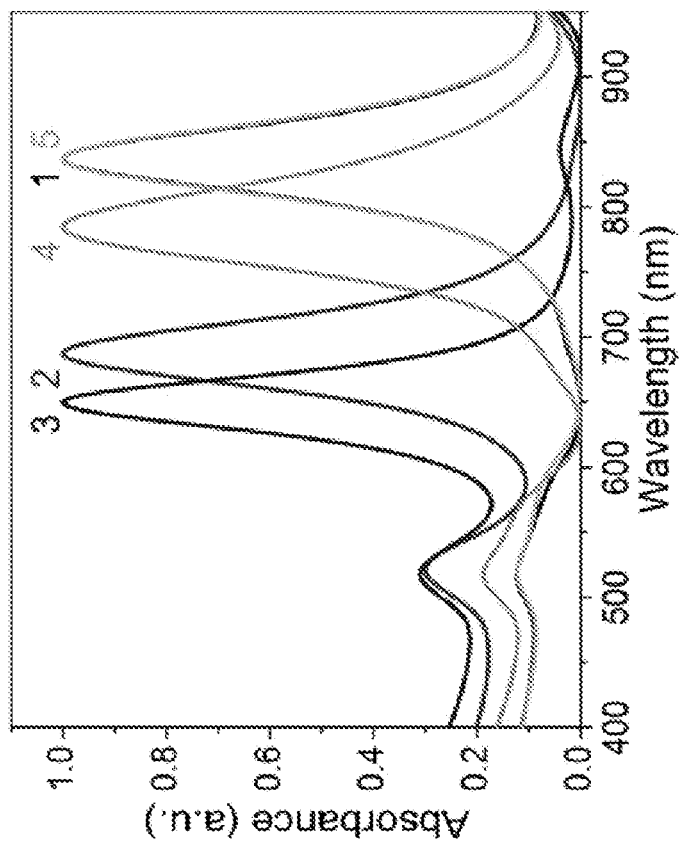
FIG. 3B. Normalized UV-Vis-NIR spectra of structures regrown with a singular surfactant (1-5 correspond to 1-5 in FIG. 3A).

The results in FIG. 3A, panel 2 and FIG. 3A, panel 7 show predominant growth along the short axis with sharp apices. As compared to growth in standard growth solution, a faster growth rate is expected in all directions for bipyramids without HCl at pH 3.62. However, the growth rate at the tip was greatly inhibited, because of the presence of $Ag^+$ ions which can more easily access the tip region, resulting in underpotential deposition. The high curvature of the tip region results in lower surfactant packing density than on the bipyramid faces, allowing additional room for $Ag^+$ to deposit in the intersurfactant regions. This resulted in a stepped facet formed along the long axis of the bipyramids, thereby sharpening the bipyramid tip for both. The growth for binary surfactants showed increased overgrowth at the tip than for the singular surfactant case because it has less coverage of CTAB layer accelerating the growth along the tip region. For binary surfactants, adding more or less $AgNO_3$ without HCl resulted in little enlogation and unrestricted growth of the width, especially at the tips, indicating that increased inhibition of growth along the long axis can greatly alter the shape of particle (FIG. 12A).

Likewise, in the experiments without $AgNO_3$ at pH 1.76, fast growth is expected due to the absence of $Ag^+$ ions, however, slower than the case without both HCl and $AgNO_3$ due to the effect of the pH on the reducing reduction power of ascorbic acid. The reaction proceeds with a rate that allows for controlled growth due to the low pH, but the absence of $Ag^+$ ions, normally yielding a stepped crystal facet at this pH for bipyramids, results in facilitated growth of a nanorod-like structure. Without $Ag^+$ ions to block certain growth facets, bipyramids grown in a singular CTAB surtfactant system were synthesized with low aspect ratio (~2.3) and poorly-defined tips; due to the even coverage of the singular surfactant and lack of $Ag^+$ underpotential deposition, growth occurred evenly in all directions (FIG. 3A, panel 3). Interestingly, rod-like tips were formed in the binary surfactant system (FIG. 3A, panel 8). Similar to the above case, it is believed that overgrowth at the tip region was induced from the reduced surface coverage of CTAB in the binary system. In the absence of $Ag^+$, the overgrowth was accelerated and bypassed the stepped structure to form the rod-like structures at the tips.

FIG. 3A, panel 4 and FIG. 3A, panel 9 show the regrowth of bipyramids without both HCl and $AgNO_3$. In this case, a much faster growth rate is expected than the former two cases, either without HCl or without $AgNO_3$. Due to a greatly faster deposition and the absence of $Ag^+$ inhibition, rapid addition of $Au^0$ atoms occurs on the stepped surface of bipyramids evenly in all directions. This results in particle maintaining its original bipyramid shape for both the singular and binary surfactant systems. The aspect ratio for binary surfactants was slightly higher than the singular surfactant case because of the lessened CTAB coverage as mentioned above, resulting in a small preference for growth at the tip and a slightly elongated particle.

Meanwhile, additional $AgNO_3$ (5× more than standard growth conditions) shows significant morphological changes at the tip region in binary surfactants, given less coverage of CTAB at the tip than the singular surfactant. Distinct crystalline structures identical to bipyramids were formed at the tips at both ends (FIG. 3A, panel 10). However, negligible changes were observed from singular CTAB surfactant. These results indicate that insufficient protection from CTAC surfactant can be more sensitive to inhibition of growth from underpotential deposition of $Ag^+$, allowing for easier access to the tip end, resulting in significant shape changes. The addition of more acid in this case results in negligible changes for both singular and binary surfactants (FIGS. 8A and 8B and FIG. 12B). The UV-Vis-NIR spectra in FIGS. 3B and 3C reflect the various structural changes of regrown bipyramids dependent on the growth conditions. Because most of regrown structures show changes in length, significant peak shift of longitudinal plasmon peaks with narrow widths were observed.

Figure 4G:
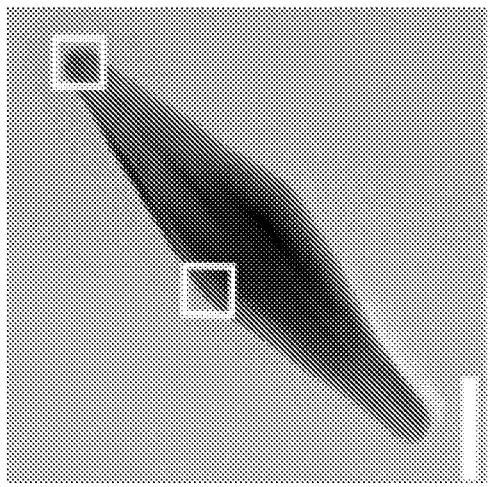
FIG. 4G. HR-TEM image of the regrown bipyramid of FIG. 3A, panel 9.
Figure 4I:
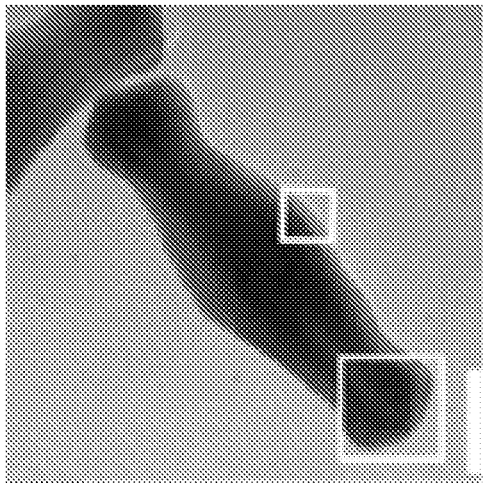
FIG. 4I. HR-TEM image of the regrown bipyramid of FIG. 3A, panel 10. Areas marked with white boxes at the tip and middle of particles show where lattice fringes were measured. All scale bars are 20 nm.
Figure 4F:
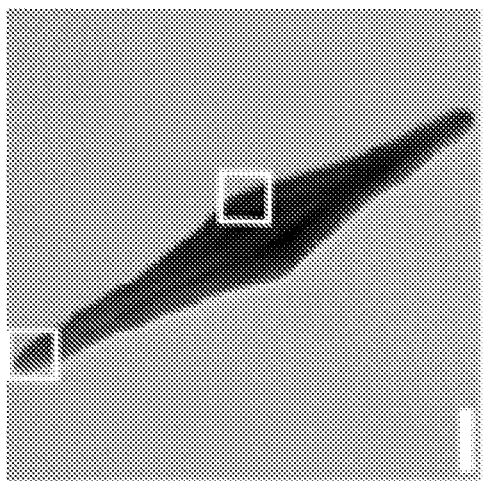
FIG. 4F. HR-TEM image of the regrown bipyramid of FIG. 3A, panel 8.
Figure 4H:
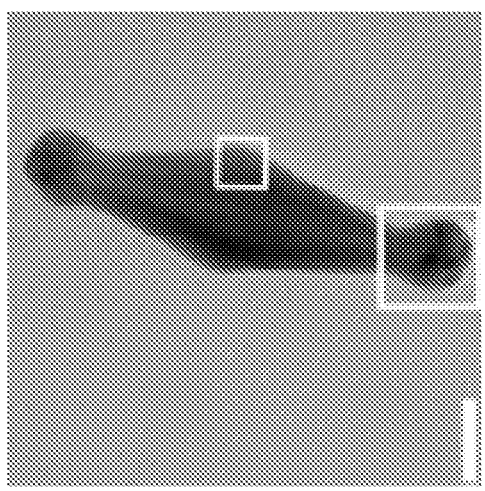
FIG. 4H. HR-TEM image of the regrown bipyramid of FIG. 3A, panel 6.
Figure 13:
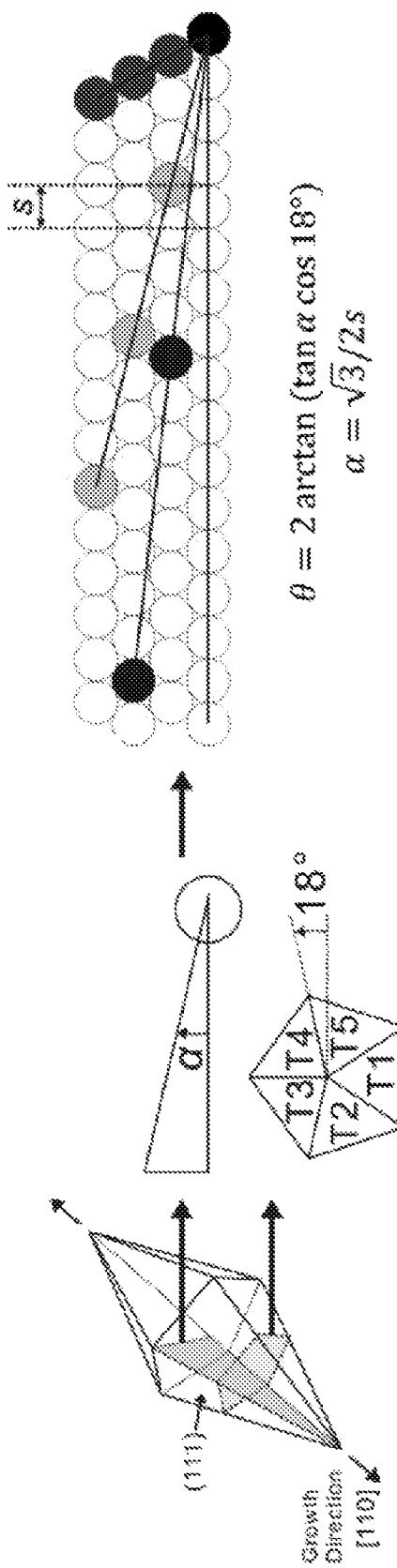
FIG. 13. Schematic illustration of cyclic penta-tetrahedral twinning of bipyramids. Each twinning plane is labeled from T1 to T5. The two gray areas show the cross-section of the bipyramid perpendicular to the growth direction and interplane between T4 and T5. The equation shows the relationship between the measured tip angle (0) of the structures in orientation 1 in FIG. 4A and average step length (s).

The crystalline structure of individual regrown bipyramids with singular and binary surfactants were determined by high-resolution TEM (HR-TEM) (FIGS. 4B-4I) and fast Fourier transform (FFT) patterns (not shown). FIG. 4B shows the HR-TEM image enlarged bipyramids resulting from the regrowth with a singular surfactant and standard growth solution. The FFT patterns showed clear lattice fringes at the tip and middle of the particles. It shows that both fringes are parallel to the growth axis and twinned along the long axis. The spacing between latice fringes was confirmed as 0.234 nm by direct measurment, corresponding to the (111) facets of the bipyramids. The FFT pattern showed a diffraction pattern of the bipyramid corresponding to orientation 1 in FIG. 4A. The indexed reflections in the FFT pattern correspond to the lattice parameters: $d_{111}=0.234$ nm, $d_{220}=0.143$ nm, $d_{222}=0.118$ nm, $d_{200}$ and $d_{020}=0.204$ nm, $d_{311}=0.122$ nm, $d_{400}=0.102$ nm, $d_{420}=0.091$ nm. Reflections indexed as $(1\bar{1}1)$, $(311)$ and $(220)$ were scattered from T3 and T4. Reflections indexed as $(\bar{2}00)$, $(020)$ and $(220)$ were from T1. The remaining reflections, which are not indexed, are induced by multiple scattering effect. All measured values were within an error range of ±2% compared to bulk data and agree well with reported results, indicating that regrown bipyramids are penta-twinned with face-centered cubic structure. All of the regrown bipyramids with either singular or binary surfactants were confirmed to have the same FFT pattern as a bipyramid in FIG. 4B. The tip angles (θ) of bipyramids in FIG. 4B were measured to be 27.02±1.35°, which correspond to (117) high-index facets having an average step length (s) of ~3.5 atoms (FIG. 13A). However, the identity of this high-index facet varies as the tip angles differ from that of bipyramids. If the tip angle is smaller than bipyramids in FIG. 4B, the average step length (s) can be >3.5, which can be indexed as {1l1}, where l>7. Likewise, when the tip angle is larger than that of bipyramids, the average step length (s) can be <3.5, which can be indexed as {1l1}, where l<7. Interestingly, HR-TEM images (FIG. 4H) and FFT of the dumbbell-like bipyramid show multiply-twinned spherical structures at both tips. Circular reflections in the FFT corresponding to FIG. 4H correspond to the lattice parameters: $d_{111}=0.229$ nm, $d_{220}=0.143$ nm and $d_{200}=0.203$ nm, respectively.

Oxidative Etching of Bipyramids.

Figure 5A:
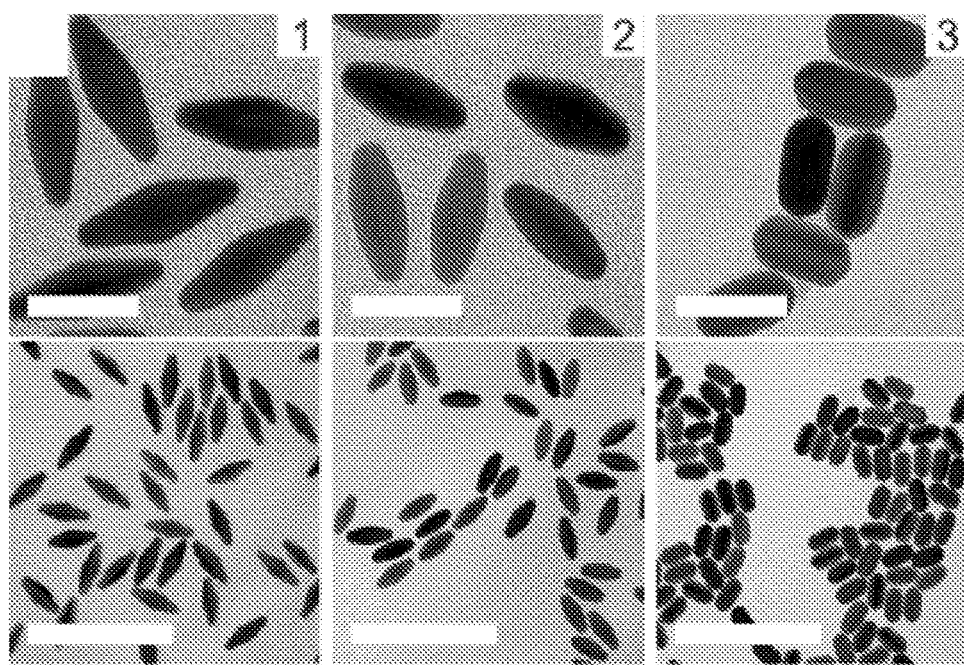
FIG. 5A. TEM images of the structures oxidatively etched with BDAC at 120° C., resulting from heating for 10, 30, and 90 min, shown in panels 1 to 3. The lower panels are lower magnification images. All scale bars are 50 nm and 200 nm for high and low magnification, respectively.
Figure 5B:
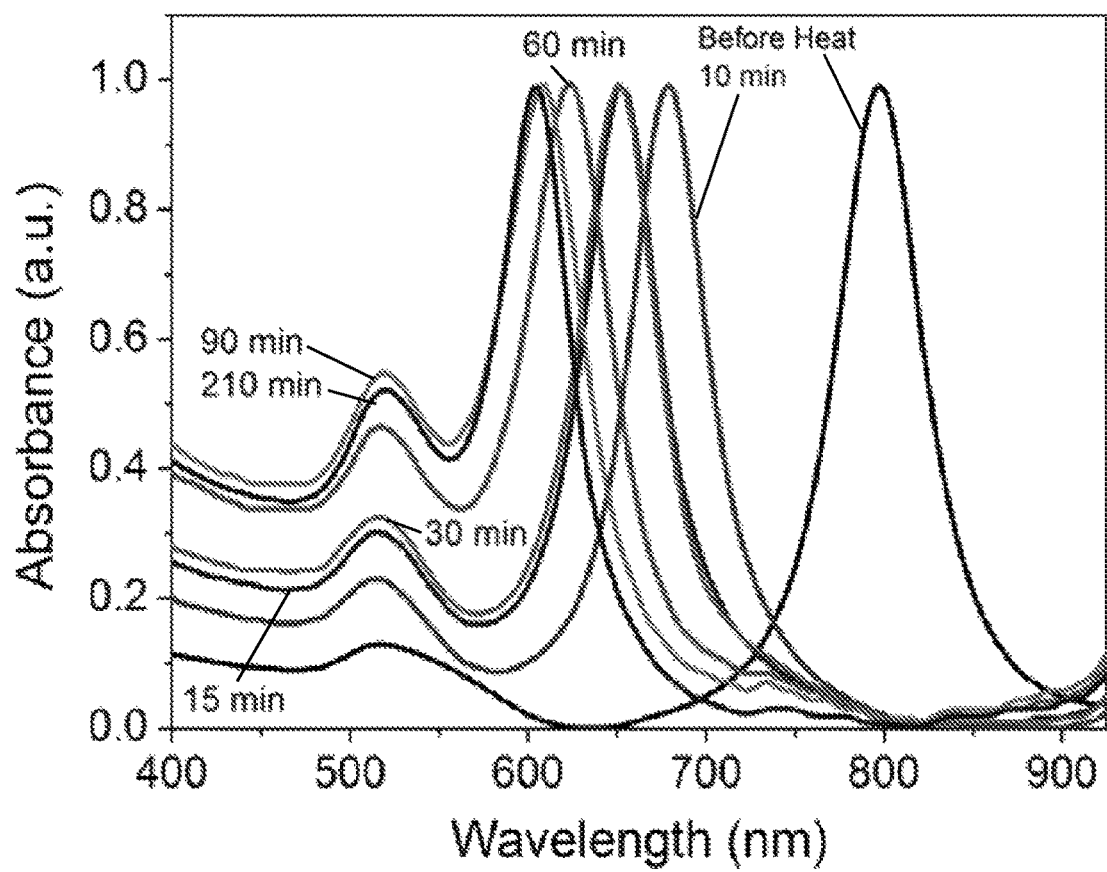
FIG. 5B. Normalized UV-Vis-NIR spectra of the etched structures resultant of increasing the heating time.
Figure 14A:
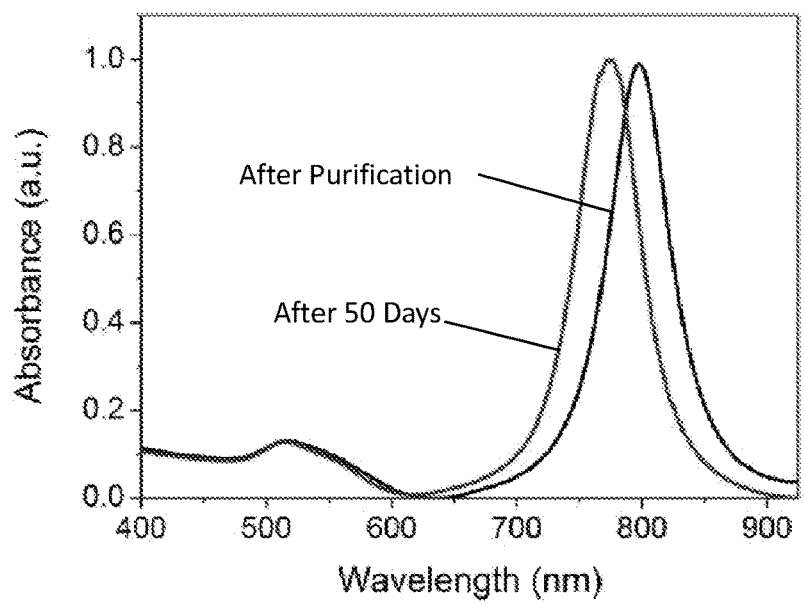
FIG. 14A. UV-Vis-NIR spectra of bipyramids immediately after purification and after 50 days stored at room temperature.
Figure 14B:
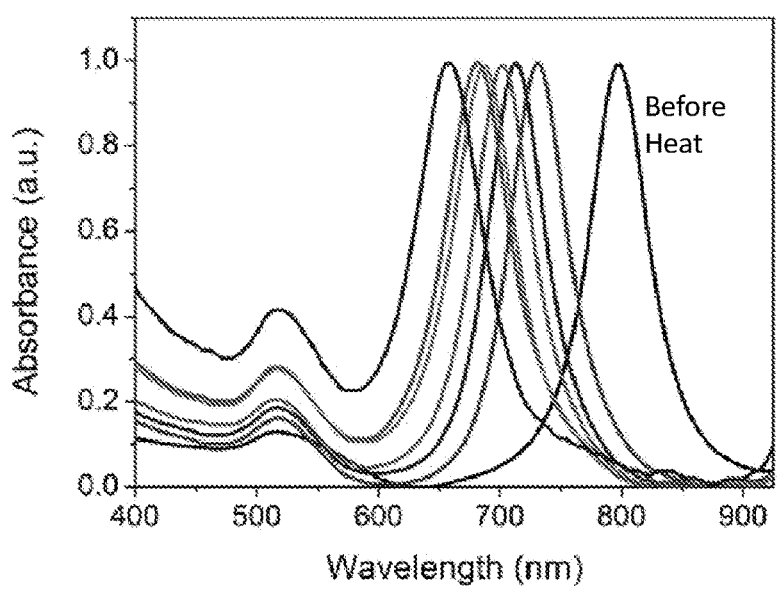
FIG. 14B. UV-Vis-NIR spectra from oxidatively etching the bipyramids in the presence of 100 mM CTAB at 120° C. After 10, 15, 30, 90, 300 and 900 min, the vials were cooled down with room temperature water to halt the oxidative process.
Figure 14C:
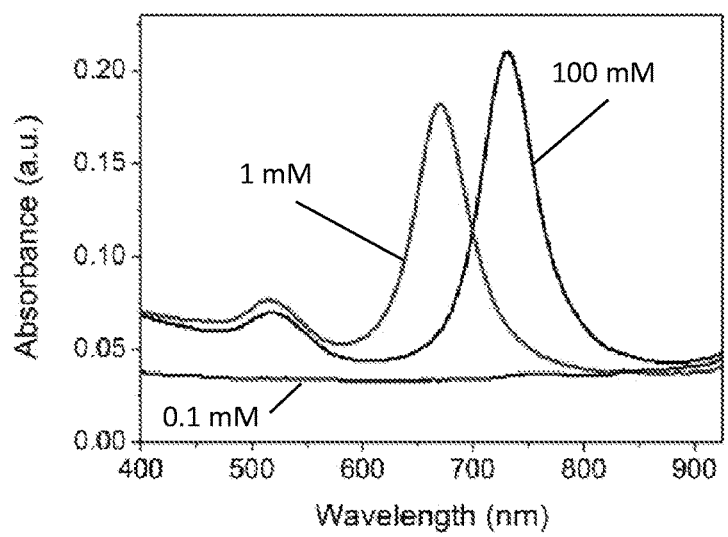
FIG. 14C. Spectra from heating for 10 minutes at 120° C. with 100 mM, 1 mM, 0.1 mM CTAB.

Gold bipyramids can also undergo oxidative etching utilizing molecular oxygen dissolved in solution. Cycling oxidations and reductions of gold atoms can slowly shape the nanoparticle through a time-dependent aging process. Additive oxidants such as hydrogen peroxide have been shown to accelerate the etching process and to reshape nanoparticles through atomic substraction and addition, but result in nanoparticles with poor shape and size dispersity. Taking advantage of the purity of the gold bipyramids and their inherent monodispersity, this etching process has been adapted to create other monodisperse structures. Because of the high-energy nature of the bipyramid facets and sharp tips, these highly reactive particles are susceptible to oxygen as an etchant despite it being a weak oxidant. As seen in FIG. 5A, bipyramids begin to etch at the tips and are continuously sculpted to rice-shaped and eventually rod-shaped as the reaction progresses at 120° C. and in the presence of 0.1 M BDAC. UV-Vis spectra in FIG. 5B show continuous changes that are consistent with the structural changes as seen in the TEM images. In the presence of BDAC as a protective agent and etchant, the purified gold bipyramids facilitate a four-electron oxidation of four $Au^0$ atoms to $Au^+$, forming the gold chloride salt and simultaneously reducing molecular oxygen to water. The high temperature of the system then allows for disproportionation at the surface of the nanoparticle, depositing $Au^0$ atoms back onto the surface in low-energy and low-defect areas. This process cycles, continuously removing atoms at defect areas and replacing them in defect-free areas, until the particle reaches an energy minimum, in this case a gold nanorod. At room temperature, a similar kinetic process still occurs, but resulting in a blue-shift of the LSPR peak of less than a couple nanometers every day (FIG. 14A). This indicates the thermodynamic nature of the reaction, and that the etching of the bipyramid to the nanorod could be further accelerated by increasing the temperature. When CTAB is used as a protective agent and etchant, the reaction slows, requiring nearly an order of magnitude longer to obtain the analogous structures to the ones in FIG. 5A, panel 2 (FIG. 14B, where the time intervals from left to right are: before heat; 10 min.; 15 min.; 30 min.; 90 min.; 300 min.; and 900 min.). It is noteworthy that the etching reaction rate can be increased by decreasing the concentration to the critical micelle concentration of the surfactant (1 mM) which results in lessened protection of the nanoparticles from the oxidative species (FIG. 14C).

Figure 6B:
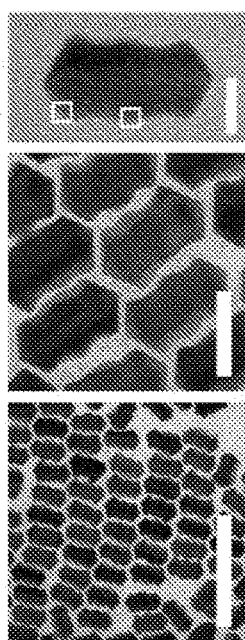
FIG. 6B. TEM (left column) and HR-TEM (middle column and right columns) images of monodisperse, nanorods regrown from the oxidatively etched nanorods of FIG. 5A, panel 3 using binary surfactants. The shaded arrows indicate the specific conditions for regrowth. (See also Table 1 for detailed conditions.) Areas marked with white boxes at the tip and middle of particles show where lattice fringes were measured.
Figure 6C:
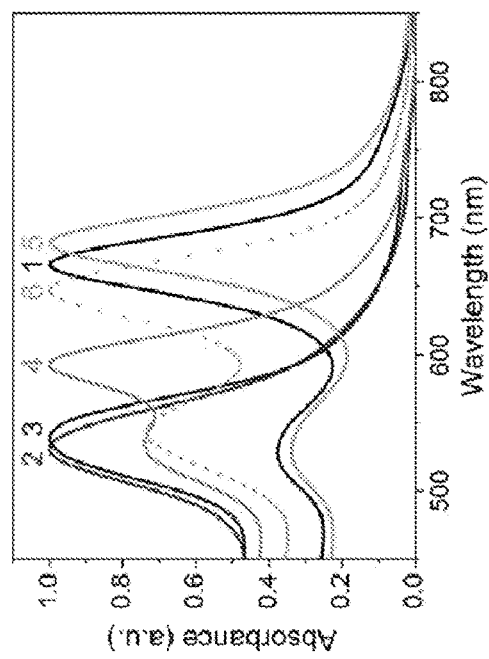
FIG. 6C. Normalized UV-Vis-NIR spectra of the structures regrown with a singular surfactant (1-5 correspond to 1-5 in FIG. 6A) and binary surfactants (6 correspond to 6 in FIG. 6B). See Table 3 for detailed size measurements. The scale bars from low to high magnification are 200 nm, 50 nm, and 20 nm and 1 nm.
Figure 6A:
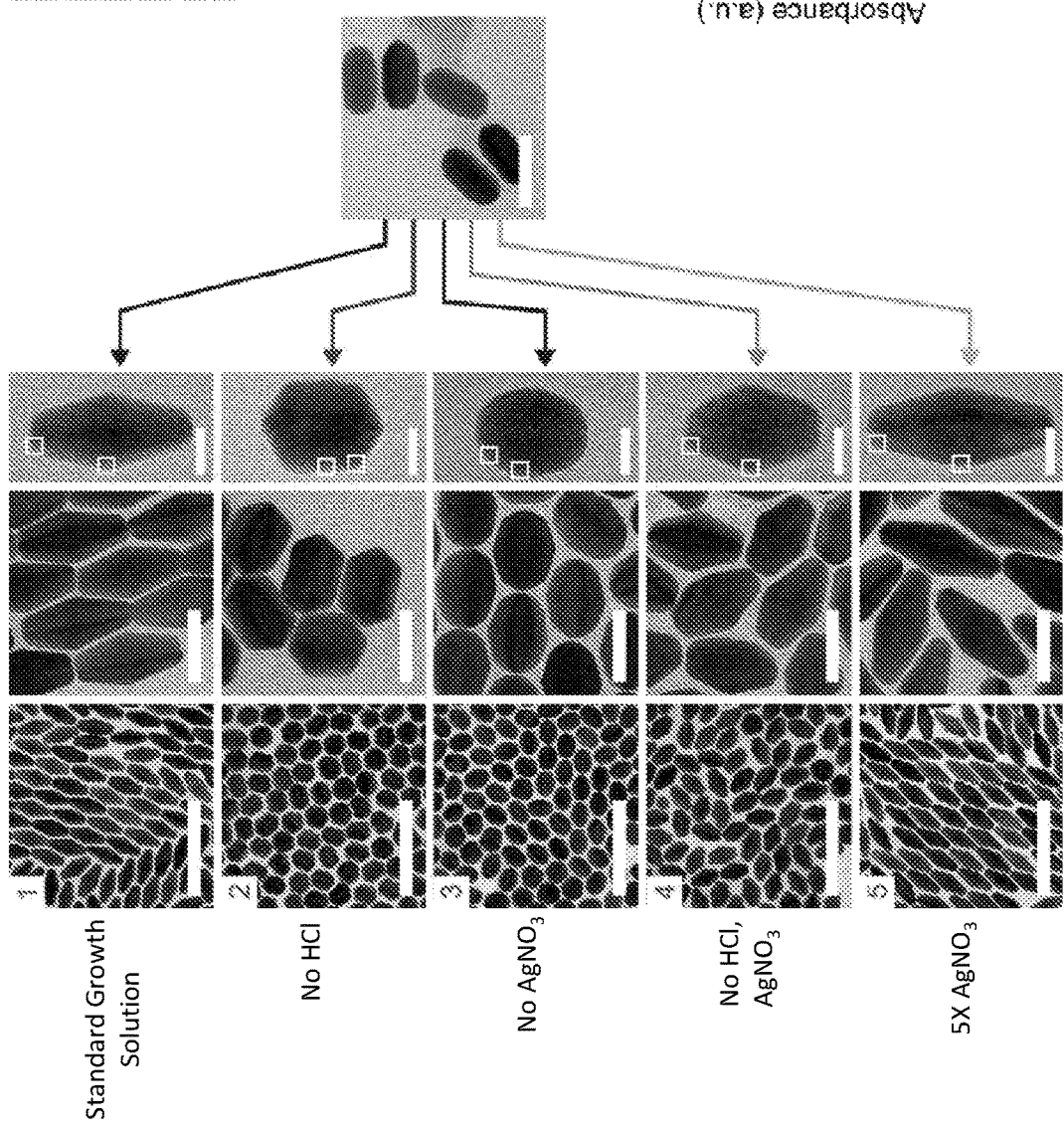
FIG. 6A. TEM (left column) and HR-TEM (middle and right columns) images of monodisperse, nanorods regrown from the oxidatively etched nanorods of FIG. 5A, panel 3 using a singular surfactant.
Figure 15A:
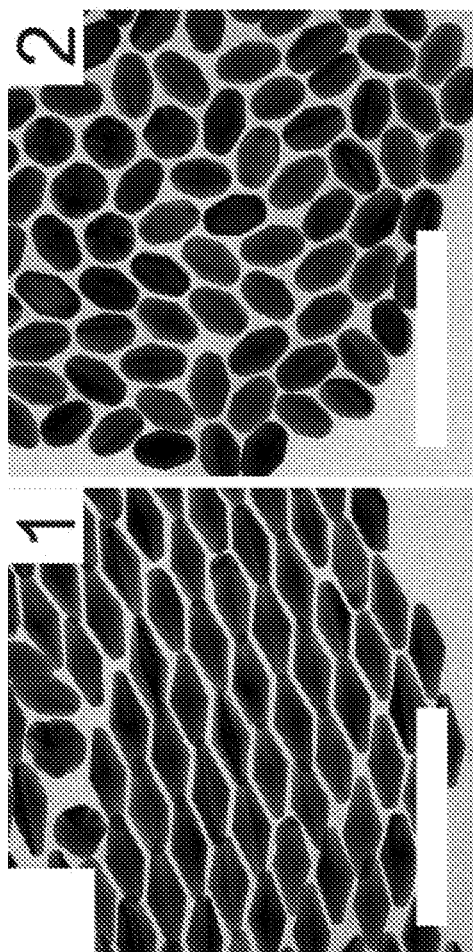
FIG. 15A. TEM images of structures regrown from the etched rice-shaped particles in FIG. 5A, panel 2 with a standard growth solution (panel 1) and a growth solution without AgNO$_3$ (panel 2) with CTAB singular surfactant (See also Table 1 for details).
Figure 15B:
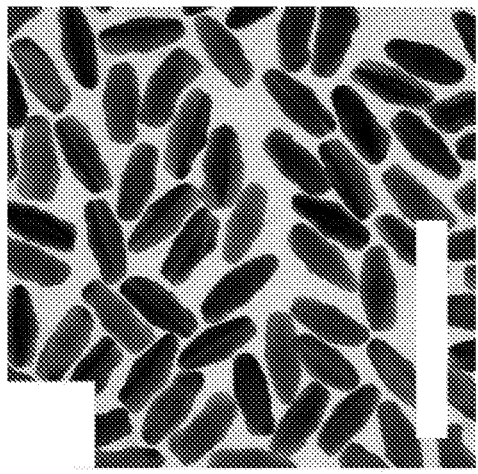
FIG. 15B. TEM image of regrown structure from etched rod-shaped particle as in FIG. 5A, panel 3 with standard growth solution with binary surfactants [CTAC]:[CTAB]=90:1. All scale bars are 200 nm.

To extend the regrowth strategy to other structures, regrown structures were synthesized using the monodisperse etched structures as seeds with both singular and binary surfactants. FIGS. 6A-6C show TEM images and UV-Vis spectra of regrown structures using the rod shape particles from etching as seeds. The growth behaviors from etched particles using unitary and binary surfactants were confirmed to be very similar, likely to due to the absence of the sharp tips that affect the tip of gold bipyramids. Interestingly, the rice shape particles from the etching can be reversed to the original structure of bipyramids when the standard growth solution is used for the regrowth (FIGS. 15A and 15B). On the other hand, the regrowth of rod shape particles with standard growth solution cannot be fully reversed to the bipyramids, instead forming a bifrustum, ultimately lacking the sharp tips of a bipyramid (FIG. 6A, panel 1). Applying the same growth conditions as bipyramids, new types of nanostructures from bifrustum to short dumbbell were synthesized using the etched particles, with plasmonic resonances covering the short wavelength region between 500 nm and 800 nm. All of the regrown structures from the etched rod-shaped particles using singular or binary surfactants were also confirmed to have similar FFT patterns as the bipyramids in FIG. 4B.

DISCUSSION

The regrowth strategy has successfully synthesized various, novel gold nanoparticle geometries based on the bipyramid shape. The purity and monodispersity of the bipyramid results in a likewise pure and uniform product ranging from augmented bipyramids, dumbbells with spherical, pointed, and rod-like tips, bifrustums, and spherical polyhedra. Regrowth of bipyramids in a single surfactant can be controllably tuned to give a length of well over 200 nm and a longitudinal plasmonic resonance peak well into the NIR range, as well as allowing for control of the aspect ratio. Regrowth with binary surfactant systems offer insight into the localization of particular surfactants on the particle surface. When combined with varying concentrations of acid and silver offer the opportunity to yield unique geometries. In addition, the high-energy nature of the bipyramid structure allows for controllable oxidative etching using only molecular oxygen as the etchant to create highly monodisperse nanorice and nanorod structures, which have additionally been regrown using the same procedure. Finally, the various growth conditions starting from the highly monodisperse but twinned structure of the bipyramids allow for the creation of noble metal nanoparticles of a wide range of size and shape with unprecedented narrow distribution.

Methods

Materials and Instruments.

All chemicals were purchased from commercial suppliers and used without further purification. Cetyltrimethylammonium bromide (CTAB, Bioxtra, ≥99.0%), benzyldimethyl-hexadecylammonium chloride (BDAC, cationic detergent), cetyltrimethylammonium chloride, Citric acid trisodium salt dihydrate (≥99.5%, BioUltra, for molecular biology) (CTAC, ≥98.0%), Hydrogen tetrachloroaurate trihydrate ($HAuCl_4 \cdot 3H_2O$), L-ascorbic Acid (Bioxtra, ≥98.0%) were purchased from Sigma Aldrich., silver nitrate ($AgNO_3$, >99.8%), sodium borohydride ($NaBH_4$, ≥99%) was purchased from Fluka. Hydrochloric acid (HCl, 1N) was purchased from Fisher scientific. Nano-pure water (18.2 MΩ, Barnstead Nanopure, Thermo Scientific, MA, USA) was used in all experiments. The glass vials were purchased from Kimble chase (4 and 20 mL, NJ, USA). All glassware was cleaned using freshly prepared aqua regia ($HCl:HNO_3$ in a 3:1 ratio by volume) followed by rinsing with copious amounts of water. RCT Basic (IKA, NC, US) was used for magnetic stirring. UV-Vis-NIR spectra were measured with Synergy H4 (Biotek, VT, USA) and Cary 5000 UV-Vis-NIR (Agilent, CA, USA). The formvar/carbon-coated copper grid (Ted Pella, Inc. Redding, Calif., USA) and TEM (Tecnai G2 F30 Super Twin microscope, 300 kV and Tecnai G2 Spirit, 200 kV, FEI, OR, USA) were used for the TEM analysis.

Synthesis and Purification of Gold Bipyramid.

Figure 7C:
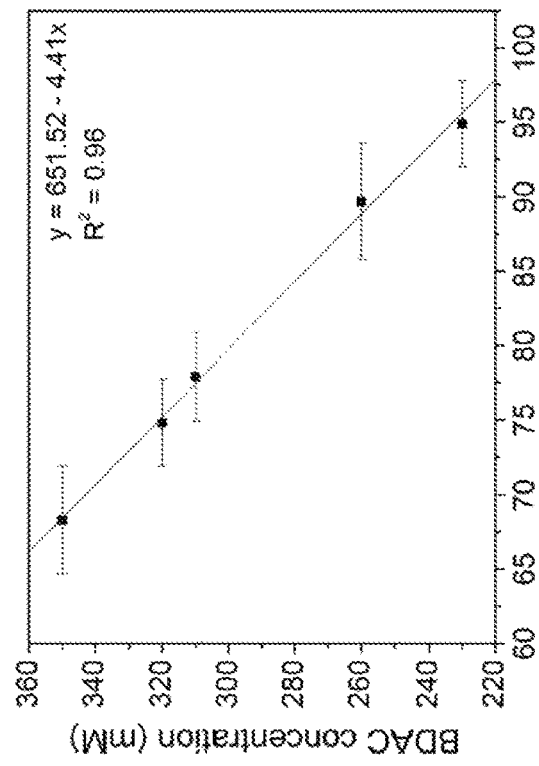
FIG. 7C. BDAC concentrations for purification as a function of the length of the bipyramid.
Figure 7B:
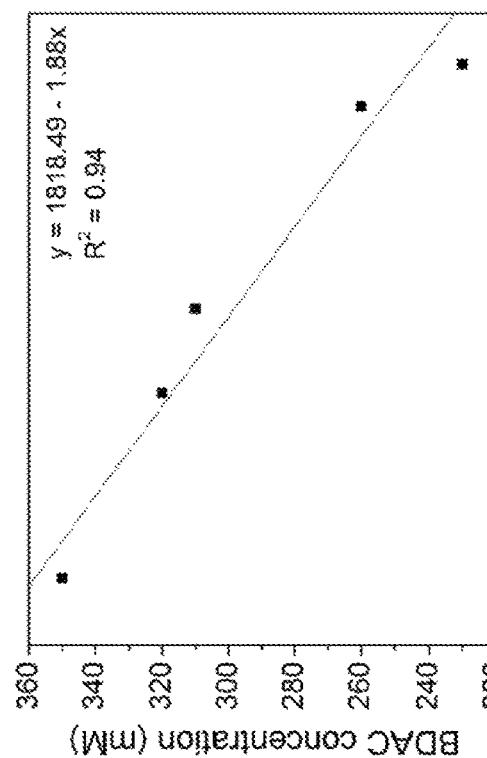
FIG. 7B. BDAC concentrations for purification as a function of LSPR.

The gold bipyramids were synthesized according to the literature procedure. (See, Liu, M. & Guyot-Sionnest, P. Mechanism of silver(i)-assisted growth of gold nanorods and bipyramids. *J. Phys. Chem. B* 109, 22192-22200 (2005).) Briefly, gold seeds were prepared with 18.95 ml of ultra-pure water, 0.25 ml of 10 mM $HAuCl_4$ and 0.5 ml of freshly prepared 10 mM sodium citrate, followed by adding 0.3 ml of fresh and ice-cold 10 mM $NaBH_4$ under 500 rpm with magnetic stirrer at room temperature. The reaction mixture was stirred for 2 h, and aged for a week before use (After aging, seed solutions were stable for a month and gave reproducible results for the synthesis of bipyramids). The bipyramids were grown in a solution containing 10 mL of 0.1 M CTAB, 0.5 mL of 0.01 M $HAuCl_4$, 0.1 mL of 0.01 M $AgNO_3$, 0.2 mL of 1 N HCl, 0.08 mL of 0.1 M ascorbic acid, and varying amounts of seed solution; shown were seed volumes of 110, 100, 95, 80 and 60 μL corresponding to panels 1-5 in FIG. 7A and Table 2. The solution was gently stirred at 400 rpm, and was kept in an oil bath at 30° C. for 2 h. The colloid was centrifuged at 13,000 g at 30° C. for 15 min, and washed with 10 mL of 1 mM CTAB, performed twice. After removing the supernatant, the precipitate was redispersed in 3 mL of 1 mM CTAB solution for further purification. Volumes of 0.5 M BDAC solution and ultra-pure water were added to the 3 mL of crude bipyramid solution to obtain 10 mL of solution with the desired BDAC concentration. The concentration of BDAC desired was dependent on the size of the gold bipyramids and was determined experimentally (FIGS. 7B and 7C). Concentrations of BDAC used were 230, 260, 310, 320, and 350 mM corresponding to the bipyramids prepared with 60, 70, 95, 100 and 110 μL of seed solutions, respectively. The solution was mixed and left undisturbed in an incubator at 30° C. for 11 h. The resulting pink supernatant was carefully removed, and 3 mL of 1 mM CTAB was added to the vial to redisperse the precipitate. The vial was then sonicated for 1 min. The resulting purified solution (brown in color) was centrifuged at 8,000 g for 8 min and washed with 1 mL of 1 mM CTAB, repeated twice, to remove the excess BDAC. Finally, the purified bipyramids were redispersed in 1.5 mL of 1 mM CTAB solution to be used for all regrowth reactions. The purified bipyramids in FIG. 2C prepared with 80 µL of seed solution were used as seeds for all regrowth reactions.

Controlling the Size of Bipyramids.

The size of gold bipyramids can be controlled using either a different concentration of growth solution or different amount of purified seed solution. For the typical preparation of regrowth solution, 0.9 mL of 0.1 M CTAB solution was kept for 5 min in an oil bath at 30° C. with magnetic stirring at 400 rpm. $HAuCl_4$, $AgNO_3$, HCl and ascorbic acid were then added sequentially as detailed in Table 1 and kept for 5 min. Finally, an amount of purified-bipyramid seed solutions (Table 1) was added and kept for 2 h. To maintain the reaction volume constant, the varied amount of purified-bipyramid seed solutions were adjusted to 0.1 mL with 1 mM CTAB. The resulting solution was centrifuged at 7,000 g for 8 min and washed with 1 mM CTAB, repeated twice, then redispersed in 1 mM CTAB for further characterization.

Controlling the Shape of Nanoparticles.

Various tips and unique shapes of structures can be controlled with single or binary surfactants along with modified growth solutions as detailed in Table 1. The procedure with a single surfactant is similar to the enlarging of the bipyramid, except the condition-adding chemicals. For the synthesis without HCl, $AgNO_3$ or both, the same volume of nanopure water was added to the regrowth solution in its stead. For excess amount of $AgNO_3$, a higher concentration of solution was used with the same volume as the standard regrowth solution. 100 µL of purified-bipyramid seed solution in 1 mM CTAB was added to the prepared regrowth solution and kept for 2 h. For the typical preparation of regrowth solution with binary surfactants, 0.1 M CTAC was kept for 5 minutes in an oil bath at 30° C. with magnetic stirring at 400 rpm. 100 µL of purified-bipyramid seed solution was centrifuged at 7,000 g and redispersed in 0.1 mL of desired concentration of CTAC solution to adjust the ratio between surfactants (CTAC and CTAB). The reactants with purified-bipyramid seed were added same as above and kept at 30° C. for 2 h to complete the reaction. The resulting solution was centrifuged at 7,000 g for 8 min and washed with 1 mM CTAB, repeated twice, then redispersed in 1 mM CTAB for further characterization.

Oxidative Etching of Bipyramids.

For oxidative etching, 100 µL of purified bipyramids in 1 mM CTAB was added to 900 µL of 100 mM BDAC solution with no other reagents. A glass vial with screw cap was sealed with Teflon tape to prevent the leakage of vapor during the heating. The sealed vial was placed in oil bath pre-heated at 120° C. and kept under stirring at 300 rpm with magnetic stirrer. (Use caution when heating the sealed container as pressure will build inside the flask. Properly sealing the vial is also crucial to controlling the reaction speed, as any leaks will accelerate the reaction.) After 10, 15, 30, 60, 90 and 210 min, the vials were cooled to room temperature with a water bath to halt the oxidative process. The resulting solution was centrifuged at 8,000 g for 8 min and washed with 1 mM CTAB, repeated twice, and then redispersed in 100 µL of 1 mM CTAB for further regrowth and characterization. See Table 1 for the detailed conditions for regrowth.

Supplementary Note 1.

Depletion flocculation as a concept was first proposed by Asakura and Oosawa in 1958, and applied as a purification technique for nanoparticles by Park in 2010. (See, Asakura, S. & Oosawa, F. Interaction between particles suspended in solutions of macromolecules. *J. Polym. Sci.* 33, 183-192 (1958) and Park, K., Koerner, H. & Vaia, R. A. Depletion-induced shape and size selection of gold nanoparticles. *Nano Lett.* 10, 1433-1439 (2010).) The first nanoparticle systems to be purified involved nanorods and nanospheres. Park introduced a model to predict when nanoparticles would begin to flocculate. The simplified equation, shown below in Equation 1, relates the effective micelle concentration and contact area of the nanoparticle to the potential, U. When $|U| \approx 4\text{-}5 k_B T$, the particles will begin to flocculate out of solution. (See, Leal-Calderon, F. et al. Aggregation phenomena in water-in-oil emulsions. *Langmuir* 12, 872-874 (1996).)

$$|U| = \frac{(2r_m)A(c - cmc)}{n} N_0 k_B T \quad (Eq.\ 1)$$

In Equation 1 above, $r_m$ is the radius of the surfactant micelle, A is the possible contact area of the nanoparticle, c is the surfactant concentration, cmc is the surfactant's critical micelle concentration, n is the aggregation number of the surfacant micelle, $N_0$ is Avogadro's number, $k_B$ is the Boltzmann constant, and T is the temperature. For the purpose of calculating the contact area of the bipyramid, the shape was assumed to be a pentagonal bipyramid with 10 equivalent triangular faces. The constants for the surfactant micelles were all obtained from literature sources.

The reason BDAC was chosen for the depletion flocculation was its higher effective micelle concentration than CTAB. For BDAC, rm=2.4 nm, cmc=0.0005 M, n=62 and for CTAB, rm=3.0 nm, cmc=0.001 M, n=162. This results in an effective micelle concentration roughly 2.6 times larger, and a potential to flocculate roughly 2.09 times higher (due to the smaller micelle size). The high micelle concentration is necessary because bipyramids, having ten identical faces, actually have a relatively low contact area compared to nanorods of similar size, which essentially have five faces.

The range of purified bipyramids only extends from 68 nm to 95 nm while the range of bipyramids available through the seed-mediated growth extends to sizes both shorter and longer than that. Shorter bipyramids are difficult to purify because the corresponding BDAC concentration necessary to purify is around 400 mM or more. At concentrations this high, the viscosity is too high to allow for the flocculation to occur in a reasonable time frame. For bipyramids synthesized larger than 95 nm, the psuedo-spherical impurities are also proportionally larger. As these impurities grow larger, they become less spherical and more faceted. These facets become large enough that they begin to co-flocculate with the bipyramids, effectively preventing any possible purification based on size selectivity.

TABLE 2

Figure 2E:
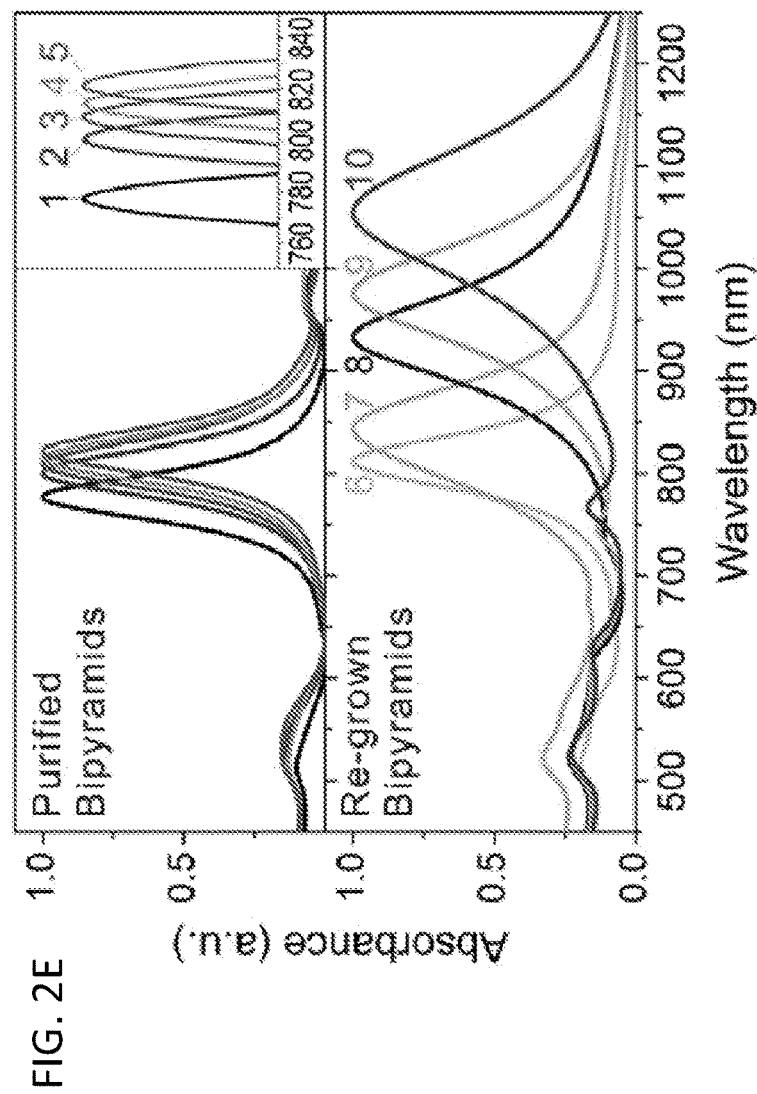
FIG. 2E. The normalized extinction spectra of purified (1-5; upper panel) and regrown bipyramids (6-10; lower panel). The inset shows an enlarged spectrum of the longitudinal surface plasmon resonance (LSPR) for the purified bipyramids. Full width at half maximum (FWHM) of LSPR peaks were measured as 58, 60, 63, 60, 59, 73, 113, 121, 126 and 154 nm or 21.4, 20.7, 19.7, 20.7, 21.0, 17.0, 11.0, 10.3, 9.8 and 8.1 eV for 1 to 10, respectively.

The table shows the summary of the lengths and widths, aspect ratios (AR), and longitudinal surface plasmon resonance (LSPR) peaks, corresponding to extinction spectra 1-10 in FIG. 2E.

| No. | Length (nm) | Width (nm) | AR | LSPR (nm) |
|---|---|---|---|---|
| 1 | 68.3 ± 3.6 | 22.8 ± 1.2 | 3.0 | 778 |
| 2 | 74.8 ± 2.9 | 22.7 ± 1.5 | 3.3 | 800 |
| 3 | 77.9 ± 3.0 | 24.5 ± 1.5 | 3.2 | 810 |

TABLE 2-continued

The table shows the summary of the lengths and widths, aspect ratios (AR), and longitudinal surface plasmon resonance (LSPR) peaks, corresponding to extinction spectra 1-10 in FIG. 2E.

| No. | Length (nm) | Width (nm) | AR | LSPR (nm) |
|---|---|---|---|---|
| 4 | 80.4 ± 2.8 | 23.6 ± 1.2 | 3.4 | 814 |
| 5 | 94.9 ± 2.9 | 30.8 ± 1.6 | 3.1 | 822 |
| 6 | 113.1 ± 3.9 | 34.7 ± 1.4 | 3.3 | 811 |
| 7 | 141.0 ± 4.8 | 47.9 ± 1.4 | 3.0 | 844 |
| 8 | 172.3 ± 4.3 | 51.8 ± 2.2 | 3.3 | 933 |
| 9 | 202.7 ± 3.2 | 56.7 ± 2.0 | 3.6 | 975 |
| 10 | 239.7 ± 5.0 | 64.5 ± 3.6 | 3.7 | 1054 |

TABLE 3

Dimensions of regrown structures, both bipyramids and oxidatively-etched nanorods, with singular and binary surfactants.

| FIG. No. | Length (nm) | STDEV* | PD* (%) | Width (nm) | STDEV* | PD* (%) | AR* | Tip Width (nm) | STDEV* | PD* (%) |
|---|---|---|---|---|---|---|---|---|---|---|
| 3A-1 | 99.5 | 2.6 | 2.6 | 30.2 | 0.9 | 3.0 | 3.3 | | | |
| 3A-2 | 86.4 | 2.5 | 2.9 | 35.9 | 1.1 | 3.0 | 2.4 | | | |
| 3A-3 | 74.5 | 2.6 | 3.6 | 32.5 | 0.8 | 2.6 | 2.3 | | | |
| 3A-4 | 99.8 | 4.4 | 4.4 | 34.7 | 1.1 | 3.1 | 2.9 | | | |
| 3A-5 | 107.6 | 3.3 | 3.1 | 33.4 | 1.3 | 3.8 | 3.2 | | | |
| 3A-6 | 115.5 | 5.9 | 5.1 | 30.0 | 1.5 | 5.1 | 3.8 | 17.3 | 2.6 | 15.2 |
| 3A-7 | 84.3 | 3.5 | 4.1 | 30.4 | 1.6 | 5.1 | 2.8 | 22.3 | 1.5 | 6.5 |
| 3A-8 | 137.7 | 7.6 | 5.5 | 28.5 | 1.1 | 4.0 | 4.8 | 11.9 | 0.9 | 7.6 |
| 3A-9 | 100.8 | 3.7 | 3.7 | 27.1 | 1.1 | 4.2 | 3.7 | | | |
| 3A-10 | 97.7 | 4.9 | 4.0 | 31.1 | 1.7 | 5.3 | 3.1 | 22.5 | 1.4 | 6.4 |
| 5A-2 | 58.3 | 3.2 | 3.8 | 23.4 | 1.2 | 5.2 | 2.5 | | | |
| 5A-3 | 46.3 | 2.1 | 3.6 | 22.8 | 1.0 | 4.3 | 2.0 | | | |
| 6A-1 | 76.2 | 2.5 | 3.4 | 33.9 | 1.1 | 3.2 | 2.2 | | | |
| 6A-2 | 52.3 | 2.4 | 3.2 | 39.4 | 1.9 | 4.8 | 1.3 | | | |
| 6A-3 | 52.5 | 1.9 | 3.0 | 39.3 | 1.0 | 2.5 | 1.3 | | | |
| 6A-4 | 60.5 | 3.3 | 2.8 | 38.7 | 1.6 | 4.2 | 1.6 | | | |
| 6A-5 | 82.3 | 2.7 | 2.5 | 33.9 | 0.9 | 2.6 | 2.4 | | | |
| 6B | 65.7 | 2.3 | 2.3 | 35.7 | 2.7 | 7.5 | 1.8 | 34.4 | 2.4 | 7.0 |

*STDEV = standard deviation, PD = polydispersity, AR = aspect ratio.

Example 2: IR Light-Induced PCR

This example illustrates the use of gold bipyramid nanocrystals in light-activated PCR.

Synthesis of Bipyramid-Silica Core-Shell Nanocrystals and Pegylation of Same.

Tetraethyl orthosilicate (TEOS, reagent grade, 98%) was purchased from Sigma Aldrich. Methoxy-poly(ethylene glycol)-silane (MW=5000) was purchased from Laysan Bio. All chemicals were purchased from commercial suppliers and used without further purification. Nanopure water (18.2 MΩ, Barnstead Nanopure, Thermo Scientific, MA, USA) was used in all experiments. RCT Basic and heating block (IKA, NC, US) was used for magnetic stirring and heating.

The bipyramids were grown in a solution containing 10 ml of 0.1 M CTAB, 0.5 ml of 0.01 M HAuCl$_4$, 0.1 ml of 0.01 M AgNO$_3$, 0.2 ml of 1 N HCl, 0.08 ml of 0.1 M ascorbic acid, and 30 μl of seed solution. The purified bipyramids were redispersed in 1.5 ml of 1 mM CTAB solution to be used for silica coating. For the synthesis of bipyramid-silica core-shell nanocrystals, 500 μL of bipyramid solution in 1 mM CTAB was mixed with 500 μL of deionized water in 5 ml vial. In this solution, 1.3 μl of 0.1 M NaOH was added to adjust pH between 10-10.4 and then 8 μl of TEOS (20% v/v in ethanol) was added at 30° C., while quickly stirring for 1 min. After adding TEOS, the solution was gently stirred overnight. The solution was centrifuged at 1,500 g for 15 min and washed with 1 mL of deionized water (repeated twice) and ethanol (repeated twice), then redispersed in 950 μl of ethanol.

Figure 21:
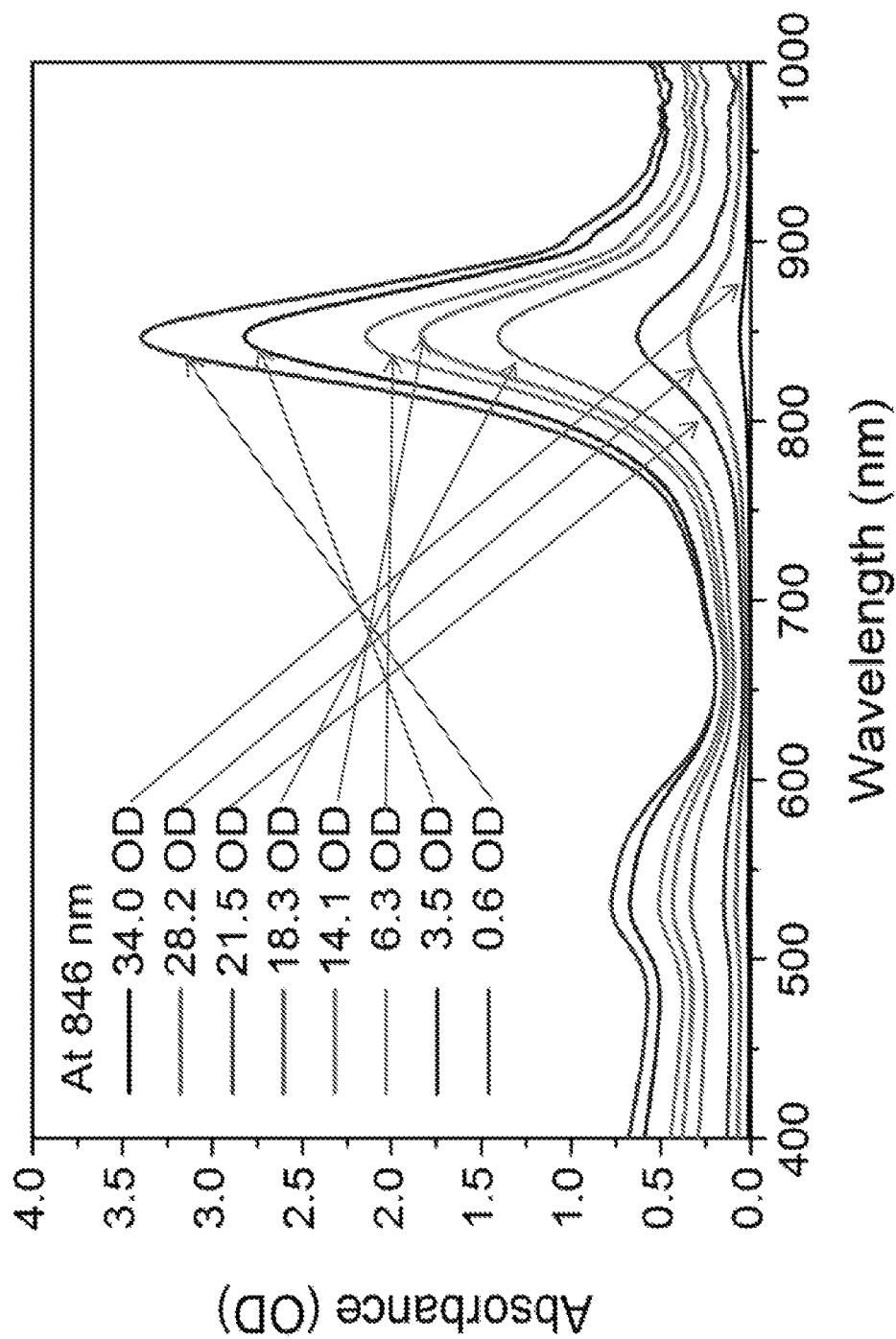
FIG. 21. UV-Vis spectra of pegylated bipyramid-silica core-shell nanoparticles measured with 10 times diluted samples.

For the pegylation, 50 μl of 10 mM methoxy-poly(ethylene glycol)-silane in ethanol was added and kept for 2 h with vortexing. Finally, the resulting solution was centrifuged at 1,500 g for 10 min and washed with 1 mL of ethanol (repeated twice) and deionized water (repeated twice) and then redispersed in deionized water. Sonication for a few seconda was needed between the washing steps. To determine the optical density of the nanocrystals, UV-Vis spectra were measured with UV-2401PC (Shimadzu, Kyoto, Japan) and absorption cuvettes (ultra-micro cell, volume=50 μl, light path=10 mm, Mullheim, Germany). The spectra are shown in FIG. 21.

Plasmonic Heating of Bipyramid-Silica Core-Shell Nanocrystals by LED.

An infrared LED (850 nm peak wavelength, mounted on metal core PCB, 700 mA forward current, 12.4 V forward voltage, LZ4-00R608, LED Engine, CA, USA) was used for plasmonic heating of the bipyramid-silica core-shell nanocrystals, controlled with a source meter (Keithley-2636 A, Tektronix, Inc., OR, USA). A 20.0 mm Focus Spot Top Lens Fiber Coupling (10356, Carclo Optics, PA, USA) was used to focus the light on the samples. A blue LED (5 mm, 480 nm peak wavelength, 3.2 V forward voltage, 20 mA forward current, 4.1 cd, C503B-BCN-CVOZ0461, CREE, Inc., NC, USA) and FITC Excitation Filter (center wavelength=475 nm, band width=35 nm, MF475-35, Thorlabs, Inc., NJ, USA) was used for an excitation of SYBR Green I, and a spectrometer (USB4000, Ocean Optics, Inc., FL, USA) was used for detection of the fluorescence signal for real-time PCR. The temperature was measured and recorded with a USB-type thermocouple measurement device (USB-TC01, National Instruments, TX, USA) and a type-k insulated thermocouple (5SC-TT-K-40-36, OMEGA Engineering, INC. CT, USA). Thermal cycling with the LED, source meter, fluorescence measurement, cooling fans and temperature measurement were controlled with the LabVIEW program.

Figure 19A:
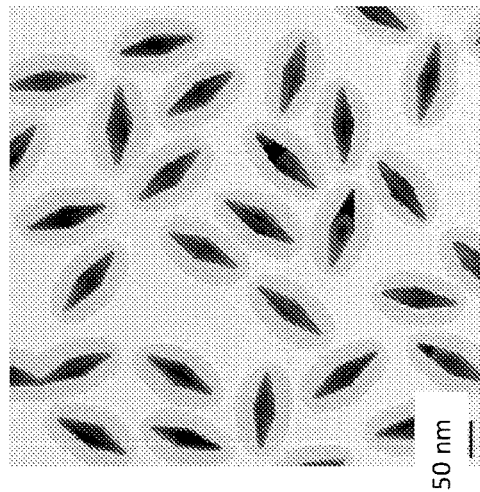
FIG. 19A. Absorption spectrum of silica coated gold bipyramid nanocrystals (AuBP-silica particles), showing a peak at ~875 nm.
Figure 19B:
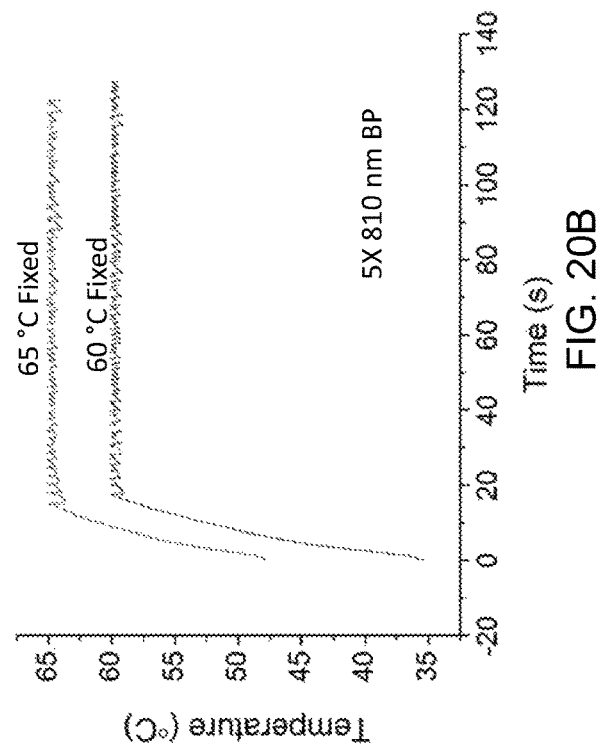
FIG. 19B. TEM image of the AuBP-silica particles. Scale bar=50 nm.
Figure 20A:
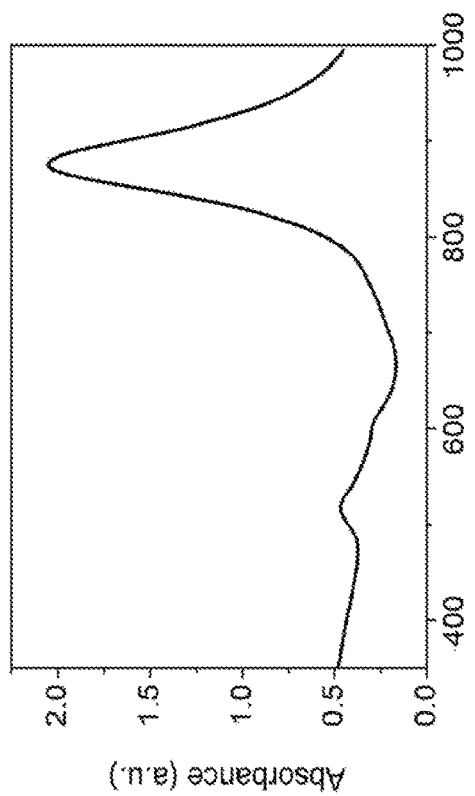
FIG. 20A. Absorption spectrum of AuBP-silica particles, showing a peak at ~780 nm.
Figure 20B:
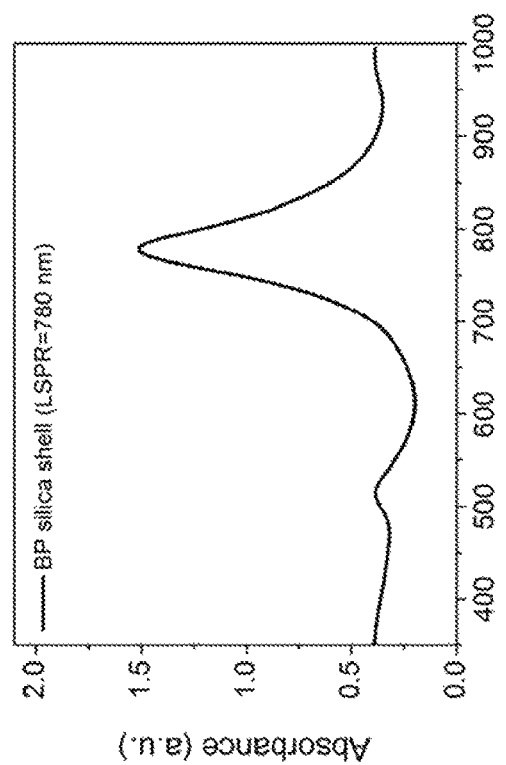
FIG. 20B. Graph of the temperature variation in reaction solutions irradiated with an 850 nm LED, 1 W on and 0 W off injection current.

It was observed that the anisotropic gold core-silica shell bipyramid nanocrystals had optical absorbance at different regions of the electromagnetic spectrum, with the transverse (short axis) and longitudinal (long axis) having peaks at around 520 nm and around 875 nm, respectively, (FIG. 19A) for the bipyramid nanocrystals shown in FIG. 19B. It was also observed that, by controlling the LED pulse length and frequency, different fixed temperature conditions can be achieved. For example, for the gold core-silica shell bipyramid nanocrystals having the absorbance spectra shown in FIG. 20A, solution temperatures of 60° C. and 65° C. were achieved, as shown in the graphs of FIG. 20B.

Figure 23A:
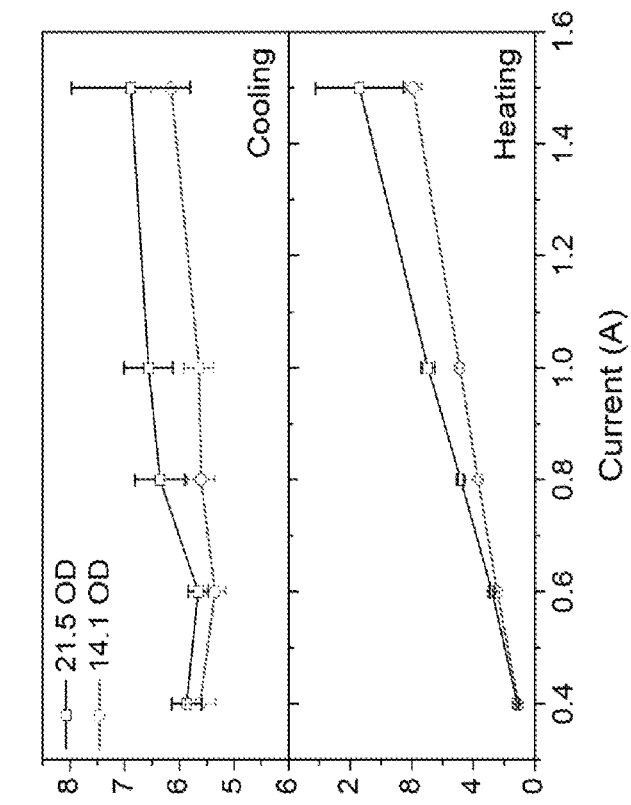
FIG. 23A. Graphs of the heating and cooling rates for solutions comprising pegylated bipyramid-silica core-shell nanocrystals with optical densities of 14.1 and 21.5.
Figure 22:
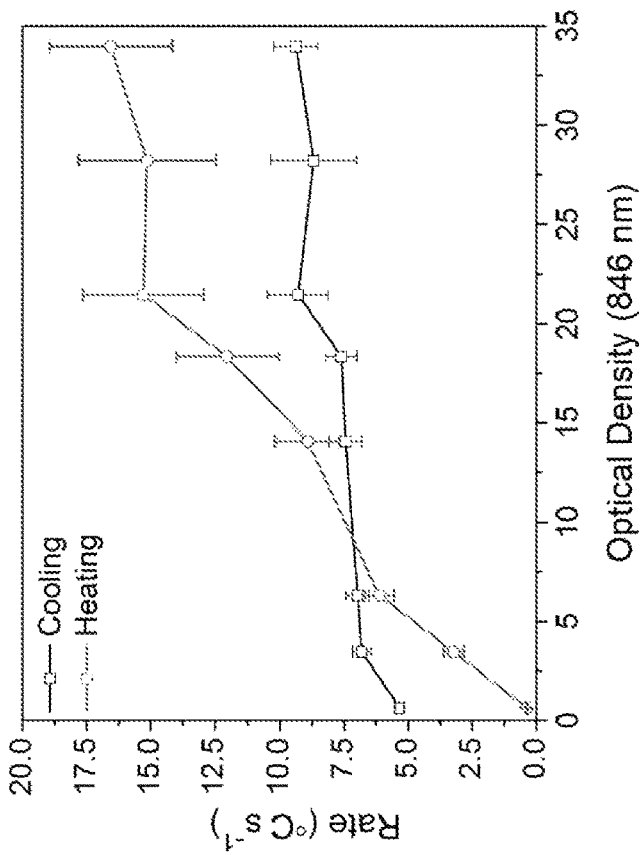
FIG. 22. Graph of the heating and cooling rate for a solution comprising pegylated bipyramid-silica core-shell nanocrystals with a maximum peak wavelength of 846 nm in deionized water.
Figure 23C:
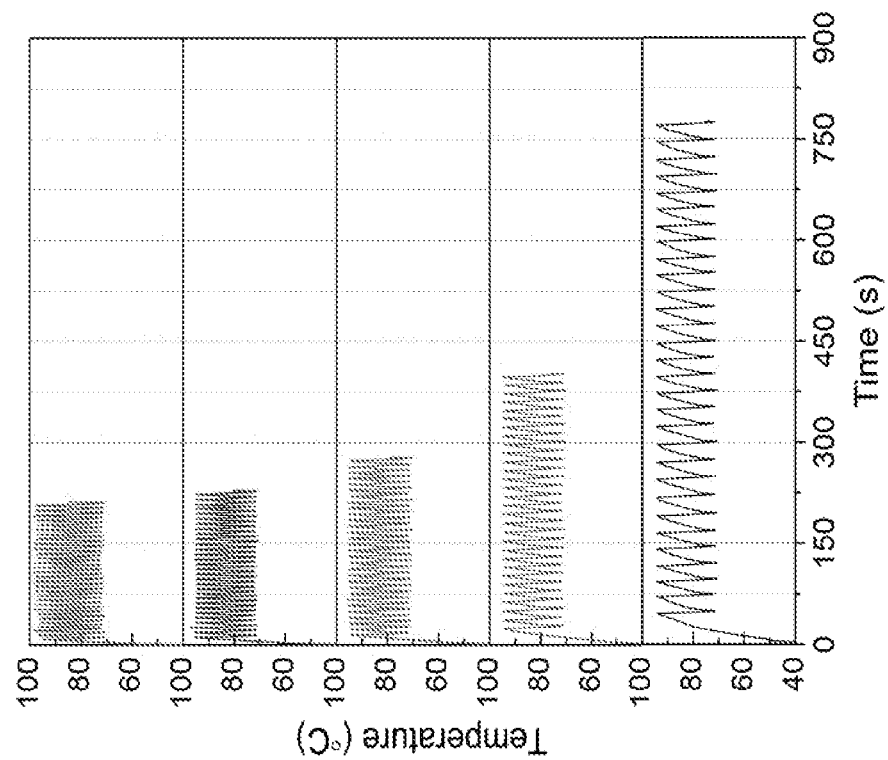
FIG. 23C. Thermocycle for the 14.1 OD sample comprising pegylated bipyramid-silica core-shell nanocrystals for currents from 0.4 A (bottom panel) up to 1.5 A (top panel).
Figure 23B:
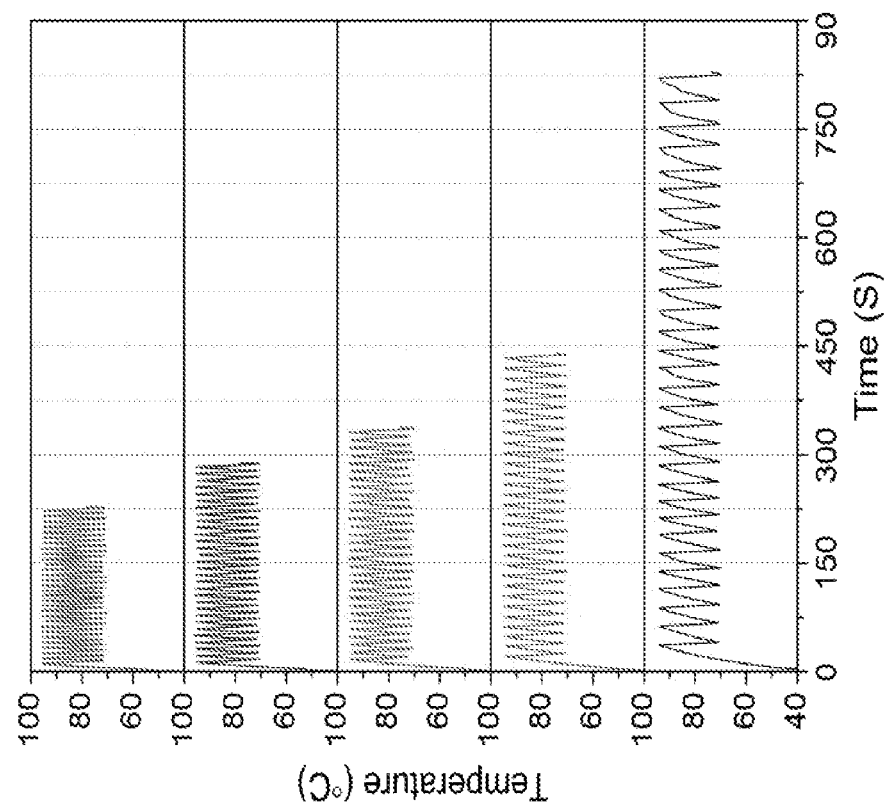
FIG. 23B. Thermocycles for the 14.1 OD sample comprising pegylated bipyramid-silica core-shell nanocrystals for currents from 0.4 A (bottom panel) up to 1.5 A (top panel).
Figure 23D:
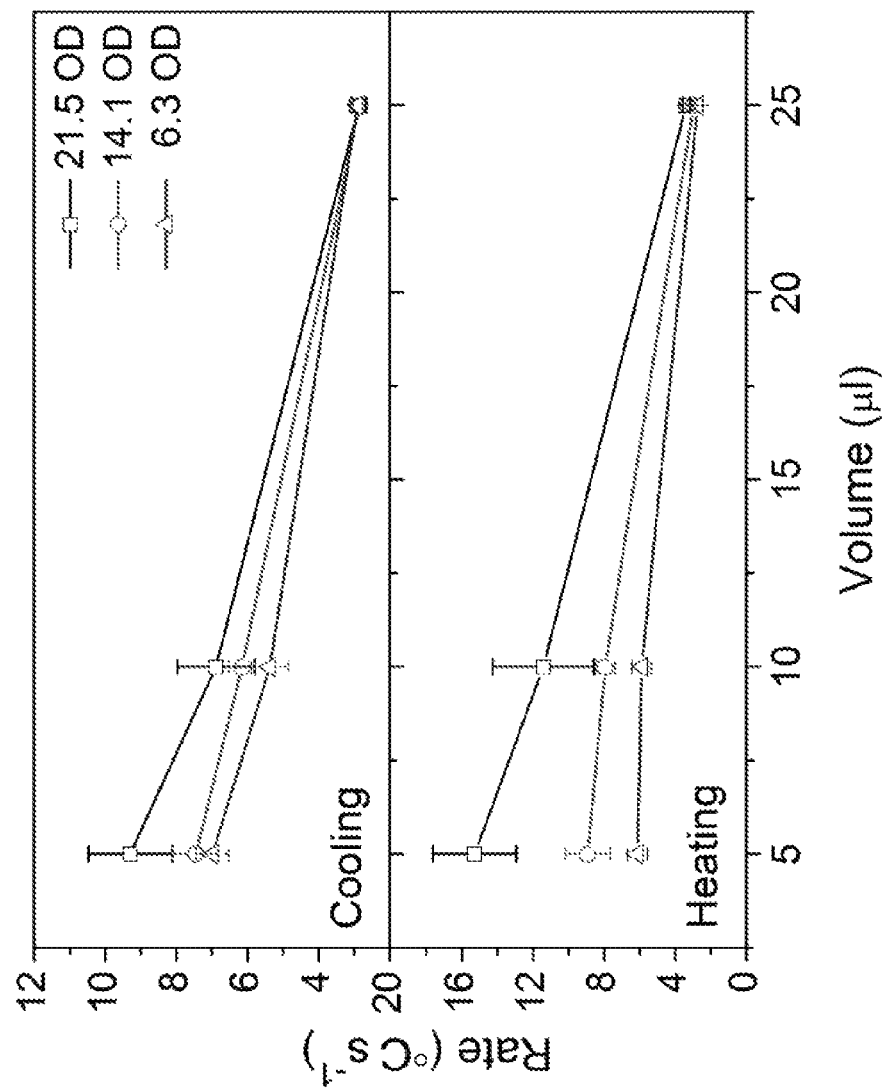
FIG. 23D. Graphs of the heating and cooling rates for samples comprising pegylated bipyramid-silica core-shell nanocrystals and having optical densities of 6.3, 14.1 and 21.5, with 5, 10 and 25 µl (12, 15 and 30 µl liquid wax, respectively).

To determine the heating and cooling rate, pegylated bipyramid-silica core-shell nanocrystals with a maximum peak wavelength of 846 nm in deionized water were used and 30 thermocycles were performed between 72° C. and 95° C. 5 µl of nanocrystals with different optical densities and 12 µl liquid wax (CHO-1411, Bio-Rad Laboratories, Inc., CA, USA) were used to determine the cooling and heating rate, depending on the optical densities of the nanocrystals, as shown in FIG. 22. 10 µl of nanocrystals with optical densities of 14.1 and 21.5 (12 µl liquid wax) were used to determine the cooling and heating rate depending on the injected current, as shown in FIG. 23A. The thermocycles for the 14.1 OD and 21.5 OD samples are shown in FIGS. 23B and 23C, respectively, for currents from 0.4 A Samples having optical densities of 6.3, 14.1 and 21.5, with 5, 10 and 25 µl (12, 15 and 30 µl liquid wax, respectively), were used to determine the cooling and heating rate depending on the sample volume. The results are shown in FIG. 23D.

Figure 24A:
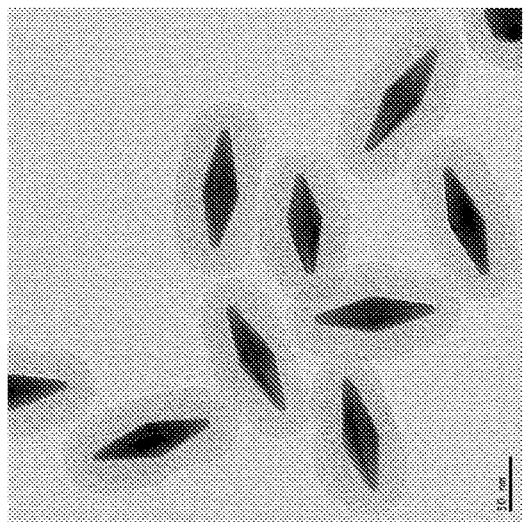
FIG. 24A. Morphology of bipyramid nanocrystals before LED irradiation for 90 cycles.
Figure 24B:
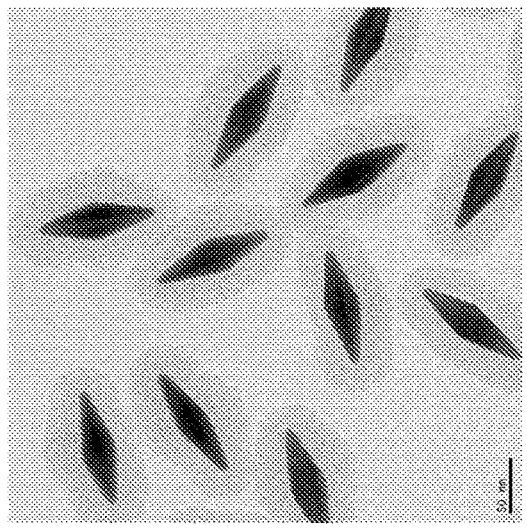
FIG. 24B. Morphology of bipyramid nanocrystals after LED irradiation for 90 cycles.
Figure 24C:
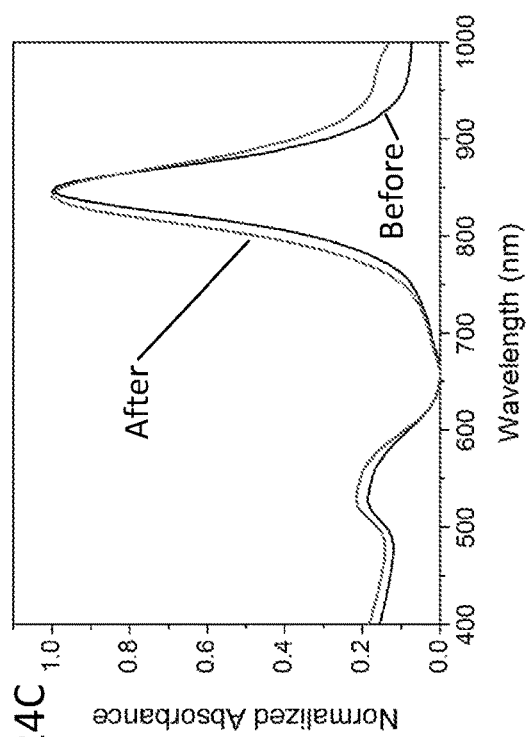
FIG. 24C. Graphs of absorbance before and after irradiation with the LED.
Figure 25A:
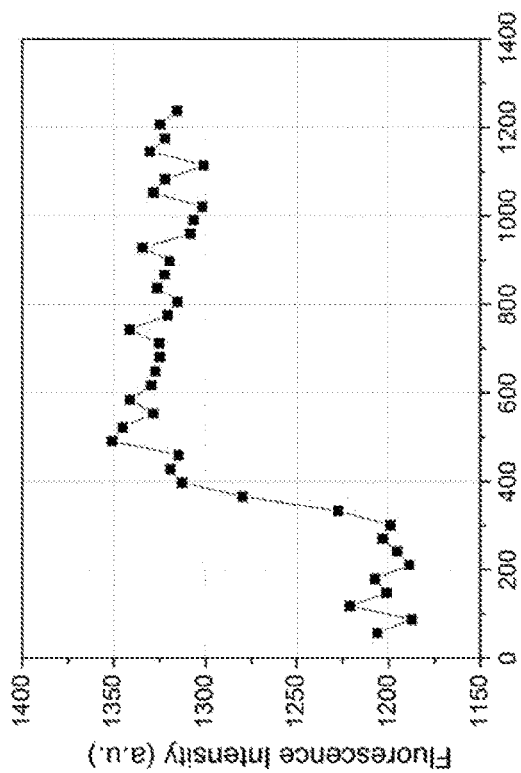
FIG. 25A. Graph showing the nucleic acid amplification, as measured by real-time (RT) fluorescence, as a function of cycle number for an RT-PCR reaction solution comprising 0.1% BSA.
Figure 25B:
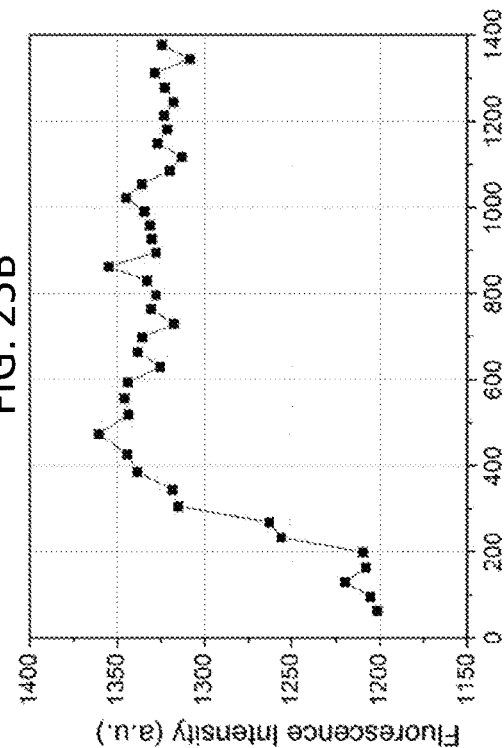
FIG. 25B. Graph showing the nucleic acid amplification, as measured by real-time fluorescence, as a function of time for an RT-PCR reaction solution comprising 0.1% BSA.
Figure 25C:
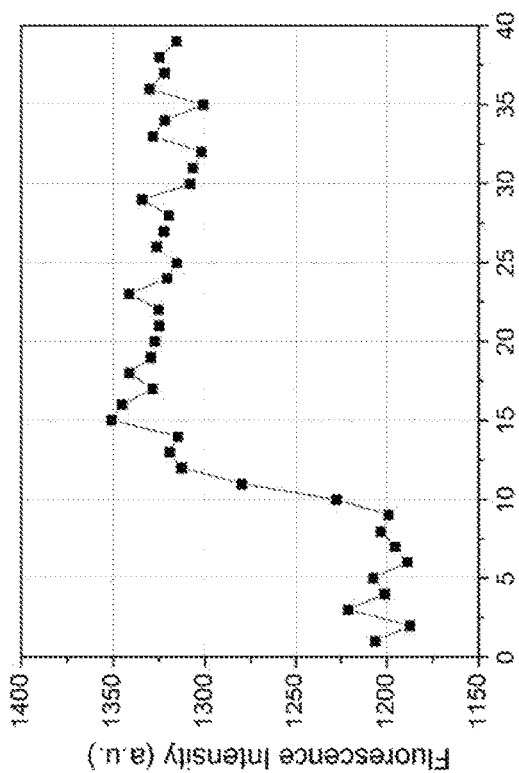
FIG. 25C. Graph showing the nucleic acid amplification, as measured by real-time fluorescence, as a function of cycle number for an RT-PCR reaction solution comprising 0.3% BSA.
Figure 25D:
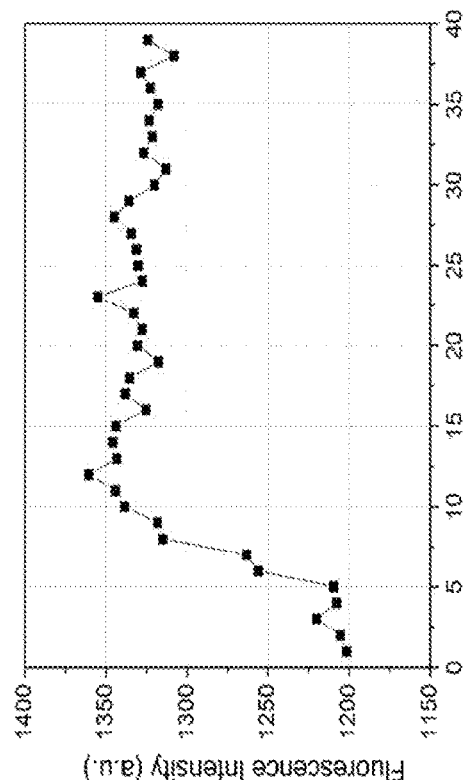
FIG. 25D. Graph showing the nucleic acid amplification, as measured by real-time fluorescence, as a function of time for an RT-PCR reaction solution comprising 0.3% BSA.
Figure 25E:
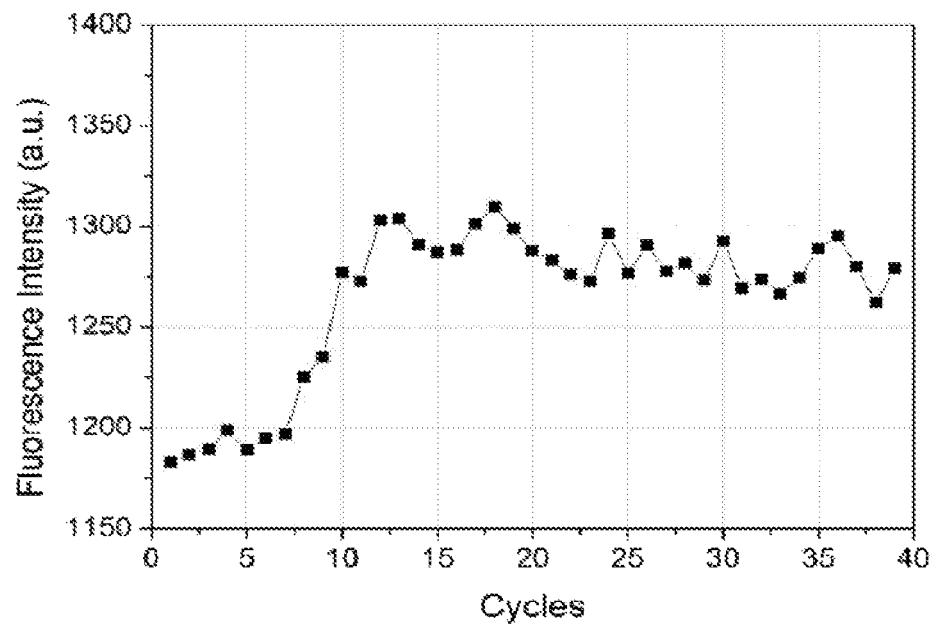
FIG. 25E. Graph showing the nucleic acid amplification, as measured by real-time fluorescence, as a function of cycle number for an RT-PCR reaction solution comprising 0.5% BSA.
Figure 25F:
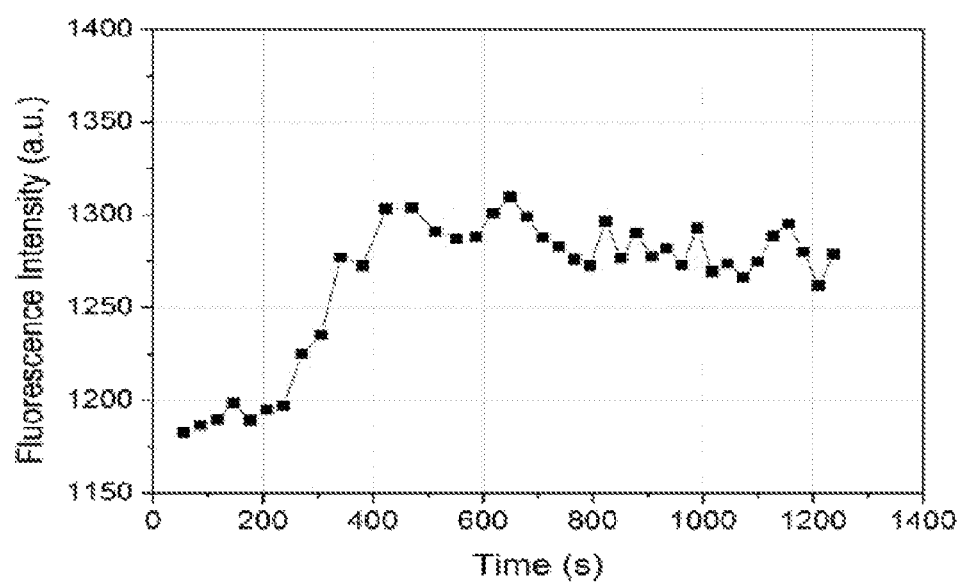
FIG. 25F. Graph showing the nucleic acid amplification, as measured by real-time fluorescence, as a function of time for an RT-PCR reaction solution comprising 0.5% BSA.

The bipyramid nanocrystals were before and after LED irradiation for 90 cycles (FIG. 24C), and showed no change in their morphologies (FIG. 24A, before; and FIG. 24B, after).

Real-Time PCR Studies.

M13mp18 single-stranded DNA, amplicon 100 base pairs in length, was purchased from New England BioLabs, Inc. and used as a template for polymerase chain reaction. Forward primer (TCCT-CAAAGCCTCTGTAGCCGTTGCT) and reverse primer (GCTTGCAGGGAGTTAAAGGCCGCTT) purified by HPLC were purchased from Integrated DNA Technologies. KAPA2G Fast DNA Polymerase (5 U/µl), KAPA2G Buffer A (5×) and KAPA dNTP Mix (10 mM each) were purchased from KAPA Biosystems. SYBR Green I (×10,000) was obtained from Molecular Probes, Inc.

For RT-PCR in FIG. 25A-25F, the reaction mixture for plasmonic PCR contained 14.1 OD of bipyramid-silica core-shell nanocrystals, KAPA2G Buffer A (1×), dNTPs (0.2 µM each), forward primers (5 µM), reverse primers (5 µM), KAPA2G Fast DNA Polymerase (0.2 U/µl), BSA (0.1% for FIG. 25A and FIG. 25B, 0.3% for FIG. 25C and FIG. 25D, 0.5% for FIG. 25E and FIG. 25F, vol/vol), M13mp18 single-stranded DNA template (0.1 µg/ml), SYBR Green I (1.5×). The RT-PCR was performed with thermocycling between 72-95° C., 40 cycles. The reaction was monitored by real-time fluorescence at 75° C. with 0.5 s of acquisition time.

For gel electrophoresis, Agarose HS powder was purchased from Denville scientific, Inc. 10×TBE buffer was purchased from Bio-Rad Laboratories, Inc. and diluted to the final concentration of 0.5. PAGE GelRed Nucleic Acid Gel Stain 10,000× in water was purchased from Biotium, Inc. Gel Loading Dye Purple (×6) was obtained from New England BioLabs, Inc.

DNA fragments were separated via (1%) agarose gel electrophoresis. The gel was prepared by dissolving the agarose in the 0.5×TBE buffer. To load the samples, the DNA was mixed in equal volume ratios with the agarose gel loading dye, and the gel run at 90 V. To visualize the DNA, the gel was stained in a freshly prepared 3×PAGE GelRed Nucleic Acid solution for 5 min and was imaged via the Gel Doc XR+ System, Bio-Rad Laboratories, Inc.

Example 3: Thermally Controlled Enzymatic Reactions

This example illustrates the use of gold bipyramid nanocrystals in the light-activated thermal control of the two-step digestion of a DNA plasmid. (The synthesis of the pegylated core-shell nanocrystals is described in Example 2.)

For DNA digestion, the plasmid pBR322 DNA, a double-stranded circle 4,361 base pairs in length, and the restriction enzymes EcoRI-HF (100,000 units/ml) and BsmI (10,000 units/ml) were purchased from New England BioLabs, Inc. 10× CutSmart Buffer was supplied with the restriction enzymes.

1 µg of pBR322 DNA plasmid was mixed with 10× CutSmart buffer (1× final concentration), 100 units of EcoRI-HF restriction enzyme, and 10 units of BsmI restriction enzyme and digested for 15 min at 37° C. (optimal conditions for EcoRI-HF enzyme), then the temperature was raised to 65° C. for 15 min (optimal conditions for BsmI enzyme which deactivates EcoRI-HF enzyme), 30 min total digestion time. The BsmI enzyme was inactivated by heating to 80° C. for 20 min. The resulting DNA fragments were run in agarose gel electrophoresis and imaged with Gel Doc XR+ System, Bio-Rad Laboratories, Inc.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more".

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A method for photothermally modulating polymerase chain reactions, the method comprising:
   preparing a reaction mixture comprising target nucleic acid molecules, primer nucleic acid strands, free nucleotides, a nucleic acid polymerase, fluorescent probe molecules that bind to said target nucleic acid molecules, and a plurality of bipyramid-shaped noble metal nanocrystals;
   irradiating the reaction mixture with radiation having wavelengths in an infrared region of the electromagnetic spectrum at which said nanocrystals absorb said radiation and heat said reaction mixture via plasmonic photothermal radiation-to-heat conversion, thereby causing said target nucleic acid molecules to denature; and cooling said reaction mixture to a temperature at which said primer nucleic acid strands anneal to the denatured target nucleic acid molecules and new strands of nucleic acids are synthesized starting from an annealed primer nucleic acid strand to form new target nucleic acid molecules; and exciting said fluorescent probe molecules and monitoring a resulting fluorescence, wherein said bipyramid-shaped noble metal nanocrystals are characterized by: comprising a plasmonic noble metal core and a PEGylated silica coating;

a size polydispersity of less than 10%; and the ability to absorb light having wavelengths in the range of 400-1200 nm.

2. The method of claim 1, wherein said noble metal is gold.

3. The method of claim 2, wherein said reaction mixture has an optical density of 1 to 5.

4. The method of claim 1, wherein said reaction mixture is cycled through the steps of irradiating the reaction mixture with radiation having wavelengths in an infrared region of the electromagnetic spectrum and cooling said reaction mixture to a temperature at which said primer nucleic acid strands anneal to the denatured target nucleic acid molecules multiple times at a rate of at least 2 photothermal cycles per minute.

5. The method of claim 1, wherein said bipyramid-shaped noble metal nanocrystals are penta-twinned bipyramid-shaped gold nanocrystals.

6. The method of claim 5, wherein said penta-twinned bipyramid-shaped gold nanocrystals are characterized by a longitudinal surface plasmon resonance in the range of 778-1054 nm.

7. The method of claim 5, wherein said penta-twinned bipyramid-shaped gold nanocrystals are characterized by an aspect ratio in the range from 3.0 to 3.7.

8. The method of claim 7, wherein said penta-twinned bipyramid-shaped gold nanocrystals are characterized by a longitudinal surface plasmon resonance in the range of 778-1054 nm.

9. A method for photothermally modulating enzyme digestion reactions, the method comprising: preparing a reaction mixture comprising a DNA digestion enzyme, a DNA plasmid substrate molecule, and a plurality of bipyramid-shaped nanocrystals; and irradiating said reaction mixture with radiation having wavelengths in an infrared region of the electromagnetic spectrum at which said bipyramid-shaped nanocrystals absorb said radiation and heat said reaction mixture via plasmonic photothermal radiation-to-heat conversion, thereby heating said reaction mixture from a first temperature to a second temperature, wherein, at said first temperature, said DNA digestion enzyme is in an active state that forms an enzyme-substrate complex with said DNA plasmid substrate molecule and converts said DNA plasmid substrate molecule to a product molecule, and at said second temperature said DNA digestion enzyme is deactivated and dissociates from said DNA plasmid substrate molecule, wherein said bipyramid-shaped nanocrystals are characterized by:

comprising a plasmonic noble metal core and a PEGylated silica coating;

a size polydispersity of less than 10%; and the ability to absorb light having wavelengths in the range of 400-1200 nm.

10. The method of claim 9, wherein said bipyramid-shaped noble metal nanocrystals are penta-twinned bipyramid-shaped gold nanocrystals.

11. The method of claim 10, wherein said penta-twinned bipyramid-shaped gold nanocrystals are characterized by a longitudinal surface plasmon resonance in the range of 778-1054 nm.

12. The method of claim 10, wherein said penta-twinned bipyramid-shaped gold nanocrystals are characterized by an aspect ratio in the range from 3.0 to 3.7.

13. The method of claim 12, wherein said penta-twinned bipyramid-shaped gold nanocrystals are characterized by a longitudinal surface plasmon resonance in the range of 778-1054 nm.

14. A method for photothermally heating a reaction mixture comprising a plurality of nanocrystals; the method comprising:

irradiating the reaction mixture with radiation, such that said plurality of nanocrystals absorbs said radiation and heats the reaction mixture via photothermal radiation-to-heat conversion, wherein said nanocrystals are characterized by: comprising a plasmonic noble metal core and a PEGylated silica coating;

a shape selected from the group consisting of: a penta-twinned bifrustum body having a first end capped with a penta-twinned tip structure and a second end capped with a penta-twinned tip structure, with a narrowing between the body and each of the first and second penta-twinned tip structures; a penta-twinned bifrustum body with pyramid shaped ends; a penta-twinned bifrustum body with penta twinned rod-shaped ends; a penta-twinned bifrustum body with sphere-shaped ends; a penta-twinned spherical polyhedron; and a penta-twinned bifrustum; and a size polydispersity of less than 10%.

15. The method of claim 14, wherein irradiating said reaction mixture heats said reaction mixture to a temperature that modulates a chemical reaction between two or more chemical reactants in said reaction mixture.

16. An apparatus for carrying out a nucleic acid amplification reaction, the apparatus comprising:

a reaction mixture in a container, said reaction mixture comprising:

target nucleic acid molecules; primer nucleic acid strands; free nucleotides; a nucleic acid polymerase; fluorescent probe molecules that bind to said target nucleic acid molecules; and a plurality of bipyramid-shaped nanocrystals;

an infrared light source configured to irradiate said reaction mixture;

a second light source configured to irradiate said reaction mixture with radiation that excites the fluorescent probes; and a detector configured to detect fluorescence emitted by the excited fluorescent probes, wherein said bipyramid-shaped nanocrystals are characterized by:

comprising a plasmonic noble metal core and a PEGylated silica coat;
a size polydispersity of less than 10%;
the ability to absorb light having wavelengths in the range of 400-1200 nm.

17. The apparatus of claim 16, wherein said bipyramid-shaped noble metal nanocrystals are penta-twinned bipyramid-shaped gold nanocrystals.

18. The apparatus of claim 17, wherein said penta-twinned bipyramid-shaped gold nanocrystals are characterized by a longitudinal surface plasmon resonance in the range of 778-1054 nm.

19. The apparatus of claim 17, wherein said penta-twinned bipyramid-shaped gold nanocrystals are characterized by an aspect ratio in the range from 3.0 to 3.7.

20. The apparatus of claim 19, wherein said penta-twinned bipyramid-shaped gold nanocrystals are characterized by a longitudinal surface plasmon resonance in the range of 778-1054 nm.

21. A method for photothermally modulating polymerase chain reactions, the method comprising:
preparing a reaction mixture comprising target nucleic acid molecules, primer nucleic acid strands, free nucleotides, a nucleic acid polymerase, fluorescent probe molecules that bind to said target nucleic acid molecules, and a plurality of penta-twinned bipyramid-shaped noble metal nanocrystals;
irradiating the reaction mixture with radiation having wavelengths in an infrared region of the electromagnetic spectrum at which said penta-twinned bipyramid-shaped noble metal nanocrystals absorb said radiation and heat said reaction mixture via plasmonic photothermal radiation-to-heat conversion, thereby causing said target nucleic acid molecules to denature; and
cooling said reaction mixture to a temperature at which said primer nucleic acid strands anneal to the denatured target nucleic acid molecules and new strands of nucleic acids are synthesized starting from an annealed primer nucleic acid strand to form new target nucleic acid molecules; and
exciting said fluorescent probe molecules and monitoring a resulting fluorescence, wherein said penta-twinned bipyramid-shaped noble metal nanocrystals are characterized by:
a size polydispersity of less than 10%; and
the ability to absorb light having wavelengths in the range of 400-1200 nm.

22. The method of claim 21, wherein said penta-twinned bipyramid-shaped gold nanocrystals are characterized by a longitudinal surface plasmon resonance in the range of 778-1054 nm.

23. The method of claim 21, wherein said penta-twinned bipyramid-shaped gold nanocrystals are characterized by an aspect ratio in the range from 3.0 to 3.7.

24. The method of claim 23, wherein said penta-twinned bipyramid-shaped gold nanocrystals are characterized by a longitudinal surface plasmon resonance in the range of 778-1054 nm.

* * * * *